United States Patent
Yamazaki et al.

(10) Patent No.: US 8,247,965 B2
(45) Date of Patent: Aug. 21, 2012

(54) LIGHT EMITTING DISPLAY DEVICE AND METHOD FOR MANUFACTURING THE SAME

(75) Inventors: Shunpei Yamazaki, Tokyo (JP); Shinji Maekawa, Shizuoka (JP); Osamu Nakamura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 983 days.

(21) Appl. No.: 10/576,867

(22) PCT Filed: Nov. 5, 2004

(86) PCT No.: PCT/JP2004/016798
§ 371 (c)(1),
(2), (4) Date: Apr. 21, 2006

(87) PCT Pub. No.: WO2005/048222
PCT Pub. Date: May 26, 2005

(65) Prior Publication Data
US 2007/0132377 A1  Jun. 14, 2007

(30) Foreign Application Priority Data
Nov. 14, 2003  (JP) .................................. 2003-385965

(51) Int. Cl.
H05B 33/00  (2006.01)
H01L 23/52  (2006.01)
H01L 21/70  (2006.01)
(52) U.S. Cl. ......... 313/506; 257/211; 257/503; 257/508
(58) Field of Classification Search .......................... None
See application file for complete search history.

(56) References Cited

U.S. PATENT DOCUMENTS
5,162,901 A  11/1992  Shimada et al.
5,598,285 A  1/1997  Kondo et al.
(Continued)

FOREIGN PATENT DOCUMENTS
EP  0 399 846 A2  11/1990
(Continued)

OTHER PUBLICATIONS
International Search Report of Application No. PCT/JP2004/016798; PCT7501) Dated Mar. 1, 2005.
(Continued)

*Primary Examiner* — Anh Mai
*Assistant Examiner* — Britt D Hanley
(74) *Attorney, Agent, or Firm* — Nixon Peabody LLP; Jeffrey L. Costellia

(57) ABSTRACT

An object of the invention is to provide a display device which can be manufactured with usability of a material improved and with a manufacturing step simplified and to provide a manufacturing technique thereof. One feature of a light emitting display device of the present invention is to comprise a gate electrode formed over a substrate having an insulating surface with a substance having a photocatalytic function therebetween, a gate insulating layer formed over the gate electrode, a semiconductor layer and a first electrode formed over the gate insulating layer, a wiring layer formed over the semiconductor layer, a partition wall covering an edge portion of the first electrode and the wiring layer, an electroluminescent layer over the first electrode, and a second electrode over the electroluminescent layer, wherein the wiring layer covers the edge portion of the first electrode.

28 Claims, 27 Drawing Sheets

U.S. PATENT DOCUMENTS

| | | | | |
|---|---|---|---|---|
| 5,640,067 | A | 6/1997 | Yamauchi et al. | |
| 5,737,051 | A | 4/1998 | Kondo et al. | |
| 5,897,328 | A | 4/1999 | Yamauchi et al. | |
| 5,989,945 | A | 11/1999 | Yudasaka et al. | |
| 6,090,489 | A | 7/2000 | Hayakawa et al. | |
| 6,124,915 | A | 9/2000 | Kondo et al. | |
| 6,291,136 | B1 | 9/2001 | Masutani et al. | |
| 6,341,004 | B1 | 1/2002 | Kondo et al. | |
| 6,355,941 | B1* | 3/2002 | Yamazaki et al. | 257/66 |
| 6,369,410 | B1 | 4/2002 | Yamazaki et al. | |
| 6,514,801 | B1 | 2/2003 | Yudasaka et al. | |
| 6,593,591 | B2 | 7/2003 | Yudasaka et al. | |
| 6,593,691 | B2* | 7/2003 | Nishi et al. | 313/506 |
| 6,613,614 | B2 | 9/2003 | Yamazaki et al. | |
| 6,724,455 | B2 | 4/2004 | Kondo et al. | |
| 6,734,029 | B2 | 5/2004 | Furusawa | |
| 6,833,225 | B2 | 12/2004 | Ooishi | |
| 6,846,616 | B2 | 1/2005 | Kobayashi et al. | |
| 6,849,308 | B1 | 2/2005 | Speakman et al. | |
| 6,853,083 | B1 | 2/2005 | Yamauchi et al. | |
| 6,888,160 | B1 | 5/2005 | Nakajima et al. | |
| 6,908,796 | B2 | 6/2005 | Furusawa | |
| 6,992,435 | B2 | 1/2006 | Yamauchi et al. | |
| 7,119,026 | B2 | 10/2006 | Honda et al. | |
| 7,205,096 | B2 | 4/2007 | Park et al. | |
| 7,499,117 | B2 | 3/2009 | Maekawa et al. | |
| 7,592,207 | B2 | 9/2009 | Nakamura et al. | |
| 7,598,129 | B2 | 10/2009 | Kanno et al. | |
| 7,601,994 | B2 | 10/2009 | Fukuchi et al. | |
| 7,733,315 | B2 | 6/2010 | Yoshida et al. | |
| 7,795,616 | B2 | 9/2010 | Yamazaki et al. | |
| 7,859,187 | B2 | 12/2010 | Yamazaki et al. | |
| 7,883,912 | B2 | 2/2011 | Fukuchi et al. | |
| 2001/0022497 | A1* | 9/2001 | Aoki et al. | 313/507 |
| 2001/0025958 | A1* | 10/2001 | Yamazaki et al. | 257/72 |
| 2001/0055841 | A1* | 12/2001 | Yamazaki et al. | 438/151 |
| 2002/0016250 | A1* | 2/2002 | Hayakawa et al. | 502/5 |
| 2002/0044111 | A1 | 4/2002 | Yamazaki et al. | |
| 2002/0056838 | A1 | 5/2002 | Ogawa | |
| 2002/0063822 | A1 | 5/2002 | Kondo et al. | |
| 2002/0074547 | A1 | 6/2002 | Yudasaka et al. | |
| 2002/0096681 | A1 | 7/2002 | Yamazaki et al. | |
| 2002/0100908 | A1 | 8/2002 | Yudasaka et al. | |
| 2002/0179906 | A1 | 12/2002 | Yudasaka et al. | |
| 2003/0054653 | A1 | 3/2003 | Yamazaki et al. | |
| 2003/0127974 | A1 | 7/2003 | Miyazawa | |
| 2003/0129321 | A1 | 7/2003 | Aoki | |
| 2003/0134519 | A1 | 7/2003 | Yudasaka et al. | |
| 2003/0143437 | A1* | 7/2003 | Ohtsu et al. | 428/701 |
| 2003/0203643 | A1 | 10/2003 | Hasei et al. | |
| 2003/0232128 | A1 | 12/2003 | Furusawa et al. | |
| 2004/0004221 | A1 | 1/2004 | Murade | |
| 2004/0147113 | A1 | 7/2004 | Yamazaki et al. | |
| 2004/0189923 | A1 | 9/2004 | Kondo et al. | |
| 2004/0195569 | A1 | 10/2004 | Hashimoto et al. | |
| 2004/0207792 | A1 | 10/2004 | Wu | |
| 2005/0029591 | A1 | 2/2005 | Yudasaka et al. | |
| 2005/0095356 | A1 | 5/2005 | Nakamura et al. | |
| 2005/0163938 | A1 | 7/2005 | Yamazaki et al. | |
| 2007/0051952 | A1 | 3/2007 | Yamazaki et al. | |
| 2007/0082443 | A1 | 4/2007 | Yamazaki et al. | |
| 2007/0131976 | A1 | 6/2007 | Kanno et al. | |
| 2010/0006846 | A1 | 1/2010 | Nakamura et al. | |
| 2010/0224934 | A1 | 9/2010 | Yoshida et al. | |
| 2010/0311197 | A1 | 12/2010 | Yamazaki et al. | |

FOREIGN PATENT DOCUMENTS

| | | |
|---|---|---|
| EP | 0 588 568 A2 | 3/1994 |
| EP | 0 855 614 A1 | 7/1998 |
| EP | 0 961 992 A2 | 5/1999 |
| EP | 1 061 404 A1 | 12/2000 |
| EP | 1 113 502 A1 | 7/2001 |
| EP | 1 209 748 | 5/2002 |
| EP | 1 163 552 B1 | 8/2003 |
| EP | 1 445 793 A2 | 8/2004 |
| EP | 1 450 412 A2 | 8/2004 |
| JP | 03-141325 | 6/1991 |
| JP | 04-056168 | 2/1992 |
| JP | 04-056168 A | 2/1992 |
| JP | 05-119351 | 5/1993 |
| JP | 06-273803 | 9/1994 |
| JP | 07-297404 | 11/1995 |
| JP | 08-330600 | 12/1996 |
| JP | 08-330600 A | 12/1996 |
| JP | 09-179142 | 7/1997 |
| JP | 09-260808 | 10/1997 |
| JP | 10-270843 | 10/1998 |
| JP | 11-112002 | 4/1999 |
| JP | 11-251259 | 9/1999 |
| JP | 11-261076 | 9/1999 |
| JP | 11-326951 | 11/1999 |
| JP | 11-340129 | 12/1999 |
| JP | 2000-029053 | 1/2000 |
| JP | 2000-029053 A | 1/2000 |
| JP | 2001-179167 A | 7/2001 |
| JP | 2001-196590 | 7/2001 |
| JP | 2001-196590 A | 7/2001 |
| JP | 2002-049333 | 2/2002 |
| JP | 2002-049333 A | 2/2002 |
| JP | 2002-190598 A | 7/2002 |
| JP | 2002-217421 | 8/2002 |
| JP | 2002-217421 A | 8/2002 |
| JP | 2002-359246 | 12/2002 |
| JP | 2002-359246 A | 12/2002 |
| JP | 2003-050405 | 2/2003 |
| JP | 2003-050405 A | 2/2003 |
| JP | 2003-058077 | 2/2003 |
| JP | 2003-058077 A | 2/2003 |
| JP | 2003-059940 | 2/2003 |
| JP | 2003-059940 A | 2/2003 |
| JP | 2003-506886 | 2/2003 |
| JP | 2003-506886 A | 2/2003 |
| JP | 2003-098548 | 4/2003 |
| JP | 2003-098548 A | 4/2003 |
| JP | 2003-149831 | 5/2003 |
| JP | 2003-149831 A | 5/2003 |
| JP | 2003-178872 A | 6/2003 |
| JP | 2003-197612 A | 7/2003 |
| JP | 2003-209339 | 7/2003 |
| JP | 2003-209340 A | 7/2003 |
| JP | 2003-229579 A | 8/2003 |
| JP | 2003-241177 | 8/2003 |
| JP | 2003-241177 A | 8/2003 |
| JP | 2003-258226 | 9/2003 |
| JP | 2003-258226 A | 9/2003 |
| JP | 2003-315813 | 11/2003 |
| JP | 2003-315813 A | 11/2003 |
| JP | 2003-318192 | 11/2003 |
| JP | 2003-318401 | 11/2003 |
| WO | WO 97/43689 | 11/1997 |
| WO | WO-97/43689 | 11/1997 |
| WO | WO-00/59040 | 10/2000 |
| WO | WO 01/11426 A1 | 2/2001 |

OTHER PUBLICATIONS

Written Opinion (Application No. PCT/JP2004/016798; PCT7501) Dated Mar. 1, 2005.

* cited by examiner

LIGHT EMITTING DISPLAY DEVICE AND METHOD FOR MANUFACTURING THE SAME

TECHNICAL FIELD

The present invention relates to a light emitting display device (light emitting device) employing a droplet discharge method and to a manufacturing method thereof.

BACKGROUND ART

A thin film transistor (hereinafter, referred to as a "TFT") and an electronic circuit using the thin film transistor are manufactured by laminating various types of thin films of a semiconductor, an insulating material, a conductive material, and the like over a substrate and, then, appropriately forming a predetermined pattern with a photolithography technique. The photolithography technique means a technique of transferring a pattern of a circuit or the like formed over a surface of a transparent flat plane referred to as a photomask by using a material which does not transmit light onto a targeted substrate by utilizing light, and the technique has widely been used in a manufacturing step of a semiconductor integrated circuit or the like.

In a manufacturing step employing a conventional photolithography technique, it is necessary to perform a multi-stage step including light exposure, developing, baking, peeling-off, and the like only for treating a mask pattern which is formed by using a photosensitive organic resin material referred to as a photoresist. Therefore, as the number of times of the photolithography step is increased more, a manufacturing cost is inevitably increased more. In order to improve such problems as described above, it has been tried to manufacture the TFT by reducing the number of the photolithography step (for example, Reference 1: Japanese Patent Laid-Open No. H11-251259).

However, in the technique disclosed in Reference 1, only a part of the photolithography step which is carried out plural times in a TFT manufacturing step is replaced by a printing method and no contribution is made to a drastic reduction in the number of steps. Further, a light exposing apparatus to be used for transferring the mask pattern in the photolithography technique transfers a pattern of from several micrometers to 1 micrometer or less by equivalent projection light exposure or reduction projection light exposure. It is theoretically difficult for the light exposing apparatus to expose a large area substrate having a side of more than 1 meter to light all at once from a technical standpoint.

DISCLOSURE OF INVENTION

It is an object of the present invention to provide a technique in which, in a manufacturing step of a TFT, an electronic circuit using the TFT, or a light emitting display device formed by using the TFT, the manufacturing step is simplified by reducing the number of times of the photolithography step or by eliminating the photolithography step itself, and manufacturing can be executed on a large area substrate having a side of more than 1 meter with a higher yield at lower cost.

The following measures are taken in the present invention to solve the problems of the above-mentioned related art.

One feature of the present invention is that at least one or more of patterns required to manufacture a display panel, such as a wiring layer, a conductive layer for forming an electrode, or a mask layer for forming a predetermined pattern is/are formed by a method capable of selectively forming a pattern, and then, a light emitting display device is manufactured. A droplet discharge method (also referred to as an ink-jet method, depending on its mode) that can form a conductive layer, an insulating layer, or the like into a predetermined pattern by selectively discharging a droplet of a composition mixed for a particular purpose is employed as the method capable of selectively forming a pattern. In addition, a method capable of transferring or drawing a pattern, for example, a printing method (a method for forming a pattern, such as screen printing or offset printing) or the like can also be employed.

The present invention is a light emitting display device in which a light emitting element having, between electrodes, a medium including an organic material or a mixture of an organic material and an inorganic material that causes luminescence referred to as electroluminescence (hereinafter, also referred to as "EL") and a TFT are connected, and such a light emitting display device is manufactured by using a droplet discharge method.

According to the present invention, a means of improving adhesion (base pretreatment) is taken for a region to be provided with a pattern in forming a pattern by a droplet discharge method, thereby improving reliability of a light emitting display device.

Another feature of the present invention is that a substance constituting a light emitting display device, such as a wiring, a semiconductor film, an insulating film, or a mask is formed by utilizing photocatalytic activity of a substance having a photocatalytic function (hereinafter, simply referred to as a photocatalytic substance). When a predetermined pattern is formed by discharging a droplet including a predetermined composition from a fine pore in the step, a substance having a photocatalytic function is formed as a base and its photocatalytic activity is utilized to improve adhesion. Specifically, a wiring material mixed into a solvent (including a wiring material (conductive material) dissolved or dispersed in a solvent) is formed over the photocatalytic substance or at opposite ends thereof by an application method or the like, thereby forming a wiring. For example, a conductive material mixed into a solvent is discharged onto the photocatalytic substance by a droplet discharge method. The conductive material mixed into a solvent may be formed over the photocatalytic substance by a spin coating method, a dipping method, another application method, or a printing method (a method for forming a pattern, such as screen printing or offset printing) besides a droplet discharge method.

It is preferable to use titanium oxide ($TiO_X$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), or the like as the photocatalytic substance. The photocatalytic substance may be irradiated with light of an ultraviolet light region (wavelength: 400 nm or less, preferably, 380 nm or less) to be photocatalytically activated.

The photocatalytic substance can be formed by a dip coating method of a sol-gel method, a spin coating method, a droplet discharge method, an ion plating method, an ion beam method, a CVD method, a sputtering method, an RF magnetron sputtering method, a plasma spray method, or an anodic oxidation method. In addition, the substance does not need to have continuity as a film, depending on its formation method. The photocatalytic substance can be formed by mixing and melting a salt of a constituent element, in the case of a photocatalytic substance made of an oxide semiconductor including a plurality of metals. A solvent may be baked or dried when it is necessary to be removed in the case of forming the photocatalytic substance by an application method such as a dip coating method or a spin coating method. Specifically, it may be heated at a predetermined temperature (for example, 300° C. or more), preferably, in an atmosphere including oxygen. For example, baking is performed using Ag as conductive paste in an atmosphere including oxygen and nitrogen; then, an organic material such as a thermosetting resin is decomposed. Therefore, Ag without containing an organic material can be obtained. Accordingly, planarity on the surface of Ag can be enhanced.

According to the heat treatment, the photocatalytic substance can have a predetermined crystal structure. For example, it has an anatase type or a rutile-anatase mixed type. The anatase type is preferentially formed in a low temperature phase. Therefore, the photocatalytic substance may also be heated when it does not have a predetermined crystal structure. In addition, the photocatalytic substance can be formed plural times to obtain a predetermined film thickness in the case of being formed by an application method.

For example, $TiO_X$ is not hydrophilic but oleophilic, that is, water-repellent before being irradiated with light. Light irradiation causes photocatalytic activity, and $TiO_X$ is converted into hydrophilic and non-oleophilic, that is, oil-repellent. Note that $TiO_X$ can be at once hydrophilic and oleophilic depending on a length of irradiation time.

Note that "hydrophilic" means a state which is easy to be got wet with water and has a contact angle of 30° or less. Specifically, a state having a contact angle of 5° or less is referred to as "super-hydrophilic". On the other hand, "water-repellent" means a state which is hard to be got wet with water and has a contact angle of 90° or more. Similarly, "oleophilic" means a state which is easy to be got wet with oil, and "oil-repellent" means a state which is hard to be got wet with oil. Note that the contact angle means an angle made by a formation face and a tangent to a droplet on the edge of a dropped dot.

Namely, a region irradiated with light (hereinafter, referred to as an irradiation region) becomes hydrophilic or super-hydrophilic (simply collectively referred to as hydrophilic). At this time, light irradiation is performed so that a width of an irradiation region is a desired width of a wiring. Thereafter, a dot including a conductive material mixed into a water-based solvent is discharged from above the irradiation region to the irradiation region by a droplet discharge method. Then, a smaller wiring in width, that is, a narrower wiring than a diameter of a dot discharged merely by a droplet discharge method can be formed. This is because the irradiation region is formed to have a desired width of a wiring, and then, a discharged dot can be prevented from spreading on a formation surface. Further, a wiring can be formed along the irradiation region even in the case where a dot is discharged out of alignment to some extent. Thus, a position of a wiring to be formed can be controlled with accuracy.

In the case of using a water-based solvent, it is preferable to add a surfactant in order to smoothly discharge a droplet from a nozzle of an inkjet apparatus.

In the case of discharging a composition (conductive material) mixed into an oil-based (alcohol-based) solvent, a wiring can be similarly formed by discharging the composition (conductive material) onto a region which is not irradiated with light (hereinafter, referred to as a non-irradiation region) and discharging a dot from above the non-irradiation region to the non-irradiation region. Namely, opposite ends of a region where a pattern (wiring) is to be formed, that is, the periphery surrounding the region where a wiring is to be formed may be irradiated with light, thereby forming an irradiation region. Since the irradiation region is oil-repellent at this time, a dot including the conductive material mixed into an oil-based (alcohol-based) solvent is selectively formed in the non-irradiation region. Namely, light irradiation may be performed so that a width of the non-irradiation region is a desired width of a wiring.

Note that a nonpolar solvent or a low polar solvent can be used as the oil-based (alcohol-based) solvent. For example, terpineol, mineral spirit, xylene, toluene, ethyl benzene, mesitylene, hexane, heptane, octane, decane, dodecane, cyclohexane, or cyclooctane can be used.

Further, photocatalytic activity can be enhanced by doping a transition metal (such as Pd, Pt, Cr, Ni, V, Mn, Fe, Ce, Mo, or W) into the photocatalytic substance, and photocatalytic activity can be caused by light of a visible light region (wavelength: from 400 nm to 800 nm). This is because the transition metal can form a new level within a forbidden band of an active photocatalyst having a wide band gap and can expand a light absorption range to a visible light region. For example, an acceptor type such as Cr or Ni, a donor type such as V or Mn, an amphoteric type such as Fe, or other types such as Ce, Mo, and W can be doped. A wavelength of light ban thus be determined depending on the photocatalytic substance. Therefore, light irradiation means to irradiate with light having such a wavelength that photocatalytically activates the photocatalytic substance.

When the photocatalytic substance is heated and reduced in a vacuum or under reflux of hydrogen, an oxygen defect is generated in crystal. Without doping the transition element, an oxygen defect plays a similar role to an electron donor in this way. Specifically, in the case of forming the photocatalytic substance by a sol-gel method, the photocatalytic substance may not be reduced since an oxygen defect exists from the beginning. In addition, an oxygen defect can be formed by doping a gas of $N_2$ or the like.

A conductive layer made of a refractory metal as well as the photocatalytic substance may be formed. The refractory metal may be formed by using a material such as Ti (titanium), W (tungsten), Cr (chromium), Al (aluminum), Ta (tantalum), Ni (nickel), Zr (zirconium), Hf (hafnium), V (vanadium), Ir (iridium), Nb (niobium), Pd (lead), Pt (platinum), Mo (molybdenum), Co (cobalt), or Rh (rhodium). In addition, the conductive layer is formed by a known method such as a sputtering method, a vapor deposition method, an ion implantation method, a CVD method, a dipping method, or a spin coating method, and preferably, it is formed by a sputtering method, a dipping method, or a spin coating method. In the case where the conductive layer is to be insulated later, it is simple and preferable to form the conductive layer to have a thickness of from 0.01 nm to 10 nm and to be insulated by natural oxidation.

Alternatively, a method for performing plasma treatment on a formation region (formation face) is employed as another method. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1 \times 10^{10}$ m$^{-3}$ to $1 \times 10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another alternative method, a substance of an organic material functioning as an adhesive may be formed to improve adhesion of a pattern to be formed by a droplet discharge method with a formation region thereof. A film made of one of or a plurality of photosensitive or non-photosensitive organic materials (organic resin materials) (polyimide, acrylic, polyamide, polyimide amide, a resist, benzocyclobutene, and the like), Low k materials having a low dielectric constant, and the like, or a laminate thereof can be used as the material. In addition, a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used. A droplet discharge method or a printing method (a method for forming a pattern, such as screen printing or offset printing) can be employed as a manufacturing method. A TOF film, an SOG film, or the like obtained by an application method can be used.

The step performed for improvement in adhesion or surface modification as base pretreatment on a region of the conductive material formed by using a droplet discharge method may be performed in the case where a conductive material is further formed over a pattern formed by using a droplet discharge method.

As for the composition to be discharged from the discharging opening by a droplet discharge method to form a conductive material (conductive layer), a conductive material dissolved or dispersed in a solvent is used. The conductive material corresponds to a fine particle or a dispersant nanoparticle of a metal such as Ag, Au, Cu, Ni, Pt, Pd, Ir, Rh, W, or Al, sulfide of a metal such as Cd or Zn, oxide of Fe, Ti, Si, Ge, Zr, Ba, or the like, or silver halide. In addition, it corresponds to indium tin oxide (ITO), ITSO made of indium tin oxide and silicon oxide, organic indium, organic tin, zinc oxide, titanium nitride, or the like which is used as a transparent conductive film. However, as for compositions to be discharged from the discharging opening, it is preferable to use any material selected from gold, silver, and copper, which is dissolved or dispersed in a solvent, taking a specific resistance value into consideration. It is more preferable to use silver or copper having a low resistance value. When silver or copper is used, a barrier film may be additionally provided as a measure for an impurity. A silicon nitride film or nickel boron (NiB) can be used as the barrier film.

In addition, a particle in which a conductive material is coated with other conductive materials to be a plurality of layers may be used. For example, a three-layer structure particle in which copper is coated with nickel boron (NiB), and then coated with silver may be used. As for such solvents, esters such as butyl acetate and ethyl acetate; alcohols such as isopropyl alcohol and ethyl alcohol; organic solvents such as methyl ethyl ketone and acetone; or the like may be used. The viscosity of the composition is preferably 50 mPa·S (cps) or less. This is because the composition is prevented from drying or the composition is smoothly discharged from the discharging opening. The surface tension of the composition is preferably 40 mN/m or less. However, the viscosity of the composition and the like may be appropriately adjusted in accordance with a solvent to be used and intended use. For example, the viscosity of a composition in which ITO, organic indium, or organic tin is dissolved or dispersed in the solvent is from 5 mPa·S to 50 mPa·S, the viscosity of a composition in which silver is dissolved or dispersed in the solvent is from 5 mPa·S to 20 mPa·S, and the viscosity of a composition in which gold is dissolved or dispersed in the solvent is from 10 mPa·S to 20 mPa·S.

A light emitting display device of the present invention comprises: a gate electrode formed over a substrate having an insulating surface with a substance having a photocatalytic function therebetween; a gate insulating layer formed over the gate electrode; a semiconductor layer and a first electrode formed over the gate insulating layer; a wiring layer formed over the semiconductor layer; a partition wall covering an edge portion of the first electrode and the wiring layer; an electroluminescent layer over the first electrode; and a second electrode over the electroluminescent layer, wherein the wiring layer covers the edge portion of the first electrode.

A light emitting display device of the present invention comprises: a wiring layer and a first electrode formed over a substrate having an insulating surface with a substance having a photocatalytic function therebetween; a semiconductor layer formed over the wiring layer; a gate insulating layer formed over the semiconductor layer; a gate electrode formed over the gate insulating layer; a partition wall covering an edge portion of the first electrode and the wiring layer; an electroluminescent layer over the first electrode: and a second electrode over the electroluminescent layer, wherein the wiring layer covers the edge portion of the first electrode.

A light emitting display device of the present invention comprises: a gate electrode formed over a substrate having an insulating surface with a substance having a photocatalytic function therebetween; a gate insulating layer formed over the gate electrode; a semiconductor layer and a first electrode formed over the gate insulating layer; a wiring layer formed over the semiconductor layer; a partition wall covering an edge portion of the first electrode and the wiring layer; an electroluminescent layer over the first electrode; and a second electrode over the electroluminescent layer, wherein the first electrode covers an edge portion of the wiring layer.

A light emitting display device of the present invention comprises: a wiring layer and a first electrode formed over a substrate having an insulating surface with a substance having a photocatalytic function therebetween; a semiconductor layer formed over the wiring layer; a gate insulating layer formed over the semiconductor layer; a gate electrode formed over the gate insulating layer; a partition wall covering an edge portion of the first electrode and the wiring layer; an electroluminescent layer over the first electrode; and a second electrode over the electroluminescent layer, wherein the first electrode covers an edge portion of the wiring layer.

A light emitting display device of the present invention comprises: a conductive layer including a refractory metal over a substrate having an insulating surface; a gate electrode formed over the conductive layer; a gate insulating layer formed over the gate electrode; a semiconductor layer and a first electrode formed over the gate insulating layer; a wiring layer formed over the semiconductor layer; a partition wall covering an edge portion of the first electrode and the wiring layer; an electroluminescent layer over the first electrode; and a second electrode over the electroluminescent layer, wherein the wiring layer covers the edge portion of the first electrode.

A light emitting display device of the present invention comprises: a conductive layer including a refractory metal over a substrate having an insulating surface; a wiring layer and a first electrode formed over the conductive layer; a semiconductor layer formed over the wiring layer; a gate insulating layer formed over the semiconductor layer; a gate electrode formed over the gate insulating layer; a partition wall covering an edge portion of the first electrode and the wiring layer; an electroluminescent layer over the first electrode; and a second electrode over the electroluminescent layer, wherein the wiring layer covers the edge portion of the first electrode.

A light emitting display device of the present invention comprises: a conductive layer including a refractory metal over a substrate having an insulating surface; a gate electrode formed over the conductive layer; a gate insulating layer formed over the gate electrode; a semiconductor layer and a first electrode formed over the gate insulating layer; a wiring layer formed over the semiconductor layer; a partition wall covering an edge portion of the first electrode and the wiring layer; an electroluminescent layer over the first electrode; and a second electrode over the electroluminescent layer, wherein the first electrode covers an edge portion of the wiring layer.

A light emitting display device of the present invention comprises: a conductive layer including a refractory metal over a substrate having an insulating surface; a wiring layer and a first electrode formed over the conductive layer; a semiconductor layer formed over the wiring layer; a gate insulating layer formed over the semiconductor layer; a gate electrode formed over the gate insulating layer; a partition wall covering an edge portion of the first electrode and the wiring layer; an electroluminescent layer over the first electrode; and a second electrode over the electroluminescent layer, wherein the first electrode covers an edge portion of the wiring layer.

In the above structure, the semiconductor layer may be a semi-amorphous semiconductor containing hydrogen and halogen and having a crystal structure. A TV set including a display screen, which is formed by using the light emitting display device having the above-described structure, can be manufactured.

A method for manufacturing a light emitting display device of the present invention comprises the steps of: forming a gate electrode over a substrate having an insulating surface with a substance having a photocatalytic function therebetween by a droplet discharge method; forming a gate insulating layer over the gate electrode; forming a semiconductor layer over the gate insulating layer; forming a first electrode over the gate insulating layer by a droplet discharge method; forming a wiring layer over the semiconductor layer by a droplet discharge method to cover an edge of the first electrode; forming a partition wall to cover the edge portion of the first electrode and the wiring layer; forming an electroluminescent layer over the first electrode; and forming a second electrode over the electroluminescent layer by a droplet discharge method.

A method for manufacturing a light emitting display device of the present invention comprises the steps of: forming a first electrode over a substrate having an insulating surface with a substance having a photocatalytic function therebetween by a droplet discharge method; forming a wiring layer over the substrate having an insulating surface with a substance having a photocatalytic function therebetween to cover an edge portion of the first electrode; forming a semiconductor layer over the wiring layer; forming a gate insulating layer over the semiconductor layer; forming a gate electrode over the gate insulating layer by a droplet discharge method; forming a partition wall to cover the edge portion of the first electrode and the wiring layer; forming an electroluminescent layer over the first electrode; and forming a second electrode over the electroluminescent layer by a droplet discharge method.

A method for manufacturing a light emitting display device of the present invention comprises the steps of: forming a gate electrode over a substrate having an insulating surface with a substance having a photocatalytic function therebetween by a droplet discharge method; forming a gate insulating layer over the gate electrode; forming a semiconductor layer over the gate insulating layer; forming a wiring layer over the semiconductor layer by a droplet discharge method; forming a first electrode over the gate insulating layer by a droplet discharge method to cover an edge portion of the wiring layer; forming a partition wall to cover an edge portion of the first electrode and the wiring layer; forming an electroluminescent layer over the first electrode; and forming a second electrode over the electroluminescent layer by a droplet discharge method.

A method for manufacturing a light emitting display device of the present invention comprises the steps of: forming a wiring layer over a substrate having an insulating surface with a substance having a photocatalytic function therebetween by a droplet discharge method; forming a first electrode over the substrate having an insulating surface with a substance having a photocatalytic function therebetween by a droplet discharge method to cover an edge portion of the wiring layer; forming a semiconductor layer over the wiring layer; forming a gate insulating layer over the semiconductor layer; forming a gate electrode over the gate insulating layer by a droplet discharge method; forming a partition wall to cover an edge portion of the first electrode and the wiring layer; forming an electroluminescent layer over the first electrode; and forming a second electrode over the electroluminescent layer by a droplet discharge method.

A method for manufacturing a light emitting display device of the present invention comprises the steps of: forming a conductive layer including a refractory metal over a substrate having an insulating surface; forming a gate electrode over the conductive layer by a droplet discharge method; forming a gate insulating layer over the gate electrode; forming a semiconductor layer over the gate insulating layer; forming a first electrode over the gate insulating layer by a droplet discharge method; forming a wiring layer over the semiconductor layer by a droplet discharge method to cover an edge portion of the first electrode; forming a partition wall to cover the edge portion of the first electrode and the wiring layer; forming an electroluminescent layer over the first electrode; and forming a second electrode over the electroluminescent layer by a droplet discharge method.

A method for manufacturing a light emitting display device of the present invention comprises the steps of: forming a conductive layer including a refractory metal over a substrate having an insulating surface; forming a first electrode over the conductive layer by a droplet discharge method; forming a wiring layer over the conductive layer by a droplet discharge method to cover an edge portion of the first electrode; forming a semiconductor layer over the wiring layer; forming a gate insulating layer over the semiconductor layer; forming a gate electrode over the gate insulating layer by a droplet discharge method; forming a partition wall to cover the edge portion of the first electrode and the wiring layer; forming an electroluminescent layer over the first electrode; and forming a second electrode over the electroluminescent layer by a droplet discharge method.

A method for manufacturing a light emitting display device of the present invention comprises the steps of: forming a conductive layer including a refractory metal over a substrate having an insulating surface; forming a gate electrode over the conductive layer by a droplet discharge method; forming a gate insulating layer over the gate electrode; forming a semiconductor layer over the gate insulating layer, forming a wiring layer over the semiconductor layer by a droplet discharge method; forming a first electrode over the gate insulating layer by a droplet discharge method to cover an edge portion of the wiring layer, forming a partition wall to cover an edge portion of the first electrode and the wiring layer, forming an electroluminescent layer over the first electrode; and forming a second electrode over the electroluminescent layer by a droplet discharge method.

A method for manufacturing a light emitting display device of the present invention comprises the steps of: forming a conductive layer including a refractory metal over a substrate having an insulating surface; forming a wiring layer over the conductive layer by a droplet discharge method; forming a first electrode over the conductive layer by a droplet discharge method to cover an edge portion of the wiring layer; forming a semiconductor layer over the wiring layer, forming a gate insulating layer over the semiconductor layer; forming a gate electrode over the gate insulating layer by a droplet discharge method; forming a partition wall to cover an edge portion of the first electrode and the wiring layer; forming an electroluminescent layer over the first electrode; and forming a second electrode over the electroluminescent layer by a droplet discharge method.

The gate insulating layer can prevent the gate electrode from oxidizing and can have a favorable interface with a semiconductor layer to be formed on an upper layer side of the gate insulating layer by sequentially laminating a first silicon nitride film, a silicon oxide film, and a second silicon nitride film.

According to the present invention, the gate electrode layer, the wiring layer, and the mask layer used in patterning are formed by a droplet discharge method as described above. However, its object is achieved by forming at least one or more of patterns required for manufacturing a light emitting display device with a method capable of selectively forming a pattern and by manufacturing a light emitting display device.

In addition, the partition wall may be made of an organic material, an inorganic material, or a material in which a skeletal structure is configured by a bond of silicon and oxygen. Since the organic material is superior in the planarity, the film thickness does not become extremely thin and disconnection does not occur in an uneven portion even when the conductive material is formed later; therefore, it is preferable. In addition, the organic material has a low dielectric constant. Accordingly, when the organic material is used as an interlayer insulating material of a plurality of wirings, the wiring capacity is reduced. Then, a multilayer wiring can be formed, and higher efficiency and higher function can be obtained.

On the other hand, a siloxane polymer can be given as a typical example of the material in which a skeletal structure is configured by a bond of silicon and oxygen. Specifically, it is a material in which a skeletal structure is configured by a bond of silicon and oxygen and which contains at least hydrogen as a substituent or which contains at least one of fluorine, an alkyl group, and aromatic hydrocarbon as a substituent. The material is also superior in planarity and has transparency and heat resistance. An insulating material made of a siloxane polymer can be heat-treated at a temperature of approximately equal to or less than from 300° C. to 600° C. after formation.

According to the present invention, patterning of a wiring layer and a mask layer can be directly performed by a droplet discharge method. Therefore, it is possible to obtain a TFT in which usability of a material is improved and a manufacturing step is simplified and a highly reliable light emitting display device therewith.

BEST MODE FOR CARRYING OUT THE INVENTION

Figure 1A:
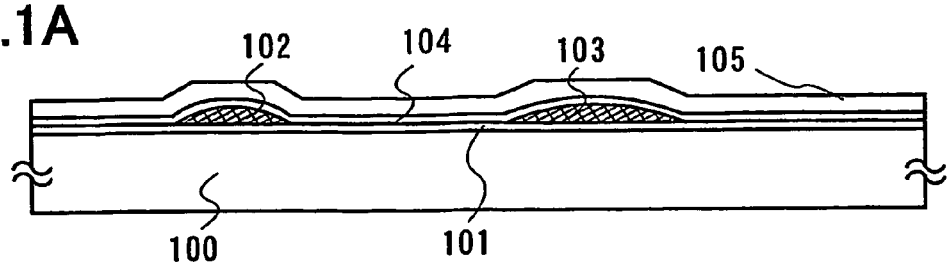
FIGS. 1A to 1D show a method for manufacturing a light emitting display device of the present invention.

Embodiment modes of the present invention are described in detail with reference to drawings. Note that the present invention is not limited to the following description. As is easily known to a person skilled in the art, the mode and the detail of the invention can be variously changed without departing from the purpose and the scope of the present invention. Thus, the present invention is not interpreted while limiting to the following description of the embodiment mode. Note that the same reference numeral is given to the same portion or a portion having a similar function among different diagrams in a structure of the present invention to be described hereinafter, and repetitive description is omitted.

Embodiment Mode 1

An embodiment mode of the present invention is described with reference to FIGS. 1A to 1D and FIGS. 2A and 2B. Specifically, a method for manufacturing a light emitting display device to which the present invention is applied is described. First, a method for manufacturing a light emitting display device having a channel protective thin film transistor in which the present invention is applied to manufacturing of a gate electrode and a source-drain wiring is described with reference to FIGS. 1A to 1D and FIGS. 2A and 2B.

A base film 101 that improves adhesion is formed over a substrate 100 as base pretreatment. A glass substrate made of barium borosilicate glass, alumino borosilicate glass, or the like, a quartz substrate, a silicon substrate, a metal substrate, a stainless steel substrate, or a heat-resistant plastic substrate which can withstand a processing temperature in this manufacturing step can be used as the substrate 100. In addition, a surface of the substrate 100 may be polished by a CMP method or the like so that it is planarized. Note that an insulating layer may be formed over the substrate 100. The insulating layer is formed by using an oxide or nitride material containing silicon by a known method such as a CVD method, a plasma CVD method, a sputtering method, or a spin coating method to be a single layer or a laminated layer. The insulating layer may not be formed, but it is effective in blocking a contaminant from the substrate 100 and the like. In the case of forming the insulating layer to prevent contamination from a glass substrate, the base film 101 is formed as base pretreatment for conductive layers 102 and 103 to be formed thereover by a droplet discharge method.

Figure 22:
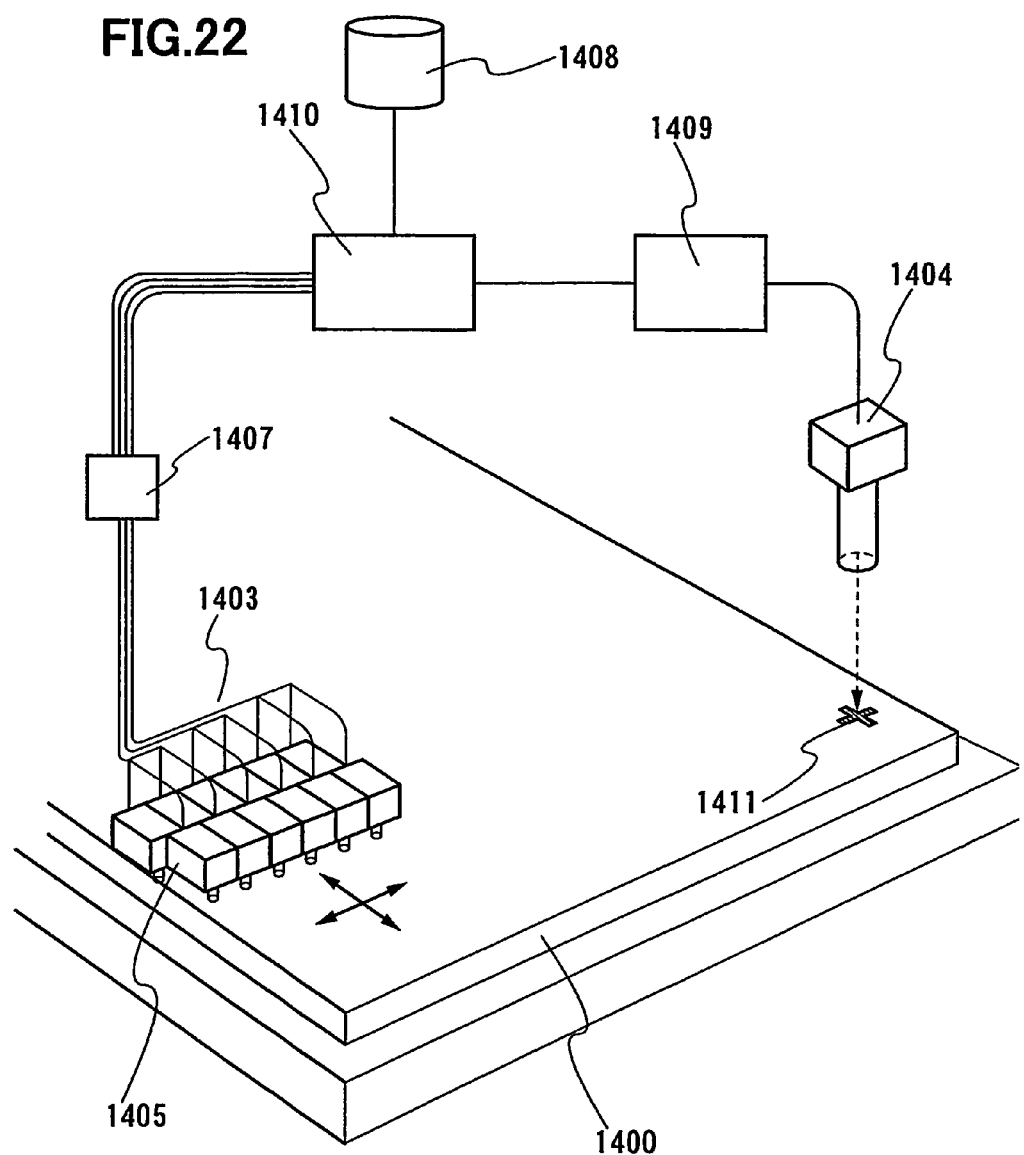
FIG. 22 shows a structure of a droplet discharge apparatus which can be applied to the present invention.

One mode of a droplet discharge apparatus used for formation of a pattern is shown in FIG. 22. Each head 1405 of a droplet discharge means 1403 is connected to a control means 1407, and is controlled by a computer 1410, so that a preprogrammed pattern can be drawn. The timing of drawing may be determined based on a marker 1411 that is formed over a substrate 1400, for example. Alternatively, a benchmark can be fixed based on an edge of the substrate 1400. That is detected by an imaging means 1404 such as a CCD, and changed into a digital signal at an image processing means 1409. Then, the digital signal is recognized by the computer 1410, and a control signal is generated and is transmitted to the control means 1407. Naturally, information on a pattern to be formed over the substrate 1400 is stored in a storage medium 1408, and a control signal is transmitted to the control means 1407 based on the information, so that each head 1405 of the droplet discharge means 1403 can be individually controlled. A pattern can be drawn using one head by discharging each of a conductive material, an organic or inorganic material, and the like. When a pattern is drawn over a wide area, for example, an interlayer film, one material is simultaneously discharged from a plurality of nozzles to improve a throughput, and thus, drawing can be performed. When a large-size substrate is used, the head 1405 can freely move over the substrate and a region to be drawn can be set freely. Thus, a plurality of the same patterns can be drawn over one substrate.

In this embodiment mode, a substance having a function of a photocatalytic function is used as a base film having a function of improving adhesion. The photocatalytic substance can be formed by a dip coating method of a sol-gel method, a spin coating method, a droplet discharge method, an ion plating method, an ion beam method, a CVD method, a sputtering method, an RF magnetron sputtering method, a plasma spray method, or an anodic oxidation method. In addition, the substance does not need to have continuity as a film depending on its formation method. The photocatalytic substance can be formed by mixing and melting a salt of a constituent element, in the case of a photocatalytic substance made of an oxide semiconductor including a plurality of metals. A solvent may be baked or dried when it is necessary to be removed in the case of forming the photocatalytic substance by an application method such as a dip coating method or a spin coating method. Specifically, it may be heated at a predetermined temperature (for example, 300° C. or more), preferably, in an atmosphere including oxygen. For example, Ag is used as conductive paste and baking is performed in an atmosphere including oxygen and nitrogen; then, an organic material such as a thermosetting resin is decomposed. Thus, Ag without containing an organic material can be obtained. Accordingly, planarity on the surface of Ag can be enhanced.

According to the heat treatment, the photocatalytic substance can have a predetermined crystal structure. For example, it has an anatase type or a rutile-anatase mixed type. The anatase type is preferentially formed in a low temperature phase. Therefore, the photocatalytic substance may be heated even when it does not have a predetermined crystal structure. In addition, the photocatalytic substance can be formed plural times to obtain a predetermined film thickness in the case of being formed by an application method.

The case of forming $TiO_X$ (typically, $TiO_2$) crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_X$ having high photocatalytic activity. It is preferable to form $TiO_X$ while heating a film formation chamber or a substrate provided with an object to be treated.

The thus formed $TiO_X$ has a photocatalytic function even when it is a very thin film.

Further, it is preferable to form the base film 101 made of a metal material such as Ti (titanium), W (tungsten), Cr (chromium), Ta (tantalum), Ni (nickel), or Mo (molybdenum), or oxide thereof by a sputtering method, a vapor deposition method, or the like as another base pretreatment.

The base film 101 may be formed to be from 0.01 nm to 10 nm in thickness. It may be formed to be very thin and need not necessarily have a layer structure. When a refractory metal material is used as the base film, it is preferable to treat a base film exposed on the surface by carrying out either of the following two steps after forming the conductive layers 102 and 103 to be a gate electrode layer.

The first method is a step of insulating the base film 101 which is not overlapped with the conductive layers 102 and 103 and forming an insulating layer. In other words, the base film 101 which is not overlapped with the conductive layers 102 and 103 is oxidized and insulated. When the base film 101 is oxidized and insulated in this way, it is preferable to form the base film 101 to be from 0.01 nm to 10 nm in thickness; thus, the base film can be easily oxidized. Note that oxidization may be performed by exposing to an oxygen atmosphere or by heat-treating.

The second method is a step of removing the base film 101 by etching using the conductive layers 102 and 103 as a mask. When this step is employed, there is no limitation on a thickness of the base film 101.

Alternatively, a method of performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1 \times 10^{10}$ m$^{-3}$ to $1 \times 10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

Subsequently, a composition including a conductive material is discharged, and conductive layers 102 and 103 to function as a gate electrode later are formed. The conductive layers 102 and 103 are formed by using a droplet discharge means.

The conductive layers 102 and 103 are formed by using the droplet discharge means. The droplet discharge means is a general term for the one having a means of discharging a droplet such as a nozzle having a discharging opening of a composition or a head equipped with one nozzle or plural nozzles. A diameter of the nozzle included in the droplet discharge means is set in the range of from 0.02 μm to 100 μM (favorably, 30 μm or less) and a volume of the composition to be discharged from the nozzle is set in the range of from 0.001 pl to 100 pl (favorably, 10 pl or less). The volume of the composition to be discharged increases in proportion to a size of the diameter of the nozzle. Further, it is preferable that a distance between an object to be treated and the discharging openings of the nozzle is as short as possible in order to drop the droplet on a desired position. The distance is favorably set in the range of about from 0.1 mm to 3 mm (more favorably, 1 mm or less).

As for the composition to be discharged from the discharging opening, a conductive material dissolved or dispersed in a solvent is used. The conductive material corresponds to a fine particle or a dispersant nano-particle of a metal such as Ag, Au, Cu, Ni, Pt, Pd, Ir, Rh, W, or Al, sulfide of a metal such as Cd or Zn, oxide of Fe, Ti, Si, Ge, Zr, Ba, or the like, or silver halide. In addition, it corresponds to indium tin oxide (ITO), ITSO made of indium tin oxide and silicon oxide, organic indium, organic tin, zinc oxide, titanium nitride, or the like which is used as a transparent conductive film. However, as for compositions to be discharged from the discharging opening, it is preferable to use any material selected from gold, silver, and copper, which is dissolved or dispersed in a solvent, taking a specific resistance value into consideration. It is more preferable to use silver or copper having a low resistance value. When silver or copper is used, a barrier film may be additionally provided as a measure for an impurity. A silicon nitride film or nickel boron (NiB) can be used as the barrier film.

In addition, a particle in which a conductive material is coated with other conductive materials to be a plurality of layers may be used. For example, a three-layer structure particle in which copper is coated with nickel boron (NiB), and then, coated with silver may be used. As for such solvents, esters such as butyl acetate and ethyl acetate; alcohols such as isopropyl alcohol and ethyl alcohol; organic solvents such as methyl ethyl ketone and acetone; or the like may be used. The viscosity of the composition is preferably 50 mPa·S (cps) or less. This is because the composition is prevented from drying or the composition is smoothly discharged from the discharging opening. The surface tension of the composition is preferably 40 mN/m or less. Note that the viscosity of the composition and the like may be appropriately adjusted in accordance with a solvent to be used and intended use. For example, the viscosity of a composition in which ITO, organic indium, or organic tin is dissolved or dispersed in the solvent is from 5 mPa·S to 50 mPa·S, the viscosity of a composition in which silver is dissolved or dispersed in the solvent is from 5 mPa·S to 20 mPa·S, and the viscosity of a composition in which gold is dissolved or dispersed in the solvent is from 10 mPa·S to 20 mPa·S.

The conductive layer may be formed by laminating a plurality of conductive materials. In addition, the conductive layer may be formed by a droplet discharge method using silver as a conductive material; thereafter, it may be plated with copper or the like. Plating may be performed by electroplating or a chemical (electroless) plating method. Plating may be performed by soaking a substrate surface into a container filled with a solution having a plating material. A solution having a plating material may be applied so that the solution flows over the substrate surface with the substrate placed obliquely (or vertically). When the plating is performed by applying a solution with the substrate placed vertically, there is an advantage of miniaturizing a process apparatus.

The diameter of a particle of the conductive material is preferably as small as possible for the purpose of preventing clogged nozzles and manufacturing a high-definition pattern, although it depends on the diameter of each nozzle, a desired shape of a pattern, and the like. Preferably, the diameter of the particle of the conductive material is 0.1 μm or less. The composition is formed by a known method such as an electrolyzing method, an atomizing method, a wet reducing method, or the like, and the particle size thereof is typically about from 0.01 μm to 10 μm. Note that when a gas evaporation method is employed, a nanomolecule protected with a dispersant is minute, about 7 nm. When each surface of particles is covered with a coating, the nanoparticles do not cohere in the solvent and are uniformly dispersed in the solvent at a room temperature, and show a property similar to that of liquid. Accordingly, it is preferable to use a coating.

When the step of discharging the composition is performed under reduced pressure, the solvent of the composition is evaporated during a period from discharging the composition until the composition lands on an object to be treated, and thus, later steps of drying and baking the composition can be both omitted. It is preferable to perform the step under reduced pressure, since an oxide film or the like is not formed on the surface of the conductive material. After discharging the composition, either or both steps of drying and baking is/are performed. Each step of drying and baking is a step of heat treatment. For example, drying is performed for three minutes at 100° C. and baking is performed for from 15 minutes to 30 minutes at a temperature of from 200° C. to 350° C., each of which has a different purpose, temperature, and period. The steps of drying and baking are performed at normal pressure or under reduced pressure by laser light irradiation, rapid thermal annealing, a heating furnace, or the like. Note that the timing of the heat treatment is not particularly limited. The substrate may be heated to favorably perform the steps of drying and baking. The temperature of the substrate at the time depends on a material of the substrate or the like, but it is typically from 100° C. to 800° C. (preferably, from 200° C. to 350° C.). According to the steps, nanoparticles are made in contact with one another and fusion and welding are accelerated by hardening and shrinking a peripheral resin as well as evaporating the solvent in the composition or chemically removing the dispersant.

A continuous wave or pulsed wave gas laser or solid laser may be used for laser light irradiation. An excimer laser, a YAG laser, and the like can be given as a gas laser, and a laser using a crystal of YAG or $YVO_4$ which is doped with Cr, Nd, or the like can be given as a solid laser. Note that it is preferable to use a continuous wave laser in relation to the absorptance of laser light. Moreover, a so-called hybrid laser irradiation method which combines a pulsed wave and a continuous wave may be used. However, it is preferable that the heat treatment by laser light irradiation is instantaneously performed within several microseconds to several tens of seconds so that the substrate 100 is not damaged, depending on heat resistance of the substrate 100. Rapid thermal annealing (RTA) is carried out by raising the temperature rapidly and heating for several microseconds to several minutes using an infrared lamp or a halogen lamp emitting light of from ultraviolet to infrared in an inert gas atmosphere. Since the treatment is performed instantaneously, only a thin film on a top surface can be substantially heated and a lower layer film is not affected. In other words, even a substrate having low heat resistance such as a plastic substrate is not affected.

In addition, the above-described step of forming the base film 101 is carried out as base pretreatment for a conductive layer to be formed by using a droplet discharge method; however, this treatment step may be carried out after forming the conductive layer.

Subsequently, a gate insulating film is formed over the conductive layers 102 and 103 (ref. FIG. 1A). The gate insulating film may be made of a known material such as an oxide or nitride material of silicon, and may be a laminated layer or a single layer. For example, it may be a laminated layer of three layers of a silicon nitride film, a silicon oxide film, and a silicon nitride film, or may be a single layer of them or of a silicon oxynitride film, or a laminated layer of two layers. A silicon nitride film is used as an insulating layer 104 and a silicon nitride oxide film is used as a gate insulating layer 105 in this embodiment mode. A silicon nitride film having minute film quality may be preferably used. In the case of using silver, copper, or the like for the conductive layer formed by a droplet discharge method, and then, forming a silicon nitride film or a NiB film thereover as a barrier film, the silicon nitride film or the NiB film is effective in preventing an impurity from diffusing and in planarizing the surface. Note that a rare gas element such as argon is preferably included in a reactive gas and is preferably mixed in the insulating film to be formed in order to form a minute insulating film with few gate leak current at a low film-formation temperature.

Figure 1B:
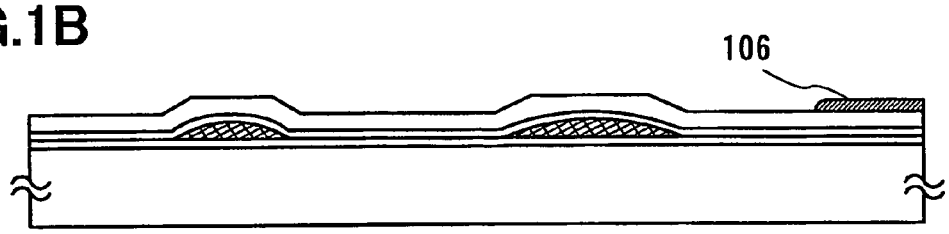

Subsequently, a conductive layer (also referred to as a first electrode) 106 is formed by selectively discharging a composition including a conductive material onto the gate insulating film (ref. FIG. 1B). The conductive layer 106 may be formed by forming a predetermined pattern of a composition including indium tin oxide (ITO), indium tin oxide containing silicon oxide (ITO), zinc oxide (ZnO), tin oxide ($SnO_2$), or the like and by baking it when light is to be emitted from the substrate 100 side or when a transmissive EL display panel is to be manufactured.

Preferably, the conductive layer 106 is made of indium tin oxide (ITO), indium tin oxide containing silicon oxide (ITSO), zinc oxide (ZnO), or the like by a sputtering method. It is more preferable to use indium tin oxide containing silicon oxide formed by a sputtering method using a target in which ITO contains silicon oxide of from 2% to 10% by weight. In addition, an oxide conductive material which contains silicon oxide and in which indium oxide is mixed with zinc oxide (ZnO) of from 2% to 20% by weight may be used. A mask layer may be formed by a droplet discharge method and be etched to have a desired pattern after forming the conductive layer (the first electrode) 106 by a sputtering method. In this embodiment mode, the conductive layer 106 is made of a light-transmitting conductive material by a droplet discharge method. Specifically, it is formed by using indium tin oxide or ITSO made of ITO and silicon oxide. Although not shown, a photocatalytic substance may be formed in a region where the conductive layer 106 is to be formed, similarly to the case of forming the conductive layers 102 and 103. The photocatalytic substance can improve adhesion and the conductive layer 106 can be formed into a desired pattern to be a thin line. The conductive layer 106 becomes the first electrode which functions as a pixel electrode.

In this embodiment mode, above mentioned is an example of the gate insulating layer made up of three layers of a silicon nitride film a silicon oxynitride film (silicon oxide film)/a silicon nitride film which are made of silicon nitride. The conductive layer (the first electrode) 106 made of indium tin oxide containing silicon oxide is preferably formed close in contact with the gate insulating layer 105 made of silicon nitride. Accordingly, an effect of increasing a rate at which light generated in an electroluminescent layer is emitted outside can be caused.

In addition, a composition including a particle of a metal such as Ag (silver), Au (gold), Cu (copper), W (tungsten), or Al (aluminum) as its main component can be used when generated light is emitted to an opposite side of the substrate 100 or when a reflective EL display panel is manufactured. As another method, a first electrode layer may be formed by forming a transparent conductive film or a light-reflective conductive film by a sputtering method, forming a mask pattern by a droplet discharge method, and additionally performing an etching process.

The conductive layer (the first electrode) 106 may be polished by a CMP method or by cleaning with a porous body of polyvinyl alcohol so that the surface thereof is planarized. Furthermore, the surface of the conductive layer (the first electrode) 106 may be irradiated with an ultraviolet ray or may be treated with oxygen plasma after polishing by the CMP method.

The semiconductor layer may be formed by a known method (a sputtering method, an LPCVD method, a plasma CVD method, or the like). There is no particular limitation on materials of the semiconductor layer, but the semiconductor layer is preferably made of silicon, a silicon germanium (SiGe) alloy, or the like.

The semiconductor layer uses an amorphous semiconductor (typically, hydrogenated amorphous silicon) or a crystalline semiconductor (typically, polysilicon) as a material. Polysilicon includes so-called high-temperature polysilicon which uses, as a main material, polycrystalline silicon to be formed through a process temperature of 800° C. or more, so-called low-temperature polysilicon which uses, as a main material, polycrystalline silicon to be formed at a process temperature of 600° C. or less, crystalline silicon which is crystallized by adding, for example, an element for promoting crystallization, and the like.

Further, as another substance, a semi-amorphous semiconductor or a semiconductor containing a crystal phase in a part of a semiconductor layer can also be used. The semi-amorphous semiconductor means a semiconductor having an intermediate structure of an amorphous structure and a crystalline structure (including a single crystal and a poly-crystal) and having a third state which is stable in terms of free energy, and a crystalline semiconductor having short-distance order and lattice distortion. Typically, it is a semiconductor layer containing silicon as a main component with lattice distortion, in which the Raman spectrum is shifted to a lower frequency side than 520 cm$^{-1}$. Further, hydrogen or halogen of at least 1 atom % or more is contained therein as a neutralizing agent of a dangling bond. Here, such a semiconductor as described above is referred to as a semi-amorphous semiconductor (hereinafter, referred to as a "SAS" in short). The SAS is also referred to as a so-called microcrystal semiconductor (typically, microcrystalline silicon).

The SAS can be obtained by performing glow discharge decomposition (plasma CVD) on a silicide gas. $SiH_4$ is given as a typical silicide gas. $Si_2H_6$, $SiH_2Cl_2$, $SiHCl_3$, $SiCl_4$, $SiF_4$, or the like as well as $SiH_4$ can be used. Further, $GeF_4$ or $F_2$ may be mixed. Formation of the SAS can be facilitated by using the silicide gas diluted with hydrogen or a mixture of hydrogen and one or more of rare gases selected from helium, argon, krypton, and neon. A dilution ratio of hydrogen to the silicide gas is, for example, preferably in the range of from 2 times to 1000 times in terms of a flow ratio. Although formation of the SAS by glow discharge decomposition is preferably performed under reduced pressure, the formation can also be performed by utilizing an electric discharge under atmospheric pressure. Typically, the formation may be performed in the pressure range of from 0.1 Pa to 133 Pa. A power supply frequency for generating the glow discharge is in the range of from 1 MHz to 120 MHz, preferably, in the range of from 13 MH to 60 MHz. A high-frequency power supply may appropriately be set. A temperature for heating the substrate is preferably 300° C. or less and the temperature in the range of from 100° C. to 200° C. is also permissible. As for impurity elements to be contained mainly at the time of forming a film, an impurity derived from an atmospheric constituent such as oxygen, nitrogen, or carbon is preferably in a concentration of $1\times10^{20}$ cm$^{-3}$ or less, and particularly, a concentration of oxygen is $5\times10^{19}$ cm$^{-3}$ or less, preferably, $1\times10^{19}$ cm$^{-3}$ or less. Further, stability of the SAS can be enhanced by promoting the lattice distortion by allowing a rare gas element such as helium, argon, krypton, or neon to be contained, thereby obtaining a favorable SAS. In addition, a SAS layer formed from a hydrogen-based gas may be laminated over a SAS layer formed from a fluorine-based gas as the semiconductor layer.

When a crystalline semiconductor layer is used as the semiconductor layer, a known method (a laser crystallization method, a heat crystallization method, a heat crystallization method using an element promoting crystallization such as nickel, or the like) may be employed as a method for manufacturing the crystalline semiconductor layer. In the case of not introducing an element promoting crystallization, hydrogen is released until hydrogen concentration contained in an amorphous silicon film becomes $1\times10^{20}$ atoms/cm$^3$ or less by heating the amorphous silicon film for one hour at a temperature of 500° C. in nitrogen atmosphere before irradiating the amorphous silicon film with laser light. This is because a film is damaged when the amorphous silicon film containing much hydrogen is irradiated with laser light.

There is no particular limitation on a method for introducing a metal element into the amorphous semiconductor layer as long as it is a method capable of making the metal element exist on the surface of or inside the amorphous semiconductor layer. For example, a sputtering method, a CVD method, a plasma treating method (including a plasma CVD method), an adsorption method, or a method for applying a metal salt solution can be employed. Among them, the method using a solution is simple and easy and is useful in terms of easy concentration adjustment of the metal element. It is preferable that an oxide film is formed by UV light irradiation in oxygen atmosphere, a thermal oxidation method, treatment with ozone water or hydrogen peroxide including a hydroxyl radical, or the like in order to improve wettability on the surface of the amorphous semiconductor layer and to spread an aqueous solution over an entire surface of the amorphous semiconductor layer.

In addition, heat treatment and laser light irradiation may be combined to crystallize the amorphous semiconductor layer. The heat treatment and/or the laser light irradiation may be independently performed plural times.

An organic semiconductor using an organic material may be used as a semiconductor. A low molecular weight material, a high molecular weight material, or the like is used for the organic semiconductor, and in addition, a material such as an organic pigment, a conductive high molecular weight material can be used.

Figure 1C:
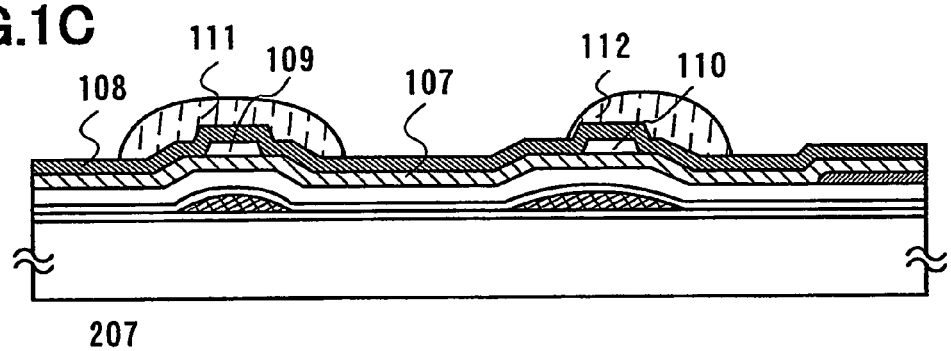

An amorphous semiconductor is used as the semiconductor in this embodiment mode. A semiconductor layer 107 that is an amorphous semiconductor layer is formed, and an insulating film is formed by, for example, a plasma CVD method and is patterned to have a desired shape in a desired region in order to form channel protective films 109 and 110. At this time, the channel protective films 109 and 110 can be formed by exposing a back of the substrate to light using the gate electrode as a mask. In addition, polyimide, polyvinyl alcohol, or the like may be dropped as the channel protective film by a droplet discharge method. Consequently, the light-exposure step can be omitted. Thereafter, an N type semiconductor layer 108 is formed using a semiconductor layer having one conductivity, for example, an N type amorphous semiconductor layer by a plasma CVD method or the like (ref. FIG. 1C). The semiconductor layer having one conductivity may be formed if necessary.

A film made of one or a plurality of inorganic materials (silicon oxide, silicon nitride, silicon oxynitride, silicon nitride oxide, and the like), photosensitive or non-photosensitive organic materials (organic resin materials) (polyimide, acrylic, polyamide, polyimide amide, a resist, benzocyclobutene, and the like), a Low k material having a low dielectric constant, and the like, or a laminated layer of them can be used as the channel protective film. In addition, a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used. A vapor phase growth method such as a plasma CVD method or a thermal CVD method or a sputtering method can be employed as a manufacturing method. In addition, a droplet discharge method or a printing method (a method for forming a pattern, such as screen printing or offset printing) can be employed. A TOF film, an SOG film, or the like obtained by an application method can be used.

Subsequently, mask layers 111 and 112 made of an insulating material such as a resist or polyimide are formed. Then, the semiconductor layer 107 and the N type semiconductor layer 108 are simultaneously patterned using the mask layers 111 and 112.

Figure 1D:
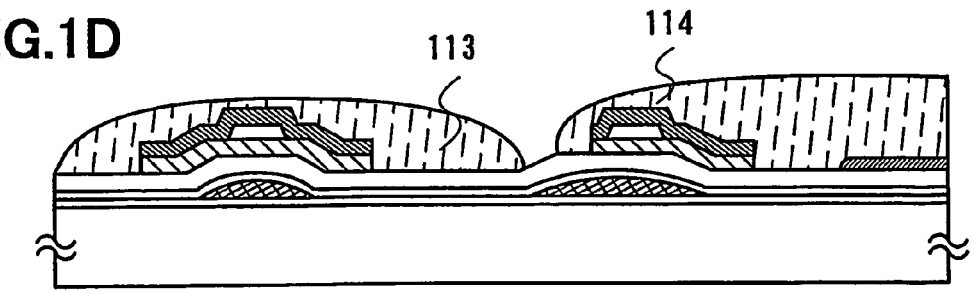

Then, mask layers 113 and 114 made of an insulating material such as a resist or polyimide are formed by using a droplet discharge method (ref. FIG. 1D). A through-hole 118 is formed in a part of the gate insulating layers 104 and 105 by an etching process using the mask layers 113 and 114, and a part of the conductive layer 103 disposed on a lower layer side thereof and to function as a gate electrode layer is exposed. Either plasma etching (dry etching) or wet etching may be adopted as the etching process. However, plasma etching is suitable to treat a large-sized substrate. A fluorine-based or chlorine-based gas such as $CF_4$, $NF_3$, $Cl_2$, or $BCl_3$ is used as an etching gas, and an inert gas such as He or Ar may be appropriately added. In addition, a local discharge process can be performed when an atmospheric pressure discharge etching process is applied, and a mask layer need not be entirely formed over the substrate.

Figure 2A:
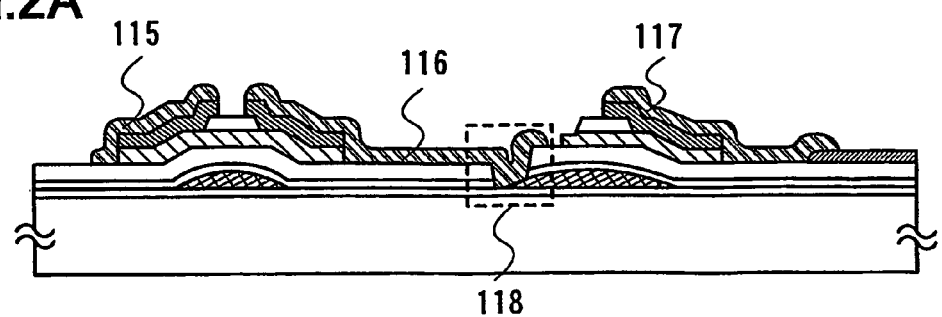
FIGS. 2A and 2B show a method for manufacturing a light emitting display device of the present invention.

Conductive layers 115, 116, and 117 are formed by discharging a composition including a conductive material after the mask layers 113 and 114 are removed. Then, the N type semiconductor is patterned using the conductive layers 115, 116, and 117 as a mask to form an N type semiconductor layer (ref. FIG. 2A). The conductive layers 115, 116, and 117 function as a wiring layer. Note that the above-mentioned base pretreatment of selectively forming a photocatalytic substance or the like in a portion where the conductive layers 115, 116, and 117 are to be in contact with the gate insulating layer 105 may be performed before forming the conductive layers 115, 116, and 117, although not shown. Accordingly, the conductive layer can be formed with favorable adhesion.

The above-mentioned step of forming the base film may be performed as base pretreatment for the conductive layer to be formed by using a droplet discharge method. In addition, the treatment step may be performed after the conductive layer is formed. Reliability of a light emitting display device can be improved since adhesion between the layers is improved according to the step.

The conductive layer 117 functions as a source-drain wiring layer and is formed to electrically connect with the first electrode formed beforehand. In addition, the conductive layer 116 that is the source-drain wiring layer and the conductive layer 103 that is a gate electrode layer are electrically connected to each other in the through-hole 118 formed in the gate insulating layer 105. A composition including a particle of a metal such as Ag (silver), Au (gold), Cu (copper), W (tungsten), or Al (aluminum) as its main component can be used as a conductive material for forming the wiring layer. In addition, light-transmitting indium tin oxide (ITO), ITSO made of indium tin oxide and silicon oxide, organic indium, organic tin, zinc oxide, titanium nitride, and the like may be combined.

The step of forming the through-hole 118 in a part of the gate insulating layers 104 and 105 may be performed after forming the conductive layers 115, 116, and 117, using the conductive layers 115, 116, and 117 as a mask to form the through-hole 118. Then, a conductive layer is formed in the through-hole 118, and the conductive layer 116 and the conductive layer 103 that is a gate electrode layer are electrically connected to each other. In this case, there is an advantage of simplifying the steps.

Figure 2B:
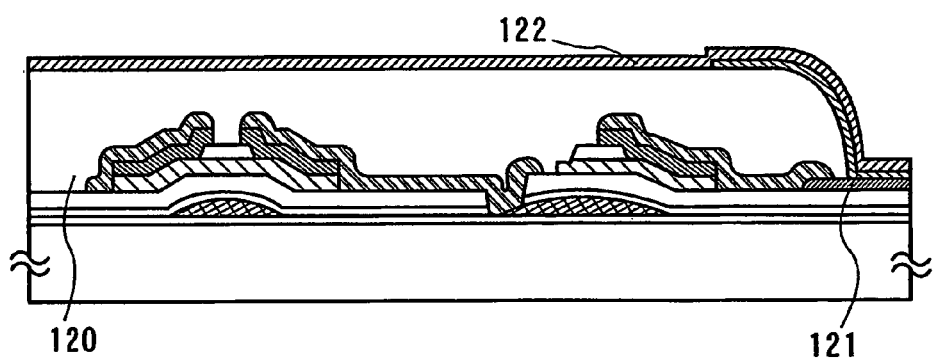

Subsequently, an insulating layer 120 to be a bank (also referred to as a partition wall) is formed. Although not shown, a protective layer made of silicon nitride or silicon nitride oxide may be entirely formed under the insulating layer 120 to cover a thin film transistor. An opening is formed in the insulating layer 120 as shown in FIG. 2B by an etching process after the insulating layer is entirely formed by a spin coating method or a dip method. The etching process is not necessarily required when the insulating layer 120 is formed by a droplet discharge method. When the insulating layer 120 or the like is formed over wide area by a droplet discharge method, it is formed by discharging a composition from a plurality of discharging openings of nozzles in a droplet discharge apparatus and by drawing so that a plurality of lines is overlapped with each other. Consequently, a throughput is improved.

The insulating layer 120 is formed to have a through-hole corresponding to a position where a pixel is to be formed in accordance with the conductive layer 106 that is the first electrode. The insulating layer 120 can be formed by using an inorganic insulating material such as silicon oxide, silicon nitride, silicon oxynitride, aluminum oxide, aluminum nitride, or aluminum oxynitride; acrylic acid; methacrylic acid; a derivative of acrylic acid or methacrylic; a heat-resistant high molecular weight material such as polyimide, aromatic polyamide, or polybenzimidazole; or inorganic siloxane or an organosiloxane-based insulating material in which hydrogen bonded with silicon is substituted by an organic group such as methyl or phenyl, including a Si—O—Si bond among compounds that contain silicon, oxygen, and hydrogen and that is formed by using a siloxane material as a starting material. It is preferable to form the insulating layer 120 by using a photosensitive or non-photosensitive material such as acrylic or polyimide since a side face thereof becomes such a shape that a curvature radius continuously changes and an upper-layer thin film is formed without break.

According to the above-mentioned steps, a TFT substrate for the EL display panel in which a bottom gate type (also referred to as an inversed staggered type) channel protective TFT and the first electrode (first electrode layer) are connected over the substrate 100 is completed.

Moisture adsorbed inside the insulating layer 120 or to a surface thereof is removed by performing heat treatment at 200° C. under atmospheric pressure before forming an electroluminescent layer 121. In addition, heat treatment is performed at a temperature of from 200° C. to 400° C., preferably, from 250° C. to 350° C. under reduced pressure, and the electroluminescent layer 121 is preferably formed by a vacuum vapor deposition method or a droplet discharge method under reduced pressure without being exposed to atmospheric air.

Materials showing luminescence of red (R), green (G), and blue (B) are selectively formed as the electroluminescent layer 121 by a vapor deposition method or the like using respective vapor-deposition mask. The materials showing luminescence of red (R), green (G), and blue (B) (a low molecular weight or high molecular weight material, or the like) can be formed by a droplet discharge method similarly to a color filter. This case is preferable since it can be separately colored with RGB without using a mask. A conductive layer 122 that is a second electrode is laminated over the electroluminescent layer 121, and then, a light emitting display device having a display function using a light emitting element is completed (ref. FIG. 2B).

It is effective to provide a passivation film to cover the second electrode, although not shown. The passivation film is made of an insulating film including silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide having larger nitrogen content than oxygen content (AlNO), aluminum oxide, diamond like carbon (DLC), or a nitrogen-containing carbon film ($CN_X$), and a single layer or a combined laminated layer of the insulating film can be used. For example, a laminated layer of a nitrogen-containing carbon film ($CN_X$) silicon nitride (SiN), or an organic material can be used, and a laminated layer of a high molecular material such as a styrene polymer may be used. In addition, a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

In this case, a film having favorable coverage is preferably used as the passivation film, and it is effective to use a carbon film, specifically, a DLC film. Since the DLC film can be formed at a temperature ranging from room temperature to 100° C. or less, it can be easily formed over the electroluminescent layer having low heat resistance. The DLC film can be formed by a plasma CVD method (typically, an RF plasma CVD method, a microwave CVD method, an electron cyclotron resonance (ECR) CVD method, a hot filament CVD method, or the like), a combustion flame method, a sputtering method, an ion beam vapor deposition method, a laser vapor deposition method, or the like. As a reactive gas to be used for film formation, a hydrogen gas and a hydrocarbon gas (for example, $CH_4$, $C_2H_2$, $C_6H_6$, or the like) are used. The gases are ionized by glow discharge, and ions are accelerated to collide against a cathode, to which a negative self-bias is applied, to form a film. In addition, a CN film may be formed using a $C_2H_4$ gas and an $N_2$ gas as a reactive gas. The DLC film has a high blocking effect against oxygen and can suppress oxidation of the electroluminescent layer. Therefore, a problem of oxidizing the electroluminescent layer can be prevented during the following sealing step.

Figure 16A:
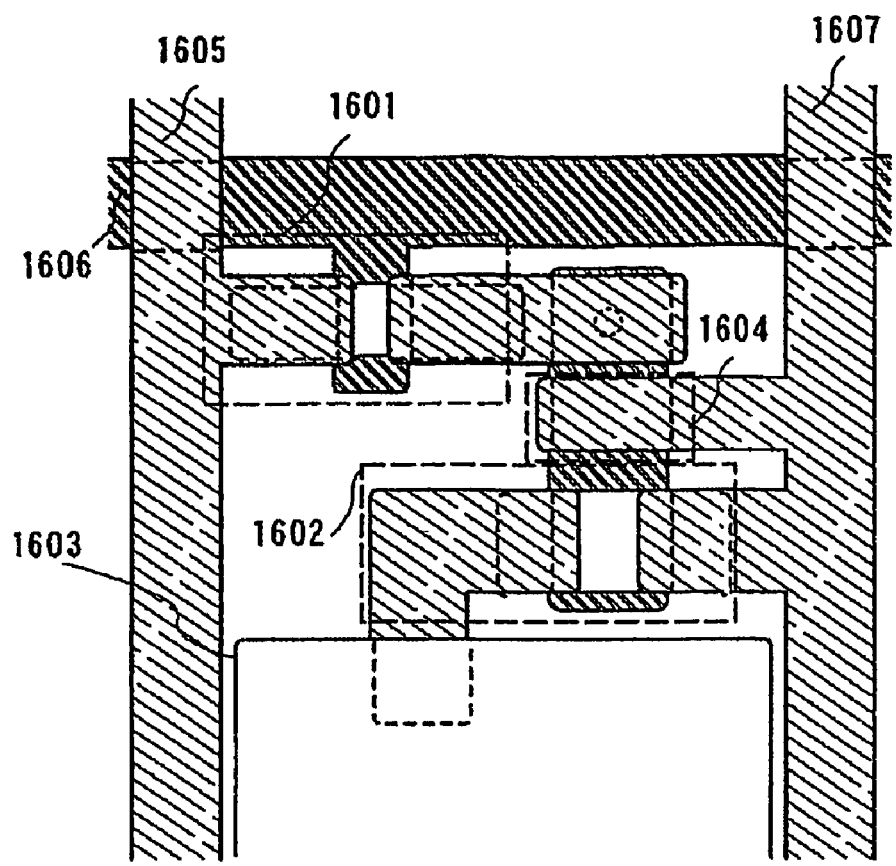
FIGS. 16A and 16B are a top view and a circuit diagram of a pixel circuit in a light emitting display device of the present invention.
Figure 16B:
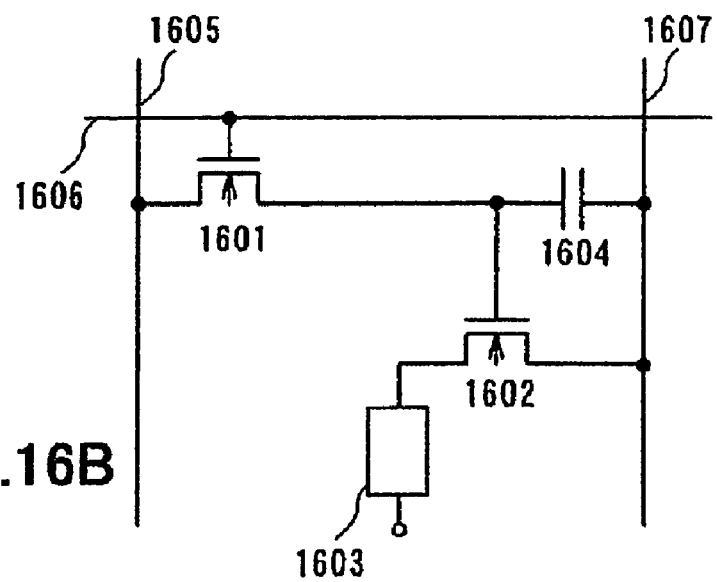

FIG. 16A is a top view of a pixel portion in the light emitting display device of this embodiment mode and FIG. 16B shows a circuit diagram thereof. Reference numerals 1601 and 1602 denote TFTs; 1603, a light emitting element; 1604, a capacitor; 1605, a source line; 1606, a gate line; and 1607, a power supply line. The TFT 1601 is a transistor which controls a connection state with the signal line (hereinafter also referred to as a "switching transistor" or a "switching TFT"). The TFT 1602 is a transistor which controls a current flowing to the light emitting element (hereinafter also referred to as a "driving transistor" or a "driving TFT"), and the driving TFT is connected in series with the light emitting element. The capacitor 1604 holds source-gate voltage of the TFT 1602 that is the driving TFT.

Figure 13:
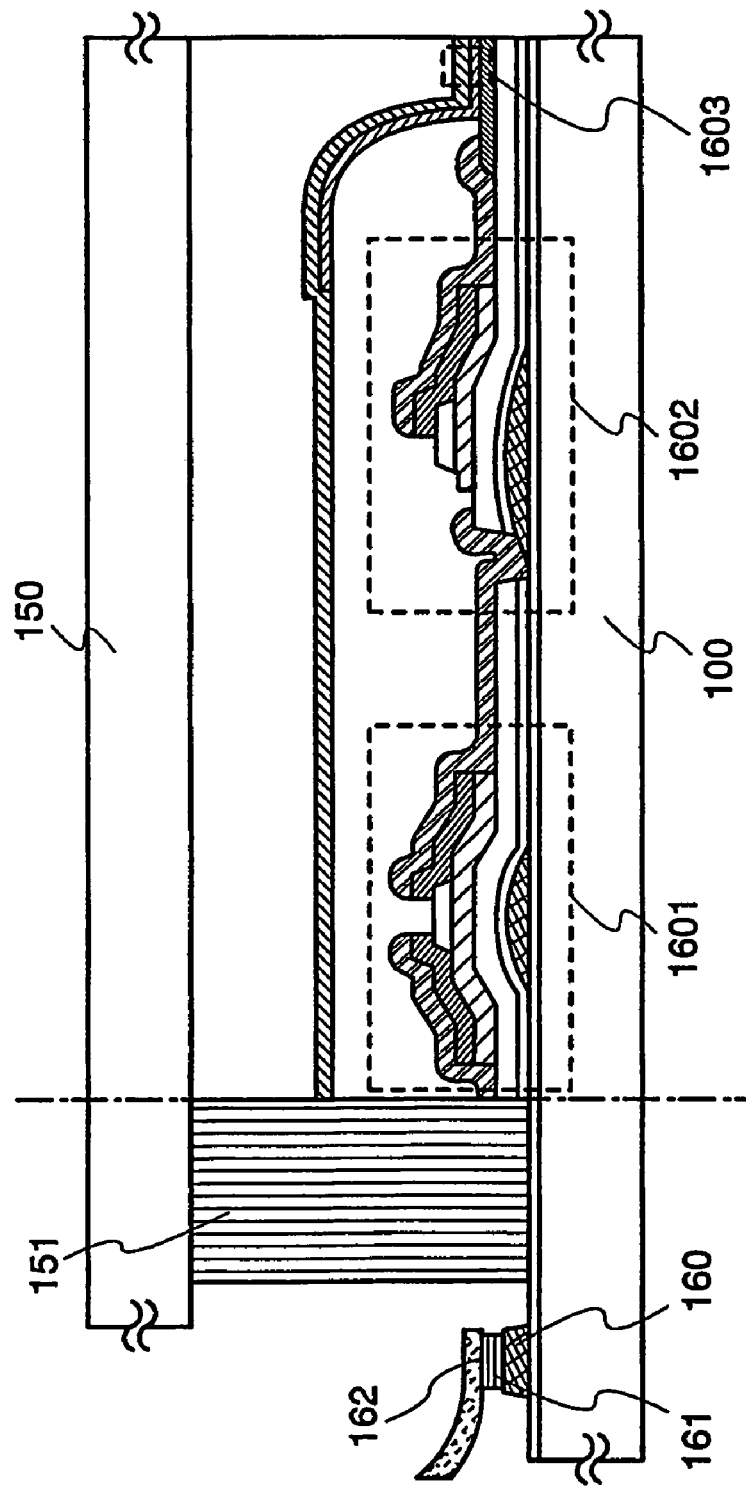
FIG. 13 shows a method for manufacturing a light emitting display device of the present invention.

FIG. 13 is a detailed diagram of the light emitting display device of this embodiment mode. A substrate 100 having a switching TFT 1601 and a TFT 1602 that is a driving TFT connected to a light emitting element 1603 is firmly fixed to a sealing substrate 150 by a sealant 151. Various signals supplied to each circuit formed over the substrate 100 are supplied from a terminal portion.

A gate wiring layer 160 is formed in the terminal portion in the same step as the conductive layers 102 and 103. Naturally, a photocatalytic substance is formed in a formation region of the gate wiring layer 160 similarly to the conductive layers 102 and 103. When it is formed by a droplet discharge method, adhesion of the gate wiring layer 160 with a formation region of a base can be improved. Etching which exposes the gate wiring layer 160 can be simultaneously performed when the through-hole 118 is formed in the gate insulating layer 105. A flexible printed circuit board (FPC) 162 can be connected to the gate wiring layer 160 by means of an anisotropic conductive layer 161.

Note that the case where the light emitting element 1603 is sealed with the glass substrate is shown in the above described light emitting display device. Sealing treatment is treatment for protecting the light emitting element from moisture. Any one of a method for sealing with a cover material, a method for sealing with a thermosetting resin or a UV curing resin, and a method for sealing with a thin film having high barrier capability such as metal oxide or nitride is employed. Glass, ceramics, plastic, or metal can be used as the cover material; however, the cover Material is required to be light-transmitting when light is emitted to a cover material side. The cover material and the substrate over which the light emitting element is formed are attached to each other using a sealant such as a thermosetting resin or an ultraviolet curing resin. A sealed space is formed by curing the resin with heat treatment or ultraviolet light irradiation treatment. It is also effective to provide a hygroscopic material typified by barium oxide inside the sealed space. The hygroscopic material may be provided over the sealant to be in contact therewith, or may be provided over the partition wall or in a peripheral portion which does not block light from the light emitting element. Furthermore, a space between the cover material and the substrate over which the light emitting element is formed can be filled with a thermosetting resin or an ultraviolet curing resin. In this case, it is effective to add a hygroscopic material typified by barium oxide to the thermosetting resin or the ultraviolet curing resin.

As described above, the step can be omitted in this embodiment mode by not applying a light exposure step utilizing a photomask. In addition, an EL display panel can be easily manufactured by directly forming various patterns over a substrate with a droplet discharge method even when a glass substrate of the fifth or the following generation having a side of more than 1000 mm is used.

In addition, a highly reliable light emitting display device in which adhesion and peel resistance are improved can be manufactured.

Embodiment Mode 2

An embodiment mode of the present invention is described with reference to FIGS. 5A to 5D and FIGS. 6A and 6B. This embodiment mode describes the case of using a channel etch thin film transistor as a thin film transistor in Embodiment Mode 1. Therefore, repetitive description of the same portion or a portion having a similar function is omitted.

Figure 5A:
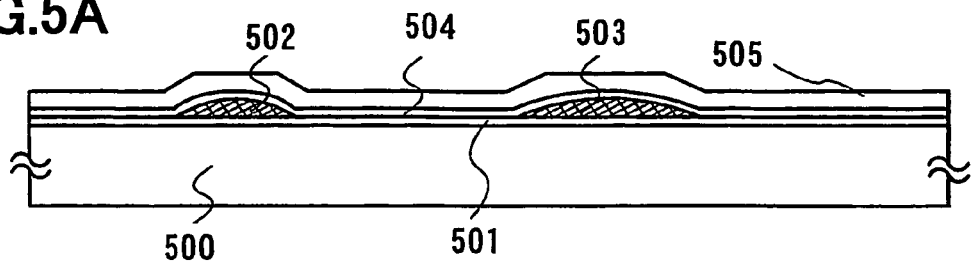
FIGS. 5A to 5D show a method for manufacturing a light emitting display device of the present invention.

A base film 501 having a function of improving adhesion is formed over a substrate 500 (ref. FIG. 5A). Note that an insulating layer may be formed over the substrate 500. The insulating layer is used as the base film, although it may not necessarily be formed, and it is effective in blocking a contaminant or the like from the substrate 500. In the case of forming the insulating layer to prevent contamination from a glass substrate, a base film 501 is formed as a base film in a formation region of conductive layers 502 and 503 to be formed thereover by a droplet discharge method.

In this embodiment mode, a substance having a photocatalytic function is used as a base film having a function of improving adhesion.

The case of forming $TiO_X$ crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_X$ having high photocatalytic activity. It is preferable to form $TiO_X$ while heating a film formation chamber or a substrate provided with an object to be treated.

The thus formed $TiO_X$ has a photocatalytic function even when it is a very thin film.

Further, it is preferable to form the base film 501 made of a metal material such as Ti (titanium), W (tungsten), Cr (chromium), Ta (tantalum), Ni (nickel), or Mo (molybdenum), or oxide thereof by a sputtering method, a vapor deposition method, or the like as another base pretreatment. The base film 501 may be formed to be from 0.01 nm to 10 nm in thickness. It may be formed to be very thin and need not necessarily have a layer structure. When a refractory metal material is used as the base film, it is preferable to treat a base film exposed on the surface by carrying out either of the following two steps after forming the conductive layers 502 and 503 to be a gate electrode layer.

The first method is a step of insulating the base film 501 which is not overlapped with the conductive layers 502 and 503 and forming an insulating layer. In other words, the base film 501 which is not overlapped with the conductive layers 502 and 503 is oxidized and insulated. When the base film 501 is oxidized and insulated in this way, it is preferable to form the base film 501 to be from 0.01 nm to 10 nm in thickness; thus, the base film can be easily oxidized. Note that oxidization may be performed by exposing to an oxygen atmosphere or heat-treating.

The second method is a step of removing the base film 501 by etching using the conductive layers 502 and 503 as a mask. When the step is employed, there is no limitation on a thickness of the base film 501.

Alternatively, a method for performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1\times10^{10}$ $m^{-3}$ to $1\times10^{14}$ $m^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

Subsequently, a composition including a conductive material is discharged, and conductive layers 502 and 503 to function as a gate electrode later are formed. The conductive layers 502 and 503 are formed by using a droplet discharge means. Silver is used as the conductive material in this embodiment mode; however, a laminate of silver and copper or the like may be used. In addition, a single layer of copper may be used.

The above-mentioned step of forming the base film 501 is performed as base pretreatment for the conductive layer to be formed by using a droplet discharge method; however, the treatment step may be performed after the conductive layer is formed.

Subsequently, a gate insulating film is formed over the conductive layers 502 and 503 (ref. FIG. 5A). The gate insulating film may be made of a known material such as an oxide or nitride material of silicon, and may be a laminated layer or a single layer.

Figure 5B:
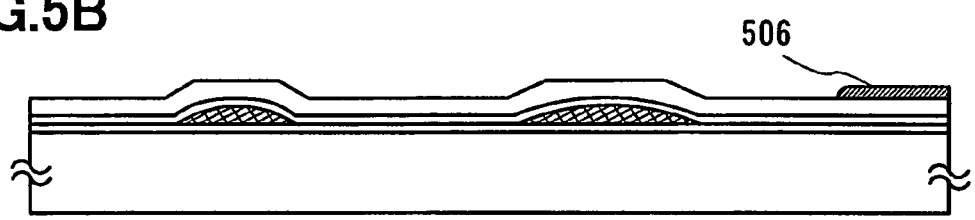

Subsequently, a conductive layer (also referred to as a first electrode) 506 is formed by selectively discharging a composition including a conductive material onto the gate insulating film (ref. FIG. 5B). The conductive layer 506 may be formed by forming a predetermined pattern of a composition including indium tin oxide (ITO), indium tin oxide containing silicon oxide (ISO), zinc oxide (ZnO), tin oxide ($SnO_2$), or the like and by baking it when light is emitted from the substrate 500 side or when a transmissive EL display panel is manufactured. Although not shown, a photocatalytic substance may be formed in a region where the conductive layer 506 is to be formed, similarly to the case of forming the conductive layers 502 and 503. The photocatalytic substance can improve adhesion and the conductive layer 506 can be formed into a desired pattern to be a thin line. The conductive layer 506 becomes the first electrode which functions as a pixel electrode.

The semiconductor layer may be formed by a known method (a sputtering method, an LPCVD method, a plasma CVD method, or the like). There is no particular limitation on materials of the semiconductor layer, but the semiconductor layer is preferably made of silicon, a silicon germanium (SiGe) alloy, or the like.

An amorphous semiconductor (typically, hydrogenated amorphous silicon), a semi-amorphous semiconductor, a semiconductor including a crystal phase in a part of the semiconductor layer, a crystalline semiconductor (typically, polysilicon), or an organic semiconductor can be used as the semiconductor layer.

Figure 5C:
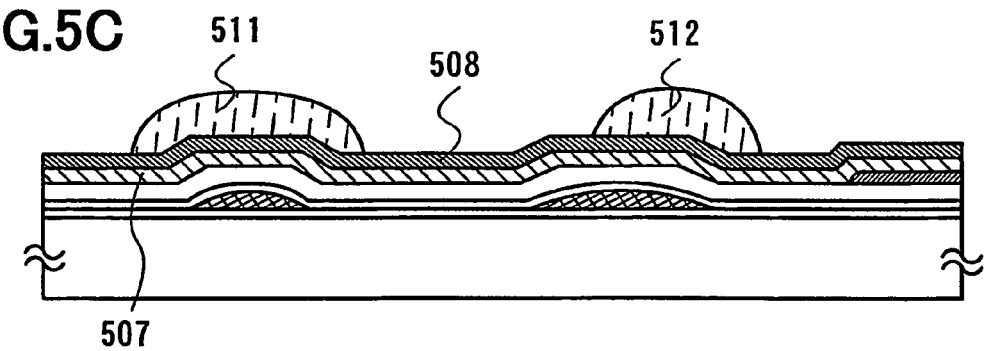

An amorphous semiconductor is used as the semiconductor in this embodiment mode. A semiconductor layer 507 is formed, and a semiconductor layer having one conductivity, for example, an N type semiconductor layer 508 is formed by a plasma CVD method or the like (ref. FIG. 5C). The semiconductor layer having one conductivity may be formed if necessary.

Subsequently, mask layers 511 and 512 made of an insulating material such as a resist or polyimide are formed. Then, the semiconductor layer 507 and the N type semiconductor layer 508 are simultaneously patterned using the mask layers 511 and 512.

Figure 5D:
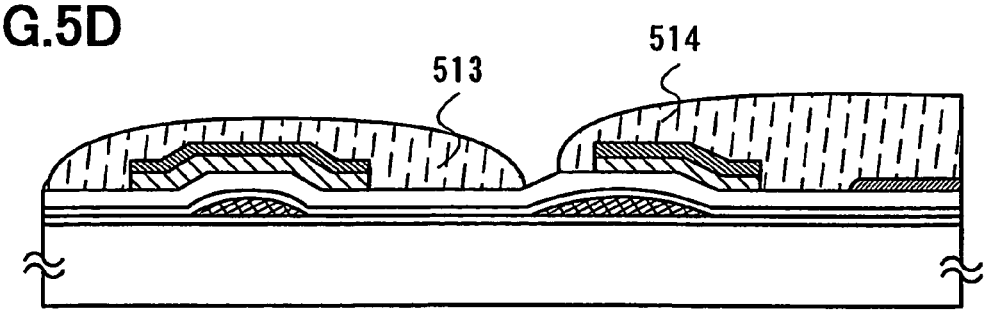

Then, mask layers 513 and 514 made of an insulating material such as a resist or polyimide are formed by using a droplet discharge method (ref. FIG. 5D). A through-hole 518 is formed in a part of the gate insulating layers 504 and 505 by an etching process using the mask layers 513 and 514, and a part of the conductive layer 503 disposed on a lower layer side thereof and to function as a gate electrode layer is exposed.

Figure 6A:
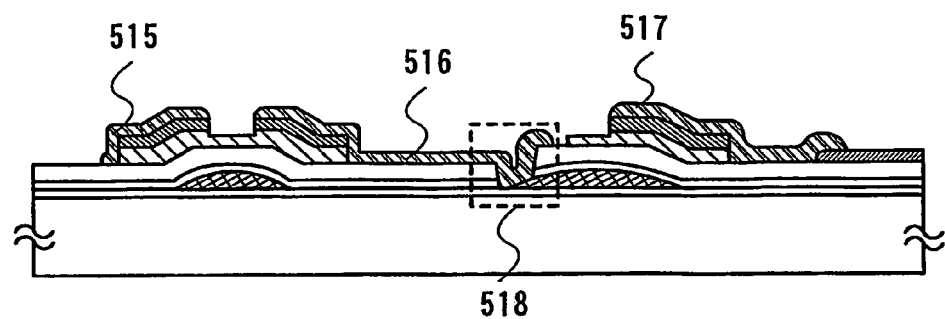
FIGS. 6A and 6B show a method for manufacturing a light emitting display device of the present invention.

Conductive layers 515, 516, and 517 are formed by discharging a composition including a conductive material after the mask layers 513 and 514 are removed. Then, the N type semiconductor is patterned using the conductive layers 515, 516, and 517 as a mask to form an N type semiconductor layer (ref. FIG. 6A). Note that a photocatalytic substance may be selectively formed in a portion where the conductive layers 515, 516, and 517 are to be in contact with the gate insulating layer 505 before forming the conductive layers 515, 516, and 517, although not shown. Accordingly, the conductive layer can be formed with favorable adhesion.

The conductive layer 517 functions as a source-drain wiring layer and is formed to electrically connect with the conductive layer 506 that is the first electrode formed beforehand. In addition, the conductive layer 516 that is the source-drain wiring layer and the conductive layer 503 that is a gate electrode layer are electrically connected to each other in the through-hole 518 formed in the gate insulating layer 505.

The step of forming the through-hole 518 in a part of the gate insulating layers 504 and 505 may be performed after forming the conductive layers 515, 516, and 517, using the conductive layers 515, 516, and 517 to be the wiring layer as a mask to form the through-hole 518. Then, a conductive layer is formed in the through-hole 518, and the conductive layer 516 that is the wiring layer and the conductive layer 503 that is a gate electrode layer are electrically connected to each other. In this case, there is an advantage of simplifying the steps.

Figure 6B:
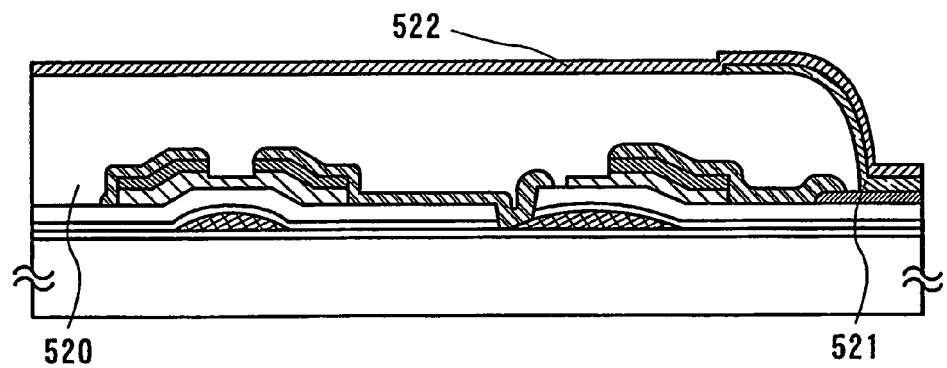

Subsequently, an insulating layer 520 to be a bank (also referred to as a partition wall) is formed. An opening is formed in the insulating layer 520 as shown in FIG. 6B by an etching process after the insulating layer is entirely formed by a spin coating method or a dip method. The etching process is not necessarily required when the insulating layer 520 is formed by a droplet discharge method.

The insulating layer 520 is formed to have a through-hole corresponding to a position where a pixel is to be formed in accordance with the conductive layer 506 that is the first electrode.

According to the above-mentioned steps, a TFT substrate in which a bottom gate type (also referred to as an inversed staggered type) channel etch TFT and the conductive layer 506 that is the first electrode are connected over the substrate 500 is completed.

An electroluminescent layer 521 and a conductive layer 522 are laminated over the conductive layer 506 that is the first electrode, and then, a light emitting display device having a display function using a light emitting element is completed (ref. FIG. 6B).

As described above, the step can be omitted in this embodiment mode by not applying a light exposure step utilizing a photomask. In addition, an EL display panel can be easily manufactured by directly forming various patterns over a substrate with a droplet discharge method even when a glass substrate of the fifth or the following generation having a side of more than 1000 mm is used.

In addition, a highly reliable light emitting display device in which adhesion and peel resistance are improved can be manufactured.

Embodiment Mode 3

An embodiment mode of the present invention is described with reference to FIGS. 9A to 9D and FIG. 10. This embodiment mode describes the case of using a top gate type (also referred to as a staggered type) thin film transistor as a thin film transistor in Embodiment Mode 1. Therefore, repetitive description of the same portion or a portion having a similar function is omitted.

Figure 9A:
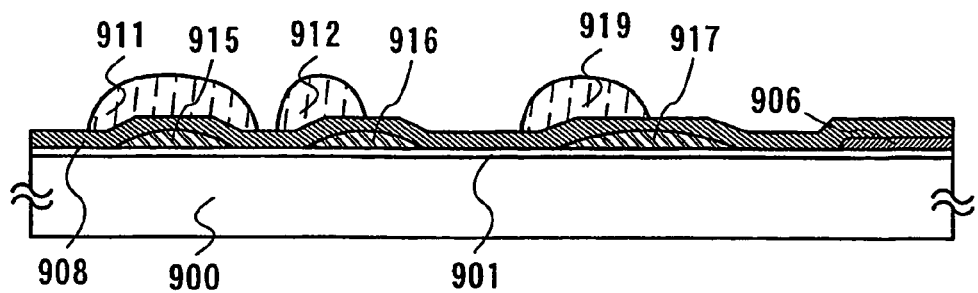
FIGS. 9A to 9D show a method for manufacturing a light emitting display device of the present invention.
Figure 9B:
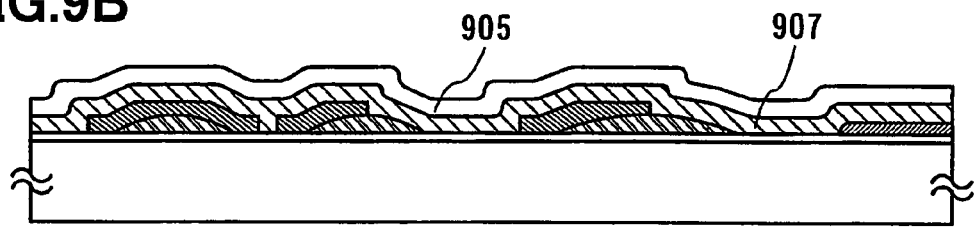
Figure 9C:
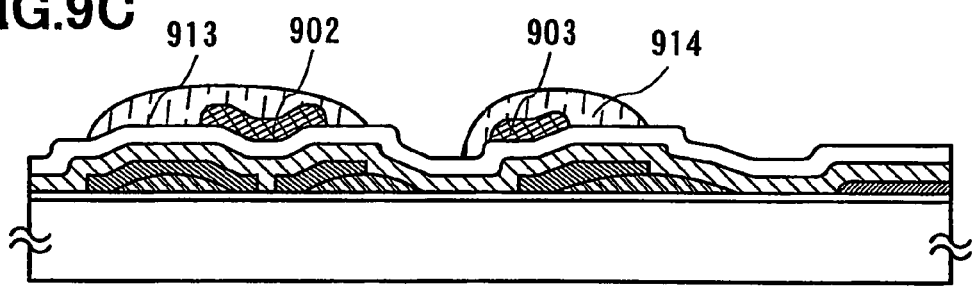
Figure 9D:
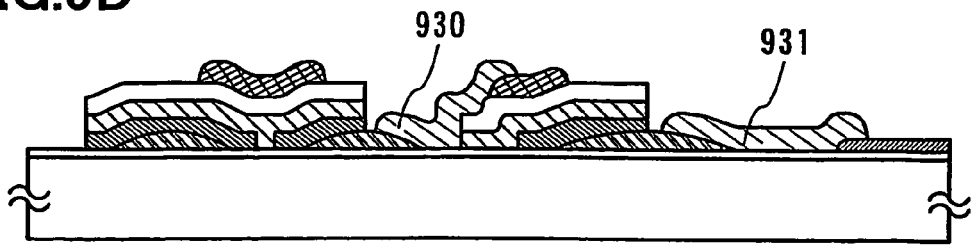

A base film 901 having a function of improving adhesion is formed over a substrate 900 (ref. FIG. 9A). Note that an insulating layer may be formed over the substrate 900. The insulating layer may not necessarily be formed, but it is effective in blocking a contaminant or the like from the substrate 900. The insulating layer is necessary particularly in the case of a staggered type thin film transistor as in this embodiment mode since a semiconductor layer is directly in contact with the substrate. In the case of forming a base film to prevent contamination from a glass substrate, the base film 901 is formed as a base film in a formation region of conductive layers 915, 916, and 917 to be formed thereover by a droplet discharge method.

In this embodiment mode, a substance having a photocatalytic function is used as the base film 901 having a function of improving adhesion.

The case of forming $TiO_X$ crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_X$ having high photocatalytic activity. It is preferable to form $TiO_X$ while heating a film formation chamber or a substrate provided with an object to be treated.

The thus formed $TiO_X$ has a photocatalytic function even when it is a very thin film.

Further, it is preferable to form the base film 901 made of a metal material such as Ti (titanium), W (tungsten), Cr (chromium), Ta (tantalum), Ni (nickel), or Mo (molybdenum), or oxide thereof by a sputtering method, a vapor deposition method, or the like as another base pretreatment. The base film 901 may be formed to be from 0.01 nm to 10 nm in thickness. It may be formed to be very thin and need not necessarily have a layer structure. When a refractory metal material is used as the base film, it is preferable to treat a base film exposed on the surface by carrying out either of the following two steps after forming the conductive layers 915, 916, and 917 to function as a source-drain wiring layer.

The first method is a step of insulating the base film 901 which is not overlapped with the conductive layers 915, 916, and 917 that function as a source-drain wiring layer and forming an insulating layer. In other words, the base film 901 which is not overlapped with the conductive layers 915, 916, and 917 that function as a source-drain wiring layer is oxidized and insulated. When the base film 901 is oxidized and insulated in this way, it is preferable to form the base film 901 to be from 0.01 nm to 10 nm in thickness; thus, the base film can be easily oxidized. Note that oxidization may be performed by exposing to an oxygen atmosphere or heat-treating.

The second method is a step of removing the base film 901 by etching using the conductive layers 915, 916, and 917 that function as a source-drain wiring layer as a mask. When the step is employed, there is no limitation on a thickness of the base film 901.

Alternatively, a method for performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1\times10^{10}$ m$^{-3}$ to $1\times10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

Subsequently, a composition including a conductive material is discharged, and conductive layers 915, 916, and 917 to function as a source-drain wiring layer are formed. The conductive layers 915, 916, and 917 are formed by using a droplet discharge means.

A composition including a particle of a metal such as Ag (silver), Au (gold), Cu (copper), W (tungsten), or Al (aluminum) as its main component can be used as a conductive material for forming the conductive layers 915, 916, and 917. Since the source-drain wiring layer is preferably made low resistant, it is preferable to use any material selected from gold, silver, and copper, which is dissolved or dispersed in a solvent, taking a specific resistance value into consideration. It is more preferable to use silver or copper having a low resistance value. The solvent corresponds to esters such as butyl acetate, alcohols such as isopropyl alcohol, an organic solvent such as acetone, or the like. Surface tension and viscosity thereof are appropriately adjusted by adjusting concentration of the solvent or by adding a surfactant or the like.

Subsequently, a conductive layer (also referred to as a first electrode) 906 is formed by selectively discharging a composition including a conductive material (ref. FIG. 9A). The conductive layer 906 may be formed by forming a predetermined pattern of a composition including indium tin oxide (ITO), indium tin oxide containing silicon oxide (ITSO), zinc oxide (ZnO), tin oxide ($SnO_2$), or the like and by baking it when light is to be emitted from the substrate 900 side or when a transmissive EL display panel is to be manufactured. Although not shown, a photocatalytic substance may be formed similarly as to case of forming the conductive layers 915, 916, and 917 in a region where the conductive layer 906 is to be formed. The photocatalytic substance can improve adhesion and the conductive layer 906 can be formed into a desired pattern to be a thin line. The conductive layer 906 becomes the first electrode which functions as a pixel electrode.

In addition, the above-mentioned step of forming the base film 901 is performed as base pretreatment for the conductive layer to be formed by using a droplet discharge method; however, the treatment step may be performed after the conductive layers 915, 916, and 917 are formed. For example, when a titanium oxide film is formed and an N type semiconductor layer is formed thereover, adhesion between the conductive layer and the N type semiconductor layer is improved, although not shown.

After the N type semiconductor layer is entirely formed over the conductive layers 915, 916, and 917, the N type semiconductor layers between the conductive layer 915 and the conductive layer 916 and between the conductive layer 916 and the conductive layer 917 are removed by etching using mask layers 911, 912, and 919 made of an insulating material such as a resist or polyimide. A semiconductor layer having one conductivity may be formed if necessary. Then, a semiconductor layer 907 made of an AS or a SAS is formed by a vapor phase growth method or a sputtering method. When a plasma, CVD method is employed, an AS is formed by using $SiH_4$ that is a semiconductor material gas or a mixture gas of $SiH_4$ and $H_2$. A SAS is formed from a mixture gas in which $SiH_4$ is diluted with $H_2$ by 3 times to 1000 times. When the SAS is formed from the above gas, the semiconductor layer has favorable crystallinity on a surface side of the semiconductor layer. It is suitable for a top gate type TFT in which the gate electrode is formed in an upper layer of the semiconductor layer.

Subsequently, a gate insulating layer 905 is formed to be a single layer or to have a laminated structure by using a plasma CVD method or a sputtering method. A laminate of three layers of an insulating layer made of silicon nitride, an insulating layer made of silicon oxide, and an insulating layer made of silicon nitride is a particularly preferable structure.

Next, gate electrode layers 902 and 903 are formed by a droplet discharge method. A composition including a particle of a metal such as Ag (silver), Au (gold), Cu (copper), W (tungsten), or Al (aluminum) as its main component can be used as a conductive material for forming the layer.

The semiconductor layer 907 and the gate insulating layer 905 are formed in a position corresponding to the source-drain wiring layer (the conductive layers 915, 916, and 917) using the mask layers 913 and 914 formed by a droplet discharge method. In other words, the semiconductor layer is formed to straddle the conductive layer 915 and the conductive layer 916.

Subsequently, conductive layers 930 and 931 are formed by a droplet discharge method. The conductive layer 916 and the gate electrode layer 903, and the conductive layer 917 and the conductive layer 906 that is the first electrode are electrically connected to each other, respectively.

The source-drain wiring layer and the gate electrode layer may be directly connected by the gate electrode layer without using the conductive layer 930. In that case, a through-hole is formed in the gate insulating layer 905 and a part of the conductive layers 916 and 917 that are the source-drain wirings is exposed before the gate electrode layers 902 and 903 are formed. Thereafter, the gate electrode layers 902 and 903 and the conductive layer 931 are formed by a droplet discharge method. At this time, the gate electrode layer 903 is a wiring which also serves as the conductive layer 930, and is connected to the conductive layer 916. Either dry etching or wet etching is employed for etching; however, plasma etching that is dry etching is preferable.

Figure 10:
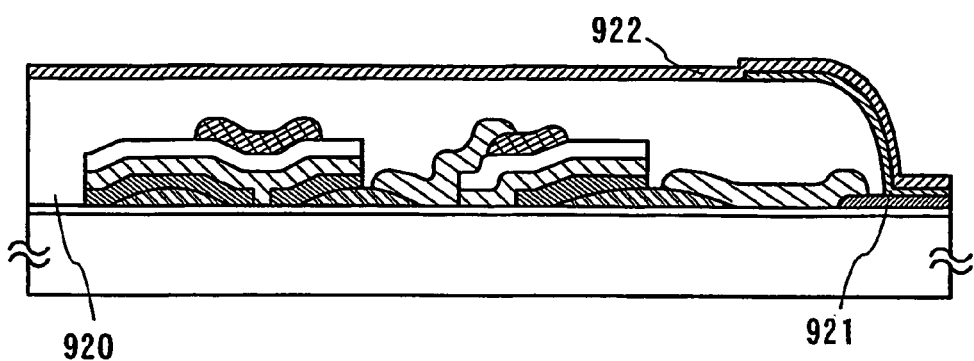
FIG. 10 shows a method for manufacturing a light emitting display device of the present invention.

Subsequently, an insulating layer 920 to be a bank (also referred to as a partition wall) is formed. Although not shown, a protective layer made of silicon nitride or silicon nitride oxide may be entirely formed under the insulating layer 920 to cover a thin film transistor. An opening is formed in the insulating layer 920 as shown in FIG. 10 by an etching process after the insulating layer is entirely formed by a spin coating method or a dip method. The etching process is not necessarily required when the insulating layer 920 is formed by a droplet discharge method. When the insulating layer 920 or the like is formed over wide area by a droplet discharge method, it is formed by discharging a composition from a plurality of discharging openings of nozzles in a droplet discharge apparatus and by drawing so that a plurality of lines is overlapped with each other. Consequently, a throughput is improved.

The insulating layer 920 is formed to have a through-hole corresponding to a position where a pixel is to be formed in accordance with the conductive layer 906 that is the first electrode.

According to the above-mentioned steps, a TFT substrate in which a top gate type (also referred to as a staggered type) TFT and the conductive layer 906 that is the first electrode layer are connected over the substrate 900 is completed.

Moisture adsorbed inside the insulating layer 920 or to a surface thereof is removed by performing heat treatment at 200° C. under atmospheric pressure before forming an electroluminescent layer 921. In addition, heat treatment is performed at a temperature of from 200° C. to 400° C., preferably, from 250° C. to 350° C. under reduced pressure, and the electroluminescent layer 921 is preferably formed by a vacuum vapor deposition method or a droplet discharge method under reduced pressure without being exposed to atmospheric air.

An electroluminescent layer 921 and a conductive layer 922 are laminated over the conductive layer 906 that is the first electrode, and then, a light emitting display device having a display function using a light emitting element is completed (ref. FIG. 10).

As described above, a step can be omitted in this embodiment mode by not applying a light exposure step utilizing a photomask. In addition, an EL display panel can be easily manufactured by directly forming various patterns over a substrate with a droplet discharge method even when a glass substrate of the fifth or the following generation having a side of more than 1000 mm is used.

In addition, a highly reliable light emitting display device in which adhesion and peel resistance are improved can be manufactured.

Embodiment Mode 4

An embodiment mode of the present invention is described with reference to FIGS. 3A to 3D and FIGS. 4A and 4B. This embodiment mode describes the case of having a different connection structure of a thin film transistor and a first electrode from that in Embodiment Mode 1. Therefore, repetitive description of the same portion or a portion having a similar function is omitted.

A base film 301 for improving adhesion is formed over a substrate 300 as base pretreatment. The case of forming $TiO_X$ crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_X$ having high photocatalytic activity. It is preferable to form $TiO_X$ while heating a film formation chamber or a substrate provided with an object to be treated.

The thus formed $TiO_X$ has a photocatalytic function even when it is a very thin film.

Further, it is preferable to form the base film 301 made of a metal material such as TI (titanium), W (tungsten), Cr (chromium), Ta (tantalum), Ni (nickel), or Mo (molybdenum), or oxide thereof by a sputtering method, a vapor deposition method, or the like as another base pretreatment. The base film 301 may be formed to be 0.01 nm to 10 nm in thickness. It may be formed to be very thin and need not necessarily have a layer structure. When a refractory metal material is used as the base film, it is preferable to treat a base film exposed on the surface by carrying out either of the following two steps after forming conductive layers 302 and 303 to be a gate electrode layer.

The first method is a step of insulating the base film 301 which is not overlapped with the conductive layers 302 and 303 and forming an insulating layer. In other words, the base film 301 which is not overlapped with the conductive layers 302 and 303 is oxidized and insulated. When the base film 301 is oxidized and insulated in this way, it is preferable to form the base film 301 to be from 0.01 nm to 10 nm in thickness; thus, the base film can be easily oxidized. Note that oxidization may be performed by exposing to an oxygen atmosphere or heat-treating.

The second method is a step of removing the base film 301 by etching using the conductive layers 302 and 303 as a mask. When the step is employed, there is no limitation on a thickness of the base film 301.

Alternatively, a method for performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1 \times 10^{10}$ m$^{-3}$ to $1 \times 10^{14}$ m$^3$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

Subsequently, a composition including a conductive material is discharged, and conductive layers 302 and 303 to function as a gate electrode later are formed. The conductive layers 302 and 303 are formed by using a droplet discharge means. Silver is used as the conductive material in this embodiment mode; however, a laminate of silver and copper or the like may be used. In addition, a single layer of copper may be used.

The above-mentioned step of forming the base film 301 is performed as base pretreatment for the conductive layer to be formed by using a droplet discharge method; however, the treatment step may be performed after the conductive layer is formed.

Figure 3A:
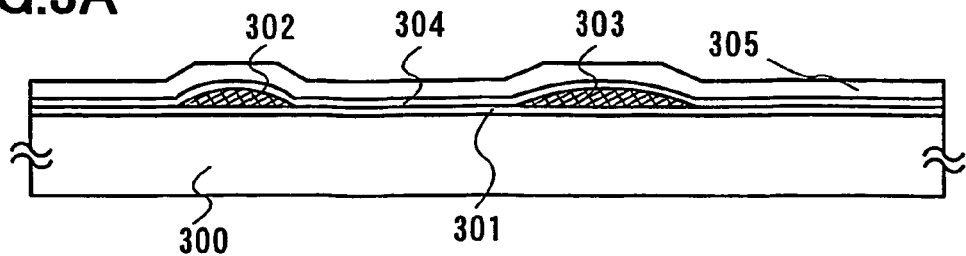
FIGS. 3A to 3D show a method for manufacturing a light emitting display device of the present invention.
Figure 3B:
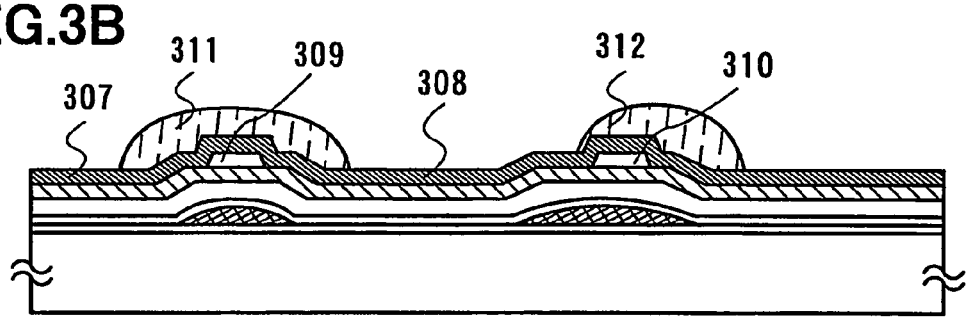

Subsequently, a gate insulating film is formed over the conductive layers 302 and 303 (ref. FIG. 3A). The gate insulating film may be made of a known material such as an oxide or nitride material of silicon, and may be a laminated layer or a single layer.

The semiconductor layer may be formed by a known method (a sputtering method, an LPCVD method, a plasma CVD method, or the like). There is no particular limitation on materials of the semiconductor layer, but the semiconductor layer is preferably made of silicon, a silicon germanium (SiGe) alloy, or the like.

An amorphous semiconductor (typically, hydrogenated amorphous silicon), a semi-amorphous semiconductor, a semiconductor including a crystal phase in a part of the semiconductor layer, a crystalline semiconductor (typically, polysilicon), or an organic semiconductor can be used as the semiconductor layer.

An amorphous semiconductor is used as the semiconductor in this embodiment mode. A semiconductor layer 307 is formed, and an insulating film is formed by, for example, a plasma CVD method and is patterned to have a desired shape in a desired region in order to form channel protective films 309 and 310. In addition, polyimide, polyvinyl alcohol, or the like may be formed as the channel protective film by a droplet discharge method or a printing method (a method for forming a pattern, such as screen printing or offset printing). Thereafter, a semiconductor layer having one conductivity, for example, an N type semiconductor layer 308 is formed by a plasma CVD method or the like. The semiconductor layer having one conductivity may be formed if necessary.

Subsequently, mask layers 311 and 312 made of an insulating material such as a resist or polyimide are formed. Then, the semiconductor layer 307 and the N type semiconductor layer 308 are simultaneously patterned using the mask layers 311 and 312.

Figure 3C:
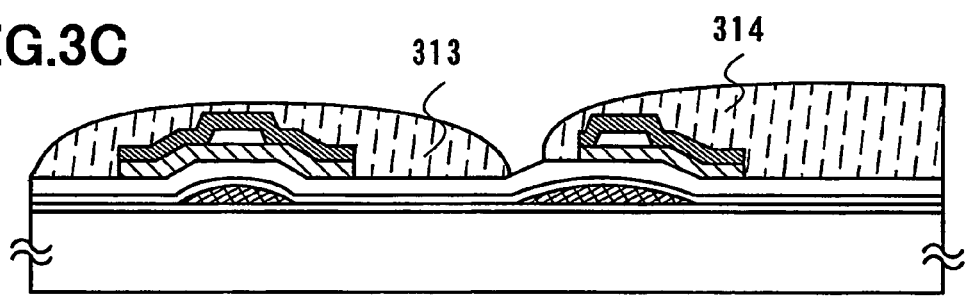

Then, mask layers 313 and 314 made of an insulating material such as a resist or polyimide are formed by using a droplet discharge method (ref. FIG. 3C). A through-hole 318 is formed in a part of the gate insulating layers 304 and 305 by an etching process using the mask layers 313 and 314, and a part of the conductive layer 303 disposed on a lower layer side thereof and to function as a gate electrode layer is exposed. Either plasma etching (dry etching) or wet etching may be adopted as the etching process. However, plasma etching is suitable to process a large-sized substrate. In addition, a local discharge process can be performed when an atmospheric pressure discharge etching process is applied, and a mask layer need not be entirely formed over the substrate.

Figure 3D:
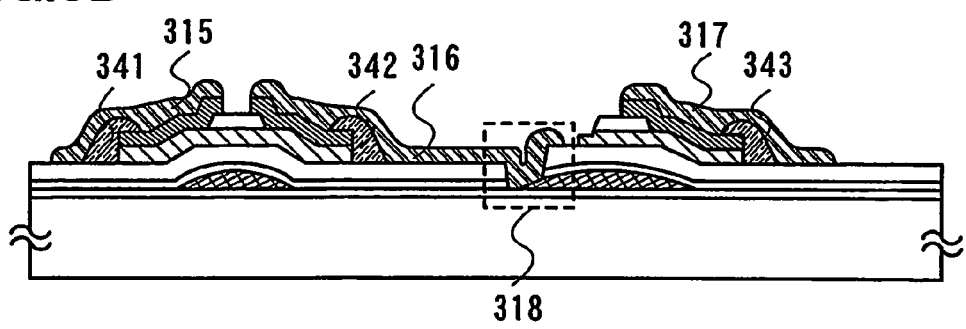

Conductive layers 315, 316, and 317 are formed by discharging a composition including a conductive material after the mask layers 313 and 314 are removed. Then, the N type semiconductor layer is patterned using the conductive layers 315, 316, and 317 (ref. FIG. 3D). Note that the above-mentioned base pretreatment of selectively forming a photocatalytic substance or the like in a portion where the conductive layers 315, 316, and 317 are to be in contact with the gate insulating layer 305 may be performed before forming the conductive layers 315, 316, and 317, although not shown. In addition, base pretreatment may be performed on the surface also after the formation. According to this step, the conductive layer can be formed with favorable adhesion with a lower layer thereof and an upper layer to be laminated.

Further, the conductive layers 315, 316, and 317 that are wiring layers are formed to cover the N type semiconductor layer and the semiconductor layer as shown in FIG. 3D. The semiconductor layer is patterned by etching. Therefore, the wiring layer might not be able to cover a steep step and might be disconnected. Therefore, insulating layers 341, 342, and 343 are formed to reduce a step, and the step may be made gradual. The insulating layers 341, 342, and 343 can be selectively formed without a mask or the like when a droplet discharge method is employed. The step can be reduced owing to the insulating layers 341, 342, and 343, and the wiring layer to cover the insulating layers can be formed with favorable coverage without a defect such as break. The insulating layers 341, 342, and 343 can be formed by using an inorganic insulating material such as silicon oxide, silicon nitride, silicon oxynitride, aluminum oxide, aluminum nitride, or aluminum oxynitride; acrylic acid; methacrylic acid; a derivative of acrylic acid or methacrylic; a heat-resistant high molecular weight material such as polyimide, aromatic polyamide, or polybenzimidazole; or inorganic siloxane or an organosiloxane-based insulating material in which hydrogen bonded with silicon is substituted by an organic group such as metyl or phenyl, including a Si—O—Si bond among compounds that contain silicon, oxygen, and hydrogen and that is formed by using a siloxane material as a starting material.

Figure 4A:
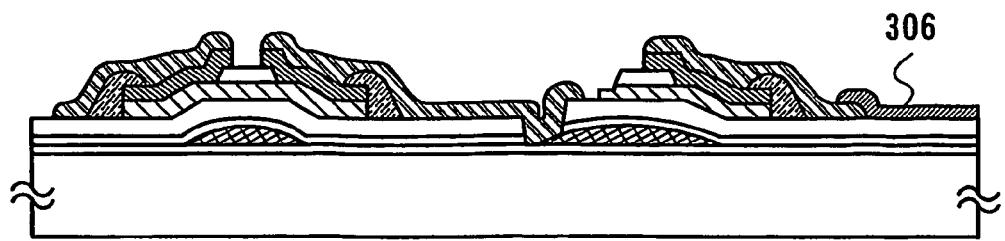
FIGS. 4A and 4B show a method for manufacturing a light emitting display device of the present invention.

Subsequently, a conductive layer (also referred to as a first electrode) 306 is formed by selectively discharging a composition including a conductive material onto the gate insulating film to be in contact with the conductive layer 317 which functions as a/the source-drain wiring layer (ref. FIG. 4A). The conductive layer 306 may be formed by forming a predetermined pattern of a composition including indium tin oxide (ITO), indium tin oxide containing silicon oxide (ITSO), zinc oxide (ZnO), tin oxide ($SnO_2$), or the like and by baking it when light is to be emitted from the substrate 300 side or when a transmissive EL display panel is to be manufactured. Although not shown, base pretreatment such as formation of a photocatalytic substance may be performed similarly to the case of forming the conductive layers 302 and 303 in a region where the conductive layer 306 is to be formed. The base pretreatment can improve adhesion and the conductive layer 306 can be formed into a desired pattern to be a thin line. The conductive layer 306 becomes the first electrode which functions as a pixel electrode.

In addition, the conductive layer 316 that is the source-drain wiring layer and the conductive layer 303 that is the gate electrode layer are electrically connected to each other in the through-hole 318 formed in the gate insulating layer 305. A composition including a particle of a metal such as Ag (silver), Au (gold), Cu (copper), W (tungsten), or Al (aluminum) as its main component can be used as a conductive material for forming the wiring layer. In addition, light-transmitting indium tin oxide (ITO), ITSO made of indium tin oxide and silicon oxide, organic indium, organic tin, zinc oxide, titanium nitride, and the like may be combined.

The step of forming the through-hole 318 in a part of the gate insulating layers 304 and 305 may be performed after forming the conductive layers 315, 316, and 317, using the conductive layers 315, 316, and 317 as a mask to form the through-hole 318. Then, a conductive layer is formed in the through-hole 318, and the conductive layer 316 and the conductive layer 303 that is the gate electrode layer are electrically connected to each other.

Figure 4B:
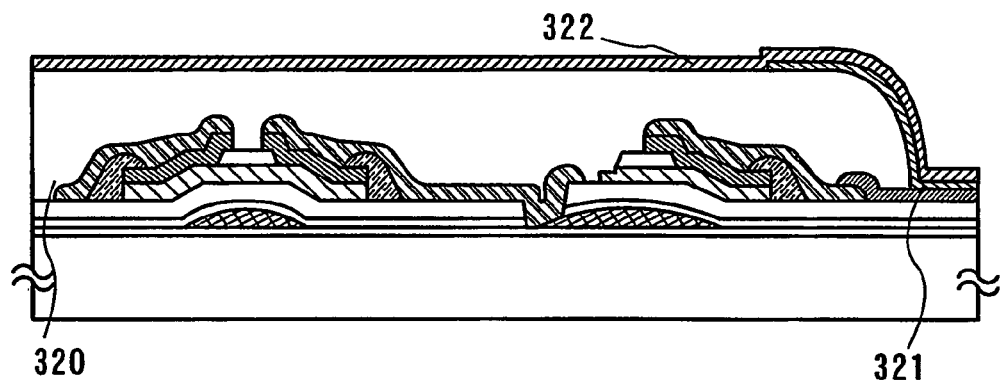

Subsequently, an insulating layer 320 to be a bank (also referred to as a partition wall) is formed. Although not shown, a protective layer made of silicon nitride or silicon nitride oxide may be entirely formed under the insulating layer 320 to cover a thin film transistor. An opening is formed in the insulating layer 320 as shown in FIG. 4B by an etching process after the insulating layer is entirely formed by a spin coating method or a dip method. The etching process is not necessarily required when the insulating layer 320 is formed by a droplet discharge method. When the insulating layer 320 or the like is formed over wide area by a droplet discharge method, it is formed by discharging a composition from a plurality of discharging openings of nozzles in a droplet discharge apparatus and by drawing so that a plurality of lines is overlapped with each other. Consequently, a throughput is improved.

The insulating layer 320 is formed to have a through-hole corresponding to a position where a pixel is to be formed in accordance with the conductive layer 306 that is the first electrode.

According to the above-mentioned steps, a TFT substrate for the EL display panel in which a bottom gate type (also referred to as an inversed staggered type) channel protective TFT and the conductive layer (first electrode layer) 306 are connected over the substrate 300 is completed.

An electroluminescent layer 321 and a conductive layer 322 are laminated over the conductive layer 306 that is the first electrode, and then, a light emitting display device having a display function using a light emitting element is completed (ref. FIG. 4B).

As described above, a step can be omitted in this embodiment mode by not applying a light exposure step utilizing a photomask. In addition, an EL display panel can be easily manufactured by directly forming various patterns over a substrate with a droplet discharge method even when a glass substrate of the fifth or the following generation having a side of more than 1000 mm is used.

In addition, a highly reliable light emitting display device in which adhesion and peel resistance are improved can be manufactured.

Embodiment Mode 5

An embodiment mode of the present invention is described with reference to FIGS. 7A to 7D and FIGS. 8A and 8B. This embodiment mode describes the case of having a different connection structure of a thin film transistor and a first electrode from that in Embodiment Mode 2. Therefore, repetitive description of the same portion or a portion having a similar function is omitted.

A base film 701 for improving adhesion is formed over a substrate 700 as base pretreatment. The case of forming $TiO_X$ crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_X$ having high photocatalytic activity. It is preferable to form $TiO_X$ while heating a film formation chamber or a substrate provided with an object to be treated.

The thus formed $TiO_X$ has a photocatalytic function even when it is a very thin film.

Further, it is preferable to form the base film 701 made of a metal material such as Ti (titanium), W (tungsten), Cr (chromium), Ta (tantalum), Ni (nickel), or Mo (molybdenum), or oxide thereof by a sputtering method, a vapor deposition method, or the like as another base pretreatment. The base film 701 may be formed to be from 0.01 nm to 10 nm in thickness. It may be formed to be very thin and need not necessarily have a layer structure. When a refractory metal material is used as the base film, it is preferable to treat a base film exposed on the surface by carrying out either of the following two steps after forming conductive layers 702 and 703 to be a gate electrode layer.

The first method is a step of insulating the base film 701 which is not overlapped with the conductive layers 702 and 703 and forming an insulating layer. In other words, the base film 701 which is not overlapped with the conductive layers 702 and 703 is oxidized and insulated. When the base film 701 is oxidized and insulated in this way, it is preferable to form the base film 701 to be from 0.01 nm to 10 nm in thickness; thus, the base film can be easily oxidized. Note that oxidization may be performed by exposing to an oxygen atmosphere or heat-treating.

The second method is a step of removing the base film 701 by etching using the conductive layers 702 and 703 as a mask. When the step is employed, there is no limitation on a thickness of the base film 701.

Alternatively, a method for performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1\times10^{10}$ $m^{-3}$ to $1\times10^{14}$ $m^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

Subsequently, a composition including a conductive material is discharged, and conductive layers 702 and 703 to function as a gate electrode later are formed. The conductive layers 702 and 703 are formed by using a droplet discharge means. Silver is used as the conductive material in this embodiment mode; however, a laminate of silver and copper or the like may be used. In addition, a single layer of copper may be used.

The above-mentioned step of forming the base film 701 is performed as base pretreatment for the conductive layer to be formed by using a droplet discharge method; however, the treatment step may be performed after the conductive layer is formed.

Figure 7A:
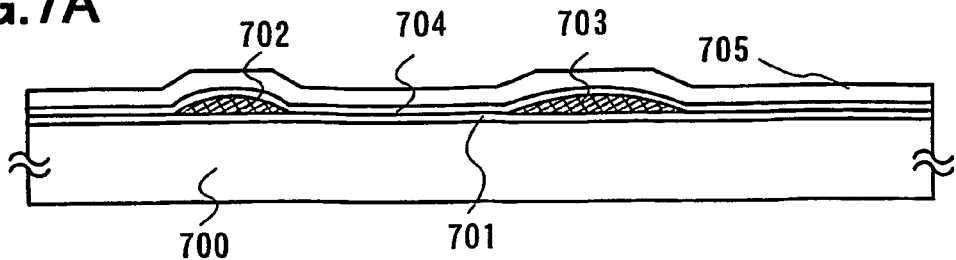
FIGS. 7A to 7D show a method for manufacturing a light emitting display device of the present invention.

Subsequently, a gate insulating film is formed over the conductive layers 702 and 703 (ref. FIG. 7A). The gate insulating film may be made of a known material such as an oxide or nitride material of silicon, and may be a laminated layer or a single layer.

The semiconductor layer may be formed by a known method (a sputtering method, an LPCVD method, a plasma CVD method, or the like). There is no particular limitation on materials of the semiconductor layer, but the semiconductor layer is preferably made of silicon, a silicon germanium (SiGe) alloy, or the like.

An amorphous semiconductor (typically, hydrogenated amorphous silicon), a semi-amorphous semiconductor, a semiconductor including a crystal phase in a part of the semiconductor layer, a crystalline semiconductor (typically, polysilicon), or an organic semiconductor can be used as the semiconductor layer.

An amorphous semiconductor is used as the semiconductor in this embodiment mode. A semiconductor layer 707 is formed, and a semiconductor layer having one conductivity, for example, an N type semiconductor layer 708 is formed by a plasma CVD method or the like. The semiconductor layer having one conductivity may be formed if necessary.

Figure 7B:
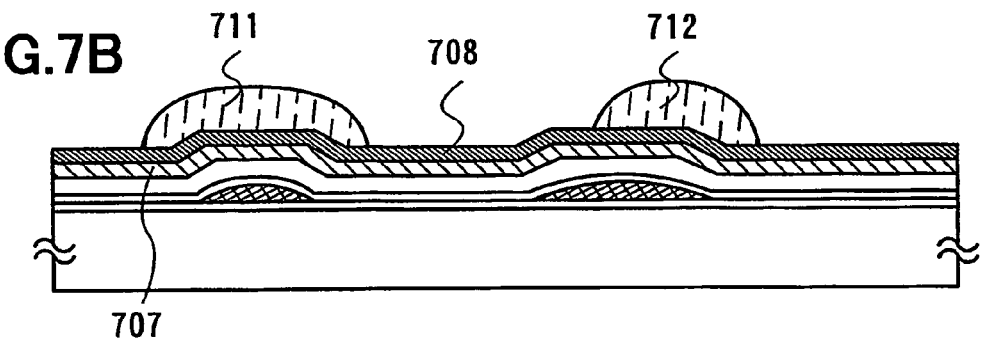

Subsequently, mask layers 711 and 712 made of an insulating material such as a resist or polyimide are formed, and the semiconductor layer 707 and the N type semiconductor layer 708 are simultaneously patterned using the mask layers 711 and 712 (ref. FIG. 7B).

Figure 7C:
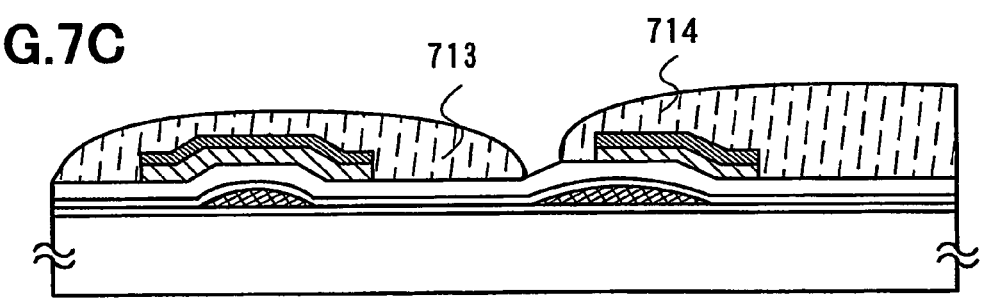

Then, mask layers 713 and 714 made of an insulating material such as a resist or polyimide are formed by using a droplet discharge method (ref. FIG. 7C). A through-hole 718 is formed in a part of the gate insulating layers 704 and 705 by an etching process using the mask layers 713 and 714, and a part of the conductive layer 703 disposed on a lower layer side thereof and to function as a gate electrode layer is exposed. Either plasma etching (dry etching) or wet etching may be adopted as the etching process. However, plasma etching is suitable to process a large-sized substrate. In addition, a local discharge process can be performed when an atmospheric pressure discharge etching process is applied, and a mask layer need not be entirely formed over the substrate.

Figure 7D:
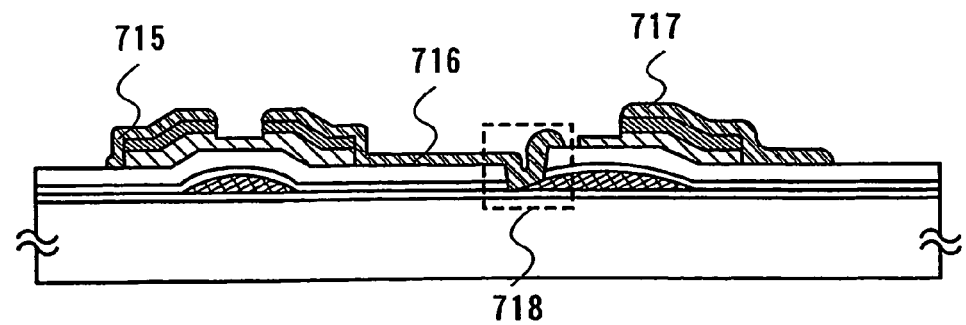

Conductive layers 715, 716, and 717 are formed by discharging a composition including a conductive material after the mask layers 713 and 714 are removed. Then, the N type semiconductor layer is patterned using the conductive layers 715, 716, and 717 (ref. FIG. 7D). Note that the above-mentioned base pretreatment of selectively forming a photocatalytic substance or the like in a portion where the conductive layers 715, 716, and 717 are to be in contact with the gate insulating layer 705 may be performed before forming the conductive layers 715, 716, and 717, although not shown. In addition, base pretreatment may be performed on the surface also after the formation. According to this step, the conductive layer can be formed with favorable adhesion with a lower layer thereof and an upper layer to be laminated.

Figure 8A:
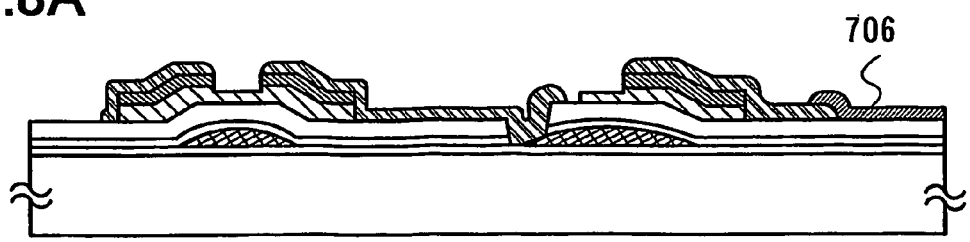
FIGS. 8A and 8B show a method for manufacturing a light emitting display device of the present invention.

Subsequently, a conductive layer (also referred to as a first electrode) 706 is formed by selectively discharging a composition including a conductive material onto the gate insulating film to be in contact with the conductive layer 717 which functions as a/the source-drain wiring layer (ref. FIG. 8A). The conductive layer 706 may be formed by forming a predetermined pattern of a composition including indium tin oxide (ITO), indium tin oxide containing silicon oxide (SO), zinc oxide (ZnO), tin oxide ($SnO_2$), or the like and by baking it when light is to be emitted from the substrate 700 side or when a transmissive EL display panel is to be manufactured. Although not shown, base pretreatment such as formation of a photocatalytic substance may be performed similarly to the case of forming the conductive layers 702 and 703 in a region where the conductive layer 706 is to be formed. The base pretreatment can improve adhesion and the conductive layer 706 can be formed into a desired pattern to be a thin line. The conductive layer 706 becomes the first electrode which functions as a pixel electrode.

In addition, the conductive layer 716 that is the source-drain wiring layer and the conductive layer 703 that is the gate electrode layer are electrically connected to each other in the through-hole 718 formed in the gate insulating layer 705. A composition including a particle of a metal such as Ag (silver), Au (gold), Cu (copper), W (tungsten), or Al (aluminum) as its main component can be used as a conductive material for forming the conductive layer. In addition, light-transmitting indium tin oxide (ITO), ITSO made of indium tin oxide and silicon oxide, organic indium, organic tin, zinc oxide, titanium nitride, and the like may be combined.

The step of forming the through-hole 718 in a part of the gate insulating layers 704 and 705 may be performed after forming the conductive layers 715, 716, and 717, using the conductive layers 715, 716, and 717 as a mask to form the through-hole 718. Then, a conductive layer is formed in the through-hole 718, and the conductive layer 716 and the conductive layer 703 that is the gate electrode layer are electrically connected to each other.

Figure 8B:
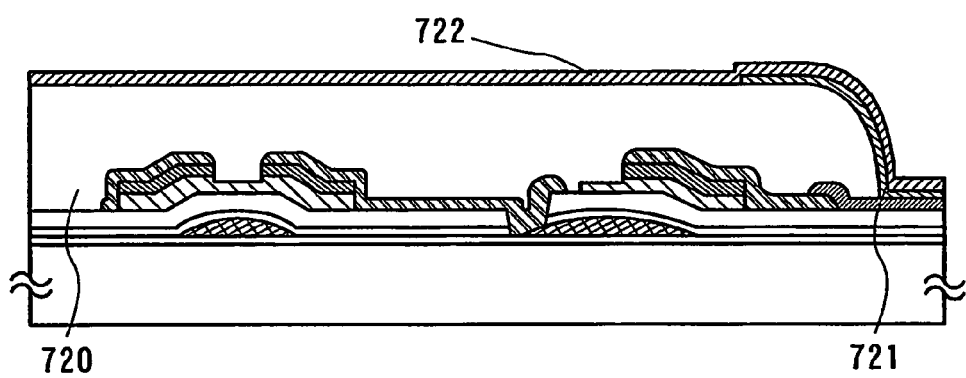

Subsequently, an insulating layer 720 to be a bank (also referred to as a partition wall) is formed. Although not shown, a protective layer made of silicon nitride or silicon nitride oxide may be entirely formed under the insulating layer 720 to cover a thin film transistor. An opening is formed in the insulating layer 720 as shown in FIG. 8B by an etching process after the insulating film is entirely formed by a spin coating method or a dip method. The etching process is not necessarily required when the insulating layer 720 is formed by a droplet discharge method. When the insulating layer 720 or the like is formed over wide area by a droplet discharge method, it is formed by discharging a composition from a plurality of discharging openings of nozzles in a droplet discharge apparatus and by drawing so that a plurality of lines is overlapped with each other. Consequently, a throughput is improved.

The insulating layer 720 is formed to have a through-hole corresponding to a position where a pixel is to be formed in accordance with the conductive layer 706 that is the first electrode.

According to the above-mentioned steps, a TFT substrate for the EL display panel in which a bottom gate type (also referred to as an inversed staggered type) channel etch TFT and the first electrode (first electrode layer) 706 are connected over the substrate 700 is completed.

An electroluminescent layer 721 and a conductive layer 722 are laminated over the conductive layer 706 that is the first electrode, and then, a light emitting display device having a display function using a light emitting element is completed (ref. FIG. 8B).

As described above, a step can be omitted in this embodiment mode by not applying a light exposure step utilizing a photomask. In addition, an EL display panel can be easily manufactured by directly forming various patterns over a substrate with a droplet discharge method even when a glass substrate of the fifth or the following generation having a side of more than 1000 mm is used.

In addition, a highly reliable light emitting display device in which adhesion and peel resistance are improved can be manufactured.

Embodiment Mode 6

An embodiment mode of the present invention is described with reference to FIGS. 11A to 11D and FIG. 12. This embodiment mode describes the case of having a different connection structure of a thin film transistor and a first electrode from that in Embodiment Mode 3. Therefore, repetitive description of the same portion or a portion having a similar function is omitted.

Figure 11A:
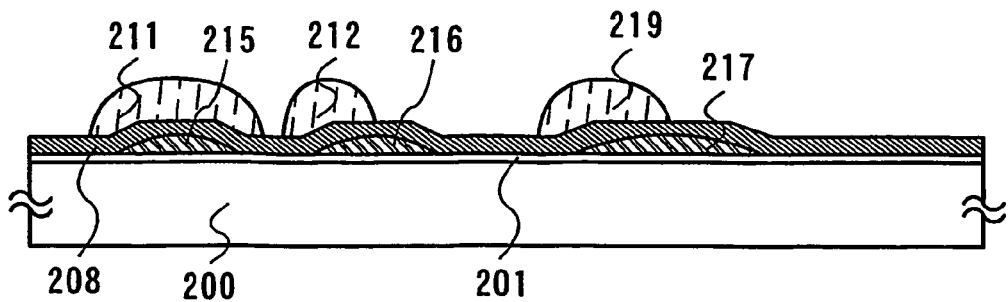
FIGS. 11A to 11D show a method for manufacturing a light emitting display device of the present invention.

A base film 201 having a function of improving adhesion is formed over a substrate 200 (ref. FIG. 11A). Note that an insulating layer may be formed over the substrate 200. The insulating layer may not necessarily be formed, but it is effective in blocking a contaminant or the like from the substrate 200. A base film is effective particularly in the case of a staggered type thin film transistor as in this embodiment mode since a semiconductor layer is directly in contact with the substrate. In the case of forming the insulating layer to prevent contamination from a glass substrate, the base film 201 is formed as a base film in a formation region of conductive layers 202 and 203 to be formed thereover by a droplet discharge method.

In this embodiment mode, a substance having a photocatalytic function is used as a base film 201 having a function of improving adhesion.

The case of forming $TiO_X$ crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_X$ having high photocatalytic activity. It is preferable to form $TiO_X$ while heating a film formation chamber or a substrate provided with an object to be treated.

The thus formed $TiO_X$ has a photocatalytic function even when it is a very thin film.

Further, it is preferable to form the base film 201 made of a metal material such as Ti (titanium), W (tungsten), Cr (chromium), Ta (tantalum), Ni (nickel), or Mo (molybdenum), or oxide thereof by a sputtering method, a vapor deposition method, or the like as another base pretreatment. The base film 201 may be formed to be from 0.01 nm to 10 nm in thickness. It may be formed to be very thin and need not necessarily have a layer structure. When a refractory metal material is used as the base film, it is preferable to treat a base film exposed on the surface by carrying out either of the following two steps after forming the conductive layers 215, 216, and 217 to function as a source-drain wiring layer.

The first method is a step of insulating the base film 201 which is not overlapped with the conductive layers 215, 216, and 217 that function as a source-drain wiring layer and forming an insulating layer. In other words, the base film 201 which is not overlapped with the conductive layers 215, 216, and 217 that function as a source-drain wiring layer is oxidized and insulated. When the base film 201 is oxidized and insulated in this way, it is preferable to form the base film 201 to be from 0.01 nm to 10 nm in thickness; thus, the base film can be easily oxidized. Note that oxidization may be performed by exposing to an oxygen atmosphere or heat-treating.

The second method is a step of removing the base film 201 by etching using the conductive layers 215, 216, and 217 that function as a source-drain wiring layer as a mask. When the step is employed, there is no limitation on a thickness of the base film 201.

Alternatively, a method for performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1\times10^{10}$ m$^{-3}$ to $1\times10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

Subsequently, a composition including a conductive material is discharged, and conductive layers 215, 216, and 217 to function as a source-drain wiring layer are formed. The conductive layers 215, 216, and 217 are formed by using a droplet discharge means.

A composition including a particle of a metal such as Ag (silver), Au (gold), Cu (copper), W (tungsten), or Al (aluminum) as its main component can be used as a conductive material for forming the conductive layers 245, 216, and 217. Since the source-drain wiring layer is preferably made low resistant, it is preferable to use any material selected from gold, silver, and copper, which is dissolved or dispersed in a solvent, taking a specific resistance value into consideration. It is more preferable to use silver or copper having a low resistance value. In addition, a particle in which a conductive material is coated with other conductive materials to be a plurality of layers may be used. For example, a three-layer structure particle in which copper is coated with nickel boron (NiB), and then, coated with silver may be used. The solvent corresponds to esters such as butyl acetate, alcohols such as isopropyl alcohol, an organic solvent such as acetone, or the like. Surface tension and viscosity thereof are appropriately adjusted by adjusting concentration of the solvent or by adding a surfactant or the like.

In addition, the above-mentioned step of forming the base film 201 is performed as base pretreatment for the conductive layer to be formed by using a droplet discharge method; however, the treatment step may be performed after the conductive layers 215, 216, and 217 are formed. For example, when a titanium oxide film is formed and an N type semiconductor layer is formed thereover, adhesion between the conductive layer and the N type semiconductor layer is improved, although not shown.

After the N type semiconductor layer is entirely formed over the conductive layers 215, 216, and 217, the N type layers between the conductive layer 215 and the conductive layer 216 and between the conductive layer 216 and the conductive layer 217 are removed by etching using mask layers 211, 212, and 219 made of an insulating material such as a resist or polyimide. A semiconductor layer having one conductivity may be formed if necessary. Then, a semiconductor layer 207 made of an AS or a SAS is formed by a vapor phase growth method or a sputtering method. When a plasma CVD method is employed, an AS is formed by using SiH$_4$ that is a semiconductor material gas or a mixture gas of SiH$_4$ and H$_2$. A SAS is formed from a mixture gas in which SiH$_4$ is diluted with H$_2$ by from 3 times to 1000 times. When the SAS is formed from the above gas, the semiconductor layer has favorable crystallinity on a surface side of the semiconductor layer. It is suitable for a top gate type TFT in which the gate electrode is formed in an upper layer of the semiconductor layer.

Figure 11B:
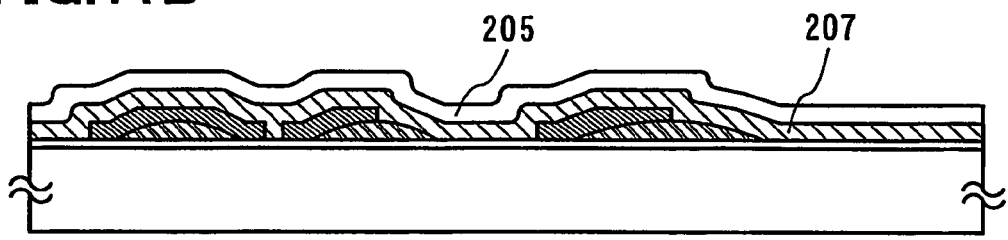

Subsequently, a gate insulating layer 205 is formed to be a single layer or to have a laminated structure by using a plasma CVD method or a sputtering method (ref. FIG. 11B). A laminate of three layers of an insulating layer made of silicon nitride, an insulating layer made of silicon oxide, and an insulating layer made of silicon nitride is a particularly preferable structure.

Figure 11C:
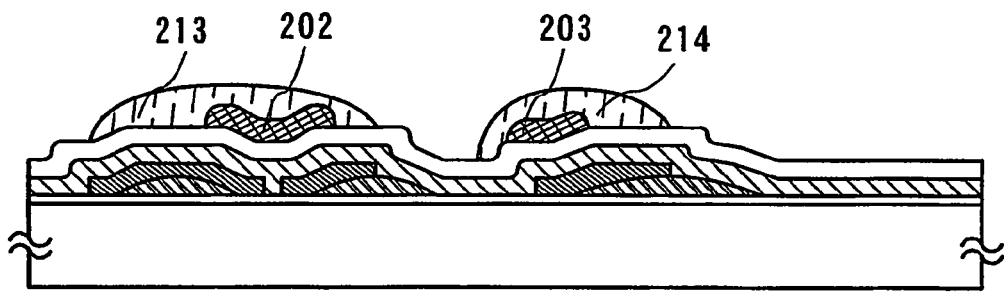
Figure 11D:
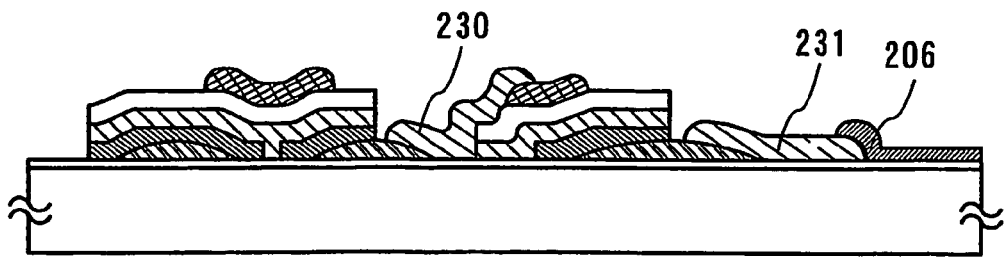

Next, conductive layers 202 and 203 that are gate electrode layers are formed by a droplet discharge method (ref. FIG. 11C). A composition including a particle of a metal such as Ag (silver), Au (gold), Cu (copper), W (tungsten), or Al (aluminum) as its main component can be used as a conductive material for forming the layer.

The semiconductor layer 207 and the gate insulating layer 205 are formed in a position corresponding to the source-drain wiring layer (the conductive layers 215, 216, and 217) using the mask layers 213 and 214 formed by a droplet discharge method. In other words, the semiconductor layer is formed to straddle the conductive layers 215 and 216 that are the source-drain wiring layers.

Subsequently, conductive layers 230 and 231 are formed by a droplet discharge method. The conductive layer 216 and the conductive layer 203 are electrically connected to each other.

Thereafter, a conductive layer (also referred to as a first electrode) 206 is formed to be in contact with the conductive layer 231 by selectively discharging a composition including a conductive material. In addition, the conductive layer 206 may be directly in contact with the conductive layer 217. The conductive layer 206 may be formed by forming a predetermined pattern of a composition including indium tin oxide (ITO), indium tin oxide containing silicon oxide (ITSO), zinc oxide (ZnO), tin oxide ($SnO_2$), or the like and by baking it when light is to be emitted from the substrate 200 side or when a transmissive EL display panel is to be manufactured. Although not shown, a photocatalytic substance may be formed similarly to the case of forming the conductive layers 215, 216, and 217 in a region where the conductive layer 206 is to be formed. The photocatalytic substance can improve adhesion and the conductive layer 206 can be formed into a desired pattern to be a thin line. The conductive layer 206 becomes the first electrode which functions as a pixel electrode.

The source-drain wiring layer and the gate electrode layer may be directly connected by the gate electrode layer without using the conductive layer 230. In that case, a through-hole is formed in the gate insulating layer 205 and a part of the conductive layers 216 and 217 that are the source-drain wirings is exposed before the conductive layers 202 and 203 that are the gate electrode layers are formed. Thereafter, the conductive layers 202 and 203 that are the gate electrode layers and the conductive layer 231 are formed by a droplet discharge method. At this time, the conductive layer 203 is a wiring which also serves as the conductive layer 230, and is connected to the conductive layer 216. Either dry etching or wet etching is employed for etching; however, plasma etching that is dry etching is preferable.

Figure 12:
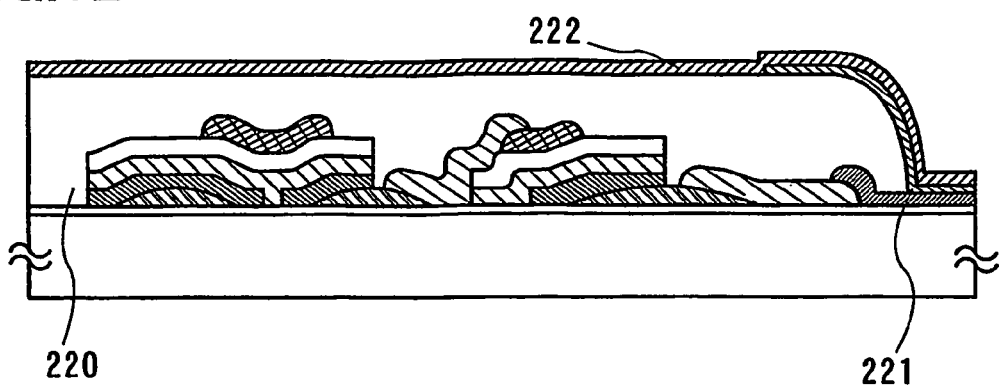
FIG. 12 shows a method for manufacturing a light emitting display device of the present invention.

Subsequently, an insulating layer 220 to be a bank (also referred to as a partition wall) is formed. Although not shown, a protective layer made of silicon nitride or silicon nitride oxide may be entirely formed under the insulating layer 220 to cover a thin film transistor. An opening is formed in the insulating layer 220 as shown in FIG. 12 by an etching process after the insulating film is entirely formed by a spin coating method or a dip method. The etching process is not necessarily required when the insulating layer 220 is formed by a droplet discharge method. When the insulating layer 220 or the like is formed over wide area by a droplet discharge method, it is formed by discharging a composition from a plurality of discharging openings of nozzles in a droplet discharge apparatus and by drawing so that a plurality of lines is overlapped with each other. Consequently, a throughput is improved.

The insulating layer 220 is formed to have a through-hole corresponding to a position where a pixel is to be formed in accordance with the conductive layer 206 that is the first electrode.

According to the above-mentioned steps, a TFT substrate in which a top gate type (also referred to as a staggered type) TFT and the conductive layer (first electrode layer) 206 are connected over the substrate 200 is completed.

Moisture adsorbed inside the insulating layer 220 or to a surface thereof is removed by performing heat treatment at 200° C. under atmospheric pressure before forming an electroluminescent layer 221. In addition, heat treatment is performed at a temperature of from 200° C. to 400° C., preferably, from 250° C. to 350° C. under reduced pressure, and the electroluminescent layer 221 is preferably formed by a vacuum vapor deposition method or a droplet discharge method under reduced pressure without being exposed to atmospheric air.

An electroluminescent layer 221 and a conductive layer 222 are laminated over the conductive layer 206 that is the first electrode, and then, a light emitting display device having a display function using a light emitting element is completed (ref. FIG. 12).

As described above, a step can be omitted in this embodiment mode by not applying a light exposure step utilizing a photomask. In addition, an EL display panel can be easily manufactured by directly forming various patterns over a substrate with a droplet discharge method even when a glass substrate of the fifth or the following generation having a side of more than 1000 mm is used.

In addition, a highly reliable light emitting display device in which adhesion and peel resistance are improved can be manufactured.

Embodiment Mode 7

An embodiment mode of the present invention is described with reference to FIGS. 14A to 14D and FIGS. 15A and 15B. This embodiment mode describes the case of having a different connection structure of a conductive layer 116 which penetrates a gate insulating layer 105 and which is a wiring layer and a conductive layer 103 which is a gate electrode layer, from that in Embodiment Mode 1. Therefore, repetitive description of the same portion or a portion having a similar function is omitted.

Figure 14A:
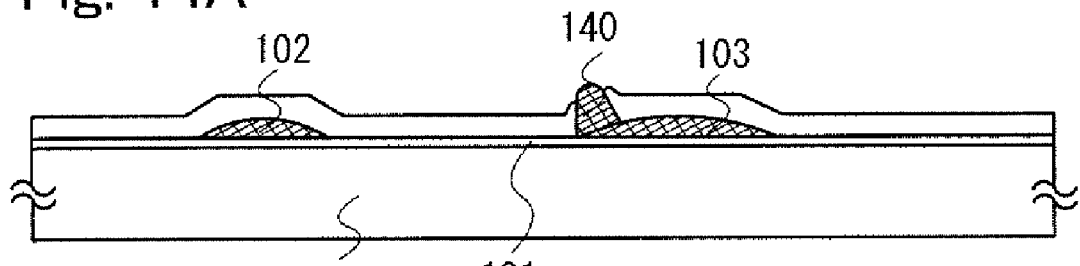
FIGS. 14A to 14D show a method for manufacturing a light emitting display device of the present invention.

A base film 101 for improving adhesion is formed over a substrate 100 (ref. FIG. 14A). Note that an insulating layer may be formed over the substrate 100.

In this embodiment mode, a substance having a photocatalytic function is used as a base film 101 having a function of improving adhesion.

The case of forming $TiO_X$ crystal having a predetermined crystal structure by a sputtering method as a photocatalytic substance is described in this embodiment mode. Sputtering is performed using a metal titanium tube as a target and using an argon gas and oxygen. Further, a He gas may be introduced. The atmosphere is made to include much oxygen and formation pressure is set high to form $TiO_X$ having high photocatalytic activity. It is preferable to form $TiO_X$ while heating a film formation chamber or a substrate provided with an object to be treated.

The thus formed $TiO_X$ has a photocatalytic function even when it is a very thin film.

Further, it is preferable to form the base film 101 made of a metal material such as Ti (titanium), W (tungsten), Cr (chromium), Ta (tantalum), Ni (nickel), or Mo (molybdenum), or oxide thereof by a sputtering method, a vapor deposition method, or the like as another base pretreatment. The base film 101 may be formed to be from 0.01 nm to 10 nm in thickness. It may be formed to be very thin and need not necessarily have a layer structure. When a refractory metal material is used as the base film, it is preferable to treat a base film exposed on the surface by carrying out either of the following two steps after forming the conductive layers 102 and 103 to function as a source-drain wiring layer.

The first method is a step of insulating the base film 101 which is not overlapped with the conductive layers 102 and 103 and forming an insulating layer. In other words, the base film 101 which is not overlapped with the conductive layers 102 and 103 is oxidized and insulated. When the base film 101 is oxidized and insulated in this way, it is preferable to form the base film 101 to be from 0.01 nm to 10 nm in thickness; thus, the base film can be easily oxidized. Note that oxidization may be performed by exposing to an oxygen atmosphere or heat-treating.

The second method is a step of removing the base film 101 by performing etching using the conductive layers 102 and 103 as a mask. When the step is applied, there is no limitation on a thickness of the base film 101.

Alternatively, a method for performing plasma treatment on a formation region (formation face) can be employed as another base pretreatment. The plasma treatment is performed with air, oxygen, or nitrogen used as a treatment gas, with pressure from several tens of Torr to 1000 Torr (133000 Pa), preferably, from 100 Torr (13300 Pa) to 1000 Torr (133000 Pa), more preferably, from 700 Torr (93100 Pa) to 800 Torr (106400 Pa), that is, atmospheric pressure or pressure in proximity of atmospheric pressure, and a pulse voltage is applied under such conditions. At this time, plasma density is set from $1 \times 10^{10}$ m$^{-3}$ to $1 \times 10^{14}$ m$^{-3}$, so-called corona discharge or glow discharge. Surface modification can be performed without material dependence by employing plasma treatment using air, oxygen, or nitrogen as a treatment gas. Accordingly, surface modification can be performed on any material.

As another method, a substance of an organic material functioning as an adhesive may be formed to improve adhesion of a pattern to be formed by a droplet discharge method with a formation region thereof. An organic material (organic resin material) (polyimide or acrylic) or a material in which a skeletal structure is configured by a bond of silicon (Si) and oxygen (O) and which contains at least hydrogen as a substituent or which contains at least one of fluorine, an alkyl group, and aromatic hydrocarbon as a substituent may be used.

Subsequently, a composition including a conductive material is discharged, and conductive layers 102 and 103 to function as a gate electrode later are formed. The conductive layers 102 and 103 are formed by using a droplet discharge means.

A conductive material 140 which functions as a pillar is formed by locally discharging a composition including a conductive material after the conductive layer 103 is formed. The conductive material 140 is preferably formed to be cylindrical by depositing the discharged composition. This is because a pattern in a lower layer and a pattern in an upper layer easily make contact with each other when the cylindrical conductive material 140 is used. The conductive material 140 may be made of the same material as that of the conductive layer 103 or be made of a different material. It may be formed by discharging the composition in piles.

After the conductive layer 103 is formed, the above-described base pretreatment may be performed on the conductive layer 103 to improve adhesion again. Further, it is preferable to perform base pretreatment similarly, after the conductive material 140 to be a pillar is formed. Layers can have favorable adhesion when base pretreatment such as formation of a photocatalytic substance like TiO$_X$ is performed.

Subsequently, a gate insulating film is formed over the conductive layers 102 and 103 (ref. FIG. 14A)

Figure 14B:
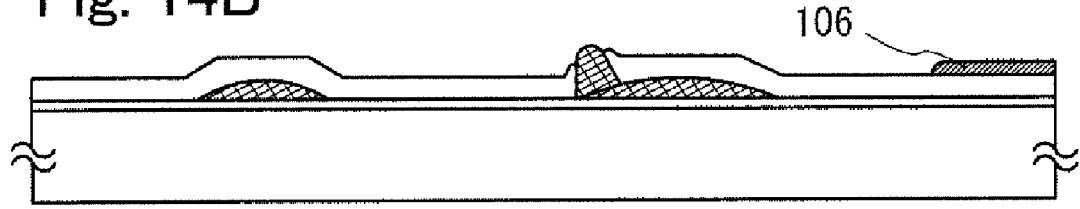

Then, a conductive layer (also referred to as a first electrode) 106 is formed by selectively discharging a composition including a conductive material onto the gate insulating film (ref. FIG. 14B). Although not shown, a photocatalytic substance may be formed similarly to the case of forming the conductive layers 102 and 103 in a region where the conductive layer 106 is to be formed. The photocatalytic substance can improve adhesion and the conductive layer 106 can be formed into a desired pattern to be a thin line. The conductive layer 106 becomes the first electrode to function as a pixel electrode.

Figure 14C:
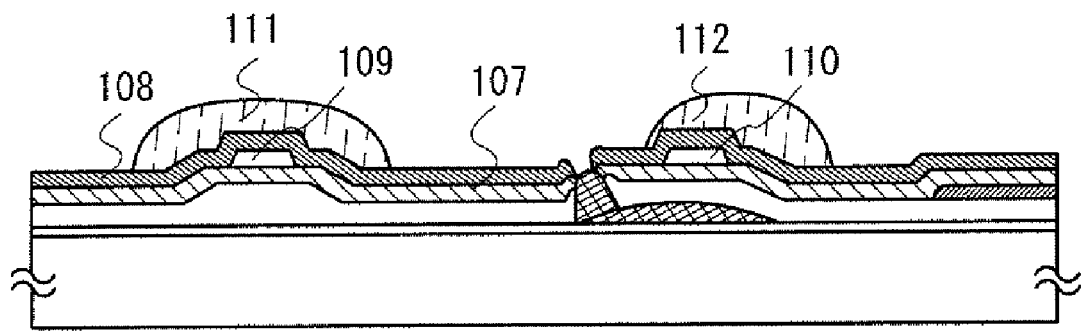
Figure 14D:
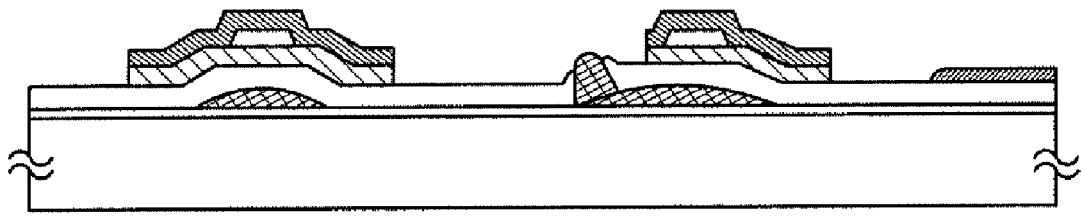

An amorphous semiconductor is used as the semiconductor in this embodiment mode. A semiconductor layer 107 that is an amorphous semiconductor layer is formed, and an insulating film is formed by, for example, a plasma CVD method and is patterned to have a desired shape in a desired region in order to form channel protective films 109 and 110. At this time, the channel protective films 109 and 110 can be formed by exposing a back of the substrate to light using the gate electrode as a mask. In addition, polyimide, polyvinyl alcohol, or the like may be dropped as the channel protective film by a droplet discharge method. Consequently, a light-exposure step can be omitted. Thereafter, a semiconductor layer having one conductivity, for example, an N type semiconductor layer 108 using an N type amorphous semiconductor layer is formed by a plasma CVD method or the like (ref. FIG. 14C). The semiconductor layer having one conductivity may be formed if necessary.

Subsequently, mask layers 111 and 112 made of an insulating material such as a resist or polyimide are formed, and the semiconductor layer 107 and the N type, semiconductor layer 108 are simultaneously patterned using the mask layers 111 and 112.

In this embodiment mode, a conductive material to be connected to the conductive layer 103 which is a gate electrode layer by the conductive material 140 which functions as a pillar penetrates the gate electrode layer 105 and exists on the gate insulating layer 105. Therefore, a step of opening a through-hole in the gate insulating layer can be omitted.

Conductive layers 115, 116, and 117 are formed by discharging a composition including a conductive material. Then, the N type semiconductor is patterned using the conductive layers 115, 116, and 117 as a mask. Note that a photocatalytic substance may be selectively formed in a portion where the conductive layers 115, 116, and 117 are to be in contact with the gate insulating layer 105 before forming the conductive layers 115, 116, and 117, although not shown. Accordingly, the conductive layer can be formed with favorable adhesion.

Figure 15A:
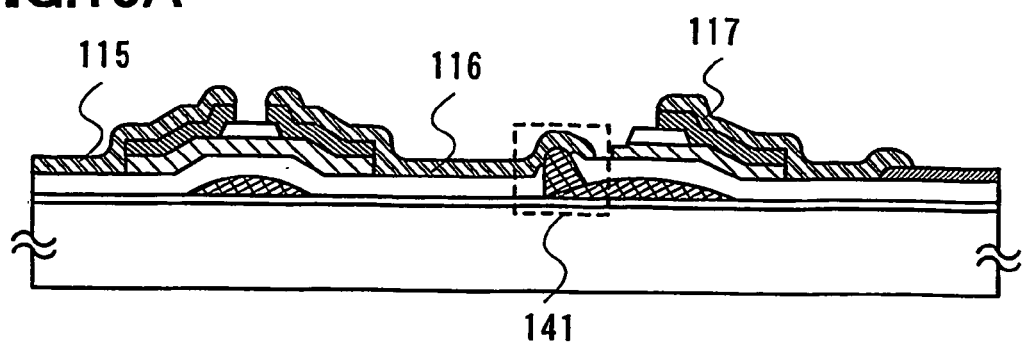
FIGS. 15A and 15B show a method for manufacturing a light emitting display device of the present invention.

The conductive layer 117 functions as a source-drain wiring layer and is formed to electrically connect with the first electrode formed beforehand. The conductive layer 116 which is a source-drain wiring layer can be electrically connected to the conductive layer 103 which is the gate electrode layer through the conductive material 140 (ref. FIG. 15A). When the insulating layer or the like is left over the conductive material 140 which functions as a pillar, it may be removed by etching or the like.

Subsequently, an insulating layer 120 to be a bank (also referred to as a partition wall) is formed.

The insulating layer 120 is formed to have a through-hole corresponding to a position where a pixel is to be formed in accordance with the conductive layer 106 that is the first electrode.

According to the above-mentioned steps, a TFT substrate for the EL display panel in which a bottom gate type (also referred to as an inversed staggered type) channel protective TFT and the first electrode (first electrode layer) are connected over the substrate 100 is completed.

Figure 15B:
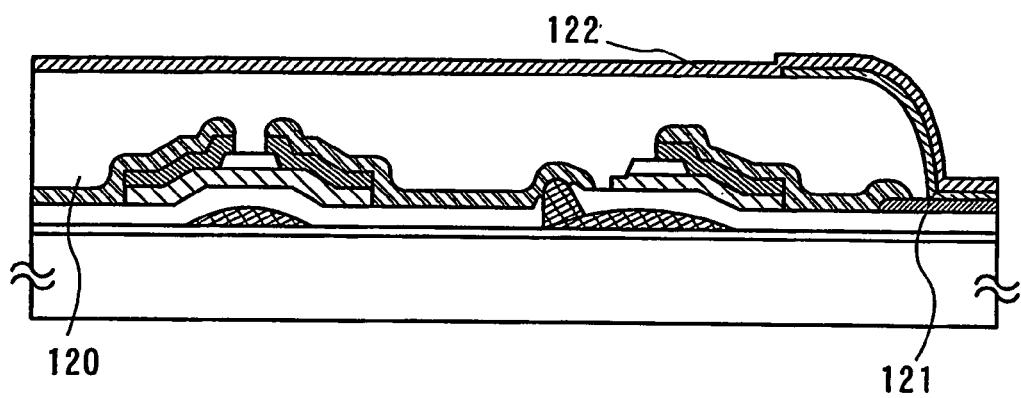

An electroluminescent layer 121 and a conductive layer 122 are laminated over the conductive layer 106 that is the first electrode, and then, a light emitting display device having a display function using a light emitting element is completed (ref. FIG. 15B).

As described above, a step can be omitted in this embodiment mode by not applying a light exposure step utilizing a photomask. In addition, an EL display panel can be easily manufactured by directly forming various patterns over a substrate with a droplet discharge method even when a glass substrate of the fifth or the following generation having a side of more than 1000 min is used.

In addition, a highly reliable light emitting display device in which adhesion and peel resistance are improved can be manufactured. A connection method of using a pillar instead of forming a through-hole in this embodiment mode can be freely combined with the above embodiment mode.

Embodiment 1

A thin film transistor can be formed by applying the present invention, and a light emitting display device can be formed by using the thin film transistor. In the case of using a light emitting element as a display element and using an N type transistor as a transistor for driving the light emitting element, light emission from the light emitting element is any one of bottom emission, top emission, and dual emission. Here, a laminated structure of a light emitting element for any case is described with reference to FIGS. 17A to 17C.

A transistor 451 that is a channel protective thin film transistor formed in Embodiment Mode 1 by applying the present invention is used in this embodiment.

First, the case of emitting light to a substrate 450 side, that is, the case of bottom emission is described with reference to FIG. 17A. In this case, source-drain wirings 452 and 453, a first electrode 454, an electroluminescent layer 455, and a second electrode 456, which are to be electrically connected to a transistor 451, are sequentially laminated. Next, the case of emitting light to an opposite side of a substrate 450, that is, the case of top emission is described with reference to FIG. 17B. Source-drain wirings 461 and 462, a first electrode 463, an electroluminescent layer 464, and a second electrode 465, which are to be electrically connected to a transistor 451, are sequentially laminated. Even if the first electrode 463 transmits light, the light is reflected by the wiring 462 and emitted to the opposite side of the substrate 450 according to the above structure. Note that a light-transmitting material need not be used for the first electrode 463 in this structure. Lastly, the case of emitting light to a substrate 450 side and to an opposite side thereof, that is, the case of dual emission is described with reference to FIG. 17C. Source-drain wirings 470 and 471, a first electrode 472, an electroluminescent layer 473, and a second electrode 474, which are to be electrically connected to a transistor 451, are sequentially laminated. At this time, dual emission is realized when both the first electrode 472 and the second electrode 474 are made of a light-transmitting material or are formed to have a thickness that can transmit light.

The light emitting element has a structure in which the electroluminescent layer is sandwiched between the first electrode and the second electrode. It is necessary to select materials of the first electrode and the second electrode in consideration of a work function. Both the first electrode and the second electrode can be an anode or a cathode depending on a pixel structure. Since polarity of a driving TFT is an N channel type in this embodiment mode, the first electrode is preferably a cathode and the second electrode is preferably an anode. When polarity of the driving TFT is a P channel type, the first electrode is preferably an anode and the second electrode is preferably a cathode.

When the first electrode is an anode, the electroluminescent layer is preferably formed by sequentially laminating an HTL (hole injection layer), an HTL (hole transport layer), an EML (emission layer), an ETL (electron transport layer), and an EIL (electron injection layer) from an anode side. When the first electrode is a cathode, a structure of the electroluminescent layer becomes the reverse. It is preferable to sequentially laminate an EIL (electron injection layer), an ETL (electron transport layer), an EML (emission layer), an HTL (hole transport layer), an HIL (hole injection layer), and an anode that is the second electrode from a cathode side. Note that the electroluminescent layer can have a single layer structure or a combined structure as well as a laminated structure.

Materials showing luminescence of red (R), green (G), and blue (B) may be selectively formed as the electroluminescent layer by a vapor deposition method using respective vapor deposition masks or the like. The materials showing luminescence of red (R), green (G), and blue (B) (such as a low molecular weight or high molecular weight material) can be formed by a droplet discharge method, which is preferable since coloring of RGB can be separately performed in this case without using a mask similarly to a color filter.

Specifically, CuPc or PEDOT is used as the HIL; α-NPD, as the HTL; BCP or Alq$_3$, as the ETL; BCP:Li or CaF$_2$, as the EIL, respectively. In addition, Alq$_3$ doped with a dopant corresponding to respective luminescence colors of R, G, and B (DCM or the like in the case of R, and DMQD or the like in the case of G) may be used as the EMI, for example.

Note that the electroluminescent layer is not limited to the above material. For example, a hole injection property can be enhanced by co-evaporating oxide such as molybdenum oxide (MoO$_x$; X=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer.

Figure 17A:
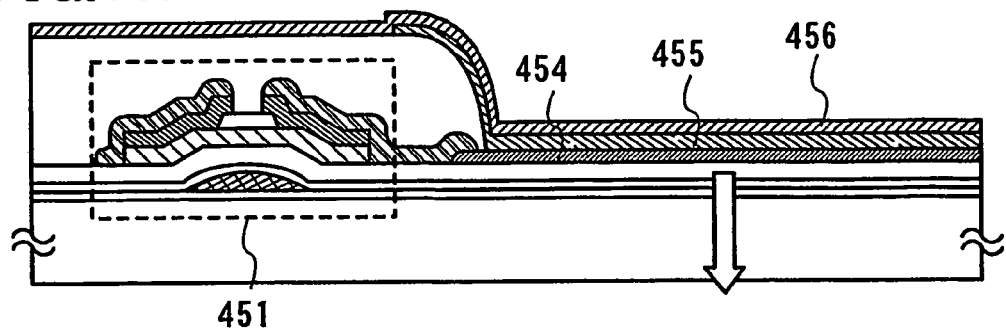
FIGS. 17A to 17C show a light emitting display device of the present invention.
Figure 17B:
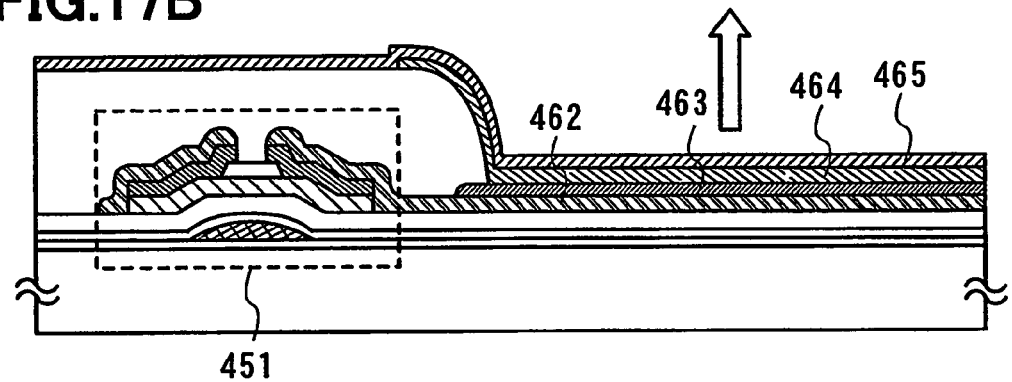
Figure 17C:
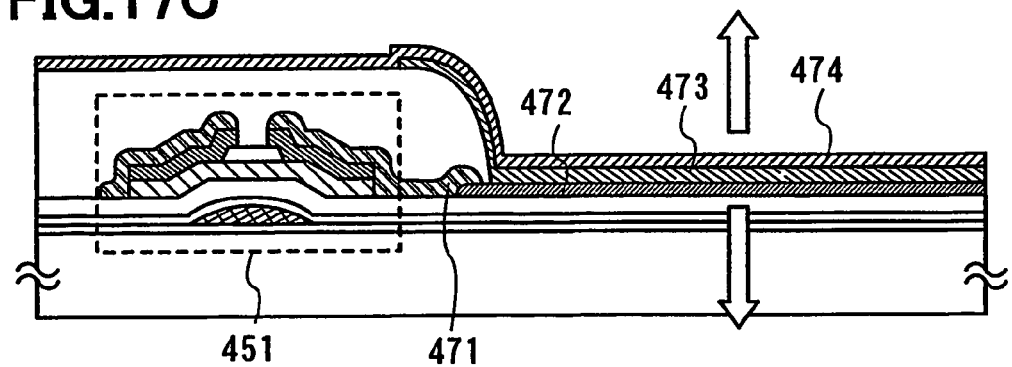

In addition, a color filter may be formed on an opposing substrate of the substrate 450, although not shown in FIGS. 17A to 17C. The color filter can be formed by a droplet discharge method; in that case, photoplasma treatment can be performed as the above-described base pretreatment. The color filter can be formed in a desired pattern with favorable adhesion due to the base film of the present invention. High-definition display can be performed by using the color filter. This is because the color filter can adjust a broad peak to sharp one in each emission spectrum of RGB.

The case of forming materials showing each luminescence of RGB is described hereinabove; however, full color display can be performed also by forming a material showing luminescence of single color and combining the material with a color filter or a color conversion layer. For example, in the case of forming an electroluminescent layer showing white or orange luminescence, full color display can be performed by separately providing a color filter, a color conversion layer, or a combination of a color filter and a color conversion layer. For example, the color filter or the color conversion layer may be formed over a second substrate (sealing substrate), and then, be attached to the substrate. As described above, the material showing luminescence of single color, the color filter, and the color conversion layer can all be formed by a droplet discharge method.

Naturally, display of single color luminescence may be performed. For example, an area color type light emitting display device may be formed by using single color luminescence. A passive matrix display portion is suitable for the area color type and can display mainly characters and symbols.

A material having a low work function can be used for the cathode in the above structure; for example, Ca, Al, CaF, MgAg, AlLi, or the like is preferable. The electroluminescent layer may be any of a single layer type, a laminated type, and a mixed type having no interface between layers. Any of the following materials can be used: a singlet material, a triplet material, a combined material thereof, an organic material including a low molecular weight material, a high molecular weight material, and an intermediate molecular weight material, an inorganic material typified by molybdenum oxide which is superior in an electron injection property, and a composite material of an organic material and an inorganic material. The first electrodes 454, 463, and 472 are formed by using a transparent conductive film which transmits light; for example, a transparent conductive film in which indium oxide is mixed with zinc oxide (ZnO) of from 2% to 20% as well as ITO or ITSO is used. Note that plasma treatment in an oxygen atmosphere or heat treatment in a vacuum atmosphere is preferably performed before forming the first electrodes 454, 463, and 472. A partition wall (also referred to as a bank) is formed by using a material containing silicon, an organic material, or a compound material. In addition, a porous film may be used. Note that it is preferable to form the partition wall by using a photosensitive or non-photosensitive material such as acrylic or polyimide, since a side face thereof becomes a shape in which a radius of curvature continuously changes and an upper-layer thin film is formed without break. This embodiment can be freely combined with the above embodiment mode.

Embodiment 2

An appearance of a panel that is one mode of a light emitting display device to which the present invention is applied is described with reference to FIG. 20.

Figure 20:
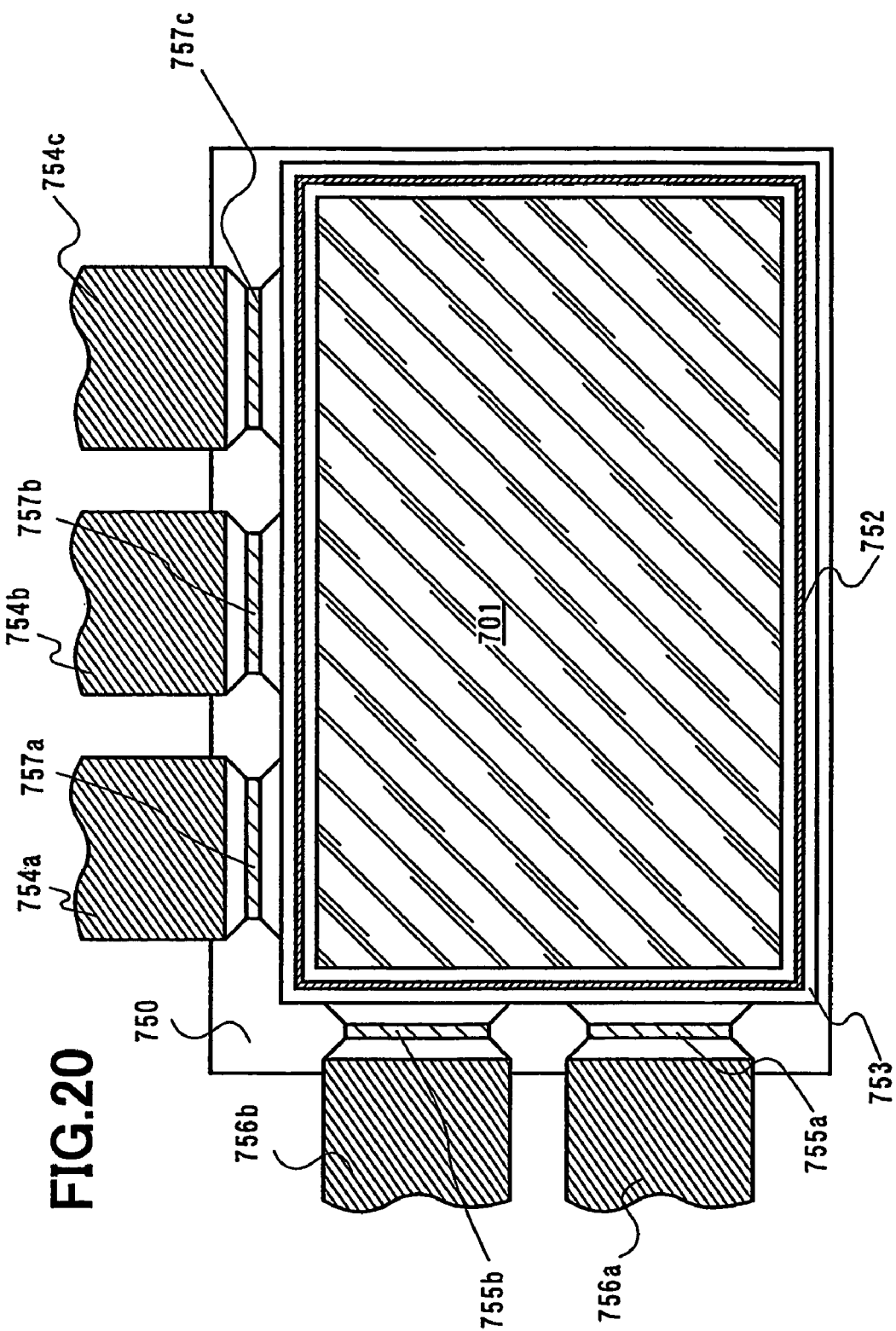
FIG. 20 is a top view of a panel that is one mode of a semiconductor device to which the present invention is applied.

In a panel shown in FIG. 20, a driver IC in which a driver circuit is formed around a pixel portion 751 is mounted by a COG (Chip On Glass) method. Of course, the driver IC may be mounted by a TAB (Tape Automated Bonding) method.

A substrate 750 is fixed to an opposing substrate 753 with a sealant 752. The pixel portion 751 may utilize an EL element as a display medium. Driver ICs 755*a* and 755*b*, and driver ICs 757*a*, 757*b*, and 757*c* may each be an integrated circuit formed by using a single crystal semiconductor, or an equivalent formed by using a TFT which is manufactured by using a polycrystalline semiconductor. A signal or power is supplied to the driver ICs 755*a* and 755*b*, and the driver ICs 757*a*, 757*b*, and 757*c* through FPCs 756*a* and 756*b*, and FPCs 754*a*, 754*b* and 754*c*, respectively.

Embodiment 3

Figure 23:
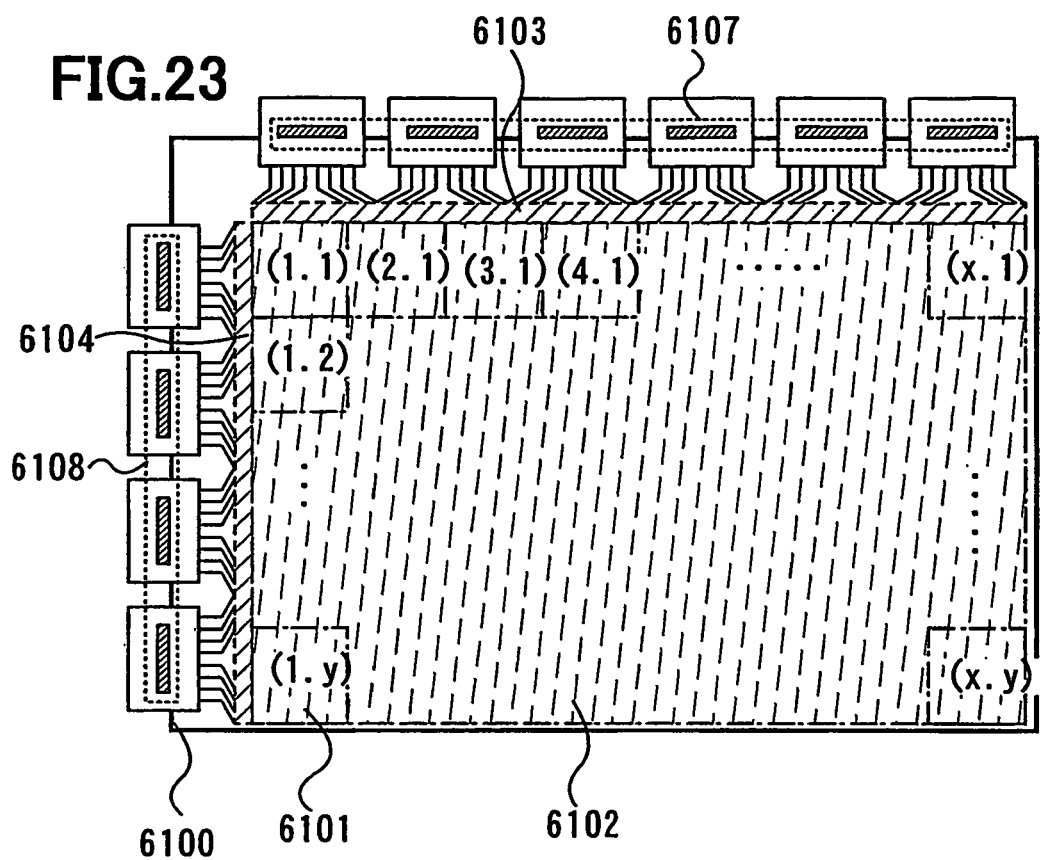
FIG. 23 shows a light emitting display device to which the present invention is applied.

A structure of a light emitting display device having a display function according to the present invention is described with reference to FIG. 23. FIG. 23 is a top view showing a simple overview of the light emitting display device, in which a pixel portion (display portion) 6102 and protection circuits 6103 and 6104 are formed over a substrate 6100 and are connected to a signal line side driver IC 6107 and a scanning line side driver IC 6104 through a lead wiring. When an amorphous semiconductor or a microcrystalline semiconductor is used as an element constituting the pixel portion 6102, it is preferable that the driver ICs 6107 and 6108 be mounted on the substrate as shown in the diagram by a known method such as a COG method or a TAB method and these driver ICs be used as driver circuits. When a microcrystalline semiconductor is used as the element constituting the pixel portion 6102, the scanning line side driver circuit may be composed of the microcrystalline semiconductor whereas the driver IC 6107 may be mounted on the signal line side. As a different structure from the above-mentioned structure, a part of the scanning line side driver circuit and a part of the signal line side driver circuit may be formed over one substrate and the driver ICs may be used in place of another part. In other words, there are various structures for mounting the driver ICs, and the invention may employ any structure.

Figure 24A:
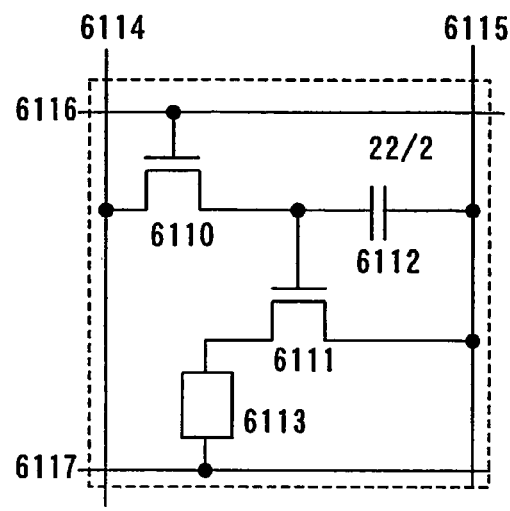
FIGS. 24A to 24C show a pixel circuit of a light emitting display device to which the present invention is applied.

Next, a pixel circuit of the light emitting display device having a display function according to the present invention is described with reference to FIGS. 24A to 24C. FIG. 24A is an equivalent circuit diagram of a pixel 6101. The pixel 6101 includes: a TFT 6110 for controlling input of a video signal to the pixel 6101; a TFT 6111 for controlling the amount of electric current that flows between a pair of electrodes of a light emitting element 6113; and a capacitor element 6112 for storing gate-source voltage of the TFT 6111, in a region surrounded by a signal line 6114, power supply lines 6115 and 6117, and a scanning line 6116. Although the capacitor element 6112 is shown in FIG. 24B, the capacitor element is not necessarily provided when it can be replaced with a gate capacitor or another parasitic capacitor of the TFT 6111.

Figure 24B:
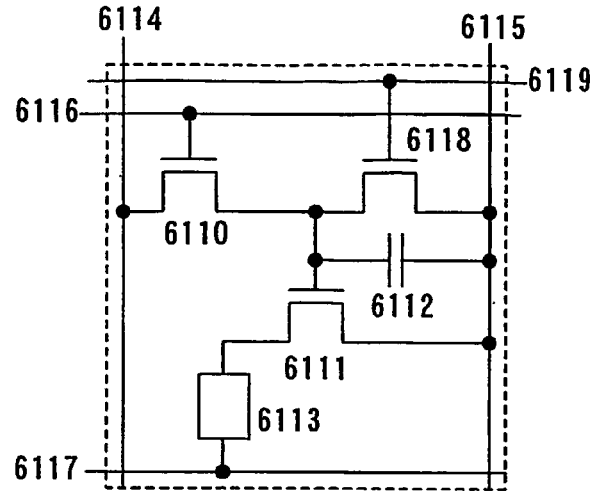

FIG. 24B shows a pixel circuit having a structure in which the pixel 6101 shown in FIG. 24A is newly provided with a TFT 6118 and a scanning line 6119. Supply of the electric current to the light emitting element 6113 can be forcibly stopped by arranging the TFT 6118. Accordingly, a lighting period can be started simultaneously with or immediately after a start of a writing period without waiting for writing of signals in all pixels. Consequently, a duty ratio is improved, and moving images can be particularly favorably displayed.

Figure 24C:
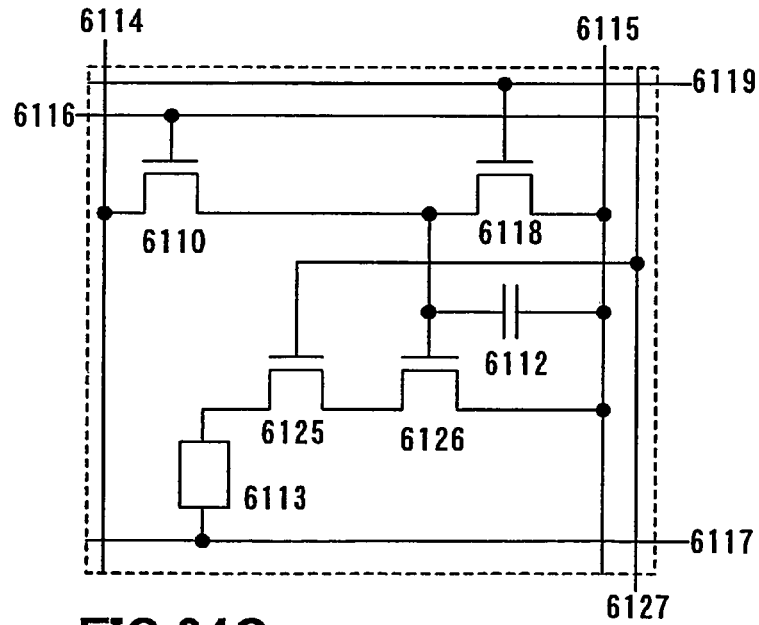

FIG. 24C shows a pixel circuit in which the TFT 6111 of the pixel 6101 shown in FIG. 24B is removed and the pixel 6101 is newly provided with TFTs 6125 and 6126 and a wiring 6127. In this structure, a gate electrode of the TFT 6125 is connected to the wiring 6127 having a constant electric potential. Accordingly, the electric potential of the gate electrode is fixed and the TFT 6125 is operated in a saturation region. In addition, a video signal for transmitting information on lighting or non-lighting of the pixel is inputted through the TFT 6110 to a gate electrode of the TFT 6126 which is connected to the TFT 6125 in series and operated in a linear region. The source-drain voltage value of the TFT 6126 operated in the linear region is low, so that slight variation in the gate-source voltage of the TFT 6126 does not adversely affect the amount of electric current flowing through the light emitting element 6113. Accordingly, the amount of electric current flowing through the light emitting element 6113 is determined by the TFT 6125 which is operated in the saturation region. According to the present invention having the above-mentioned structure, luminance variation of the light emitting element 6113, which is caused by variation in characteristics of the TFT 6125, can be improved, thereby improving the image quality. It is preferable that the channel length $L_1$ and the channel width $W_1$ of the TFT 6125, and the channel length $L_2$ and the channel width $W_2$ of the TFT 6126 be set to satisfy $L_1/W_1:L_2/W_2=5$ to $6000:1$. It is also preferable from the viewpoint of the manufacturing steps that both of the TFTs have the same conductivity type. Further, the TFT 6125 may be either an enhancement mode TFT or a depletion mode TFT.

FIG. 16A is a top view of a pixel circuit having the above-mentioned structure and FIG. 16B is an equivalent circuit diagram thereof. In FIGS. 16A and 16B, TFTs 1601 and 1602 and a capacitor element 1604 are included in a region surrounded by a signal line 1606, a power supply line 1607, a scanning line 1605. A pixel electrode 1603 is connected to a source or a drain of the TFT 1602.

The light emitting display device having a display function according to the invention may use either an analog video signal or a digital video signal. When the digital video signal is employed, the video signal varies depending on whether the video signal uses voltage or current. In other words, a video signal inputted to a pixel when a light emitting element emits light includes a constant voltage video signal and a constant current video signal. The constant voltage video signal includes a constant voltage video signal in which voltage applied to the light emitting element is constant and a constant voltage video signal in which current flowing in the light emitting element is constant. In addition, the constant current video signal includes a constant current video signal in which voltage applied to the light emitting element is constant and a constant current video signal in which current flowing in the light emitting element is constant. A driving method in which voltage applied to the light emitting element is constant indicates constant voltage driving, whereas a driving method in which current flowing through the light emitting element is constant indicates constant current driving. As for the constant current driving, constant current flows regardless of variation in resistance of the light emitting element. The light emitting display device and the driving method thereof according to the invention may use either the video signal using voltage or the video signal using current. Furthermore, either the constant voltage driving or the constant current driving may be employed. This embodiment can be freely combined with the above-mentioned embodiment mode and embodiment.

Embodiment 4

Figure 25A:
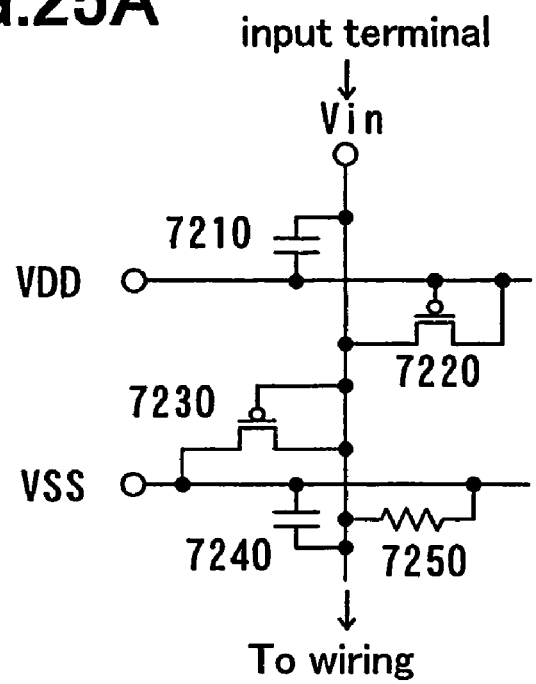
FIGS. 25A and 25B show a protection circuit included in a light emitting display device of the present invention.

An example of a protection circuit included in a light emitting display device of the present invention is described. The protection circuit is composed of one or a plurality of elements selected from a TFT, a diode, a resistor element, a capacitor element, and the like. Several structures and operation of the protection circuit are hereinafter described. First, a structure of an equivalent circuit diagram of a protection circuit which is disposed between an external circuit and an internal circuit and which corresponds to one input terminal is described with reference to FIGS. 25A to 26C. A protection circuit shown in FIG. 25A includes P-type TFTs 7220 and 7230, capacitor elements 7210 and 7240, and a resistor element 7250. The resistor element 7250 is a resistor with two terminals, in which one terminal of the resistor element is provided with input voltage Vin (hereinafter referred to as Vm) and the other terminal is provided with low potential voltage VSS (hereinafter referred to as VSS). The resistor element 7250 is provided to reduce the electric potential of the wiring to the VSS when the input terminal is not provided with the Vin. The resistance value of the resistor element is set sufficiently higher than the resistance of the wiring.

When the Vin is higher than high potential voltage VDD (hereinafter, referred to as VDD), the TFT 7122 is turned ON and the TFT 7123 is turned OFF in relation to the gate-source voltage. Accordingly, the VDD is supplied to the wiring through the TFT 7122. Therefore, voltage supplied to the wiring does not exceed the VDD even when the Vin exceeds the VDD due to noise and the like. On the other hand, when the Vin is lower than the VSS, the TFT 7122 is turned OFF and the TFT 7123 is turned ON in relation to the gate-source voltage. In this way, the VSS is supplied to the wiring. Therefore, the voltage supplied to the wiring does not exceed the VDD even when the Vin becomes lower than the VDD due to noise and the like. Furthermore, pulsed noise can be dulled in, the voltage supplied from the input terminal by the capacitor elements 7121 and 7124; thus, a sudden change of voltage due to noise can be reduced to some extent.

Owing to the arrangement of the protection circuit having the above structure, the voltage of the wiring is held in a range of from the VSS to the VDD and is protected from application of excessively high or low voltage out of the range. Furthermore, the input terminal to which a signal is inputted is provided with the protection circuit; accordingly, voltage of all wirings provided with the signal can be kept at a constant level (at the VSS in this embodiment) when input of the signal is stopped. In other words, the protection circuit functions as a short ring which can make the wirings short circuit one another when the signal is not inputted. Therefore, electrostatic damage due to difference in voltage between wirings can be prevented. In addition, when the signal is inputted, the signal supplied to the wiring is not dragged to the VSS since a resistance value of the resistor element 7250 is sufficiently high.

Figure 25B:
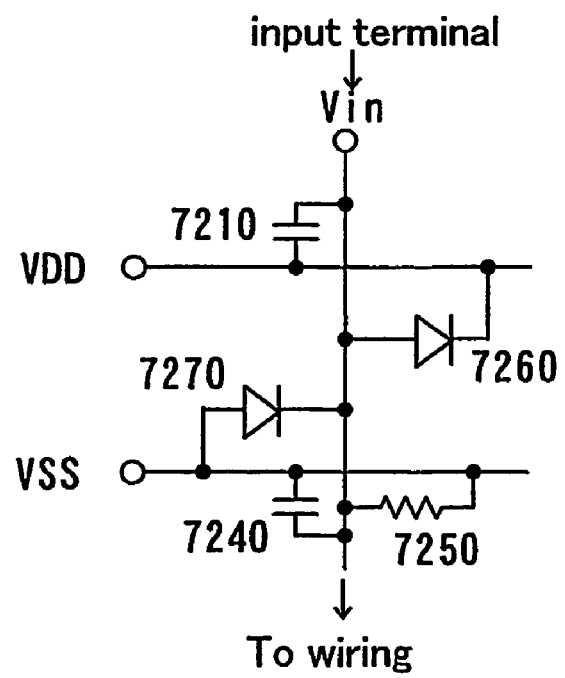
Figure 26A:
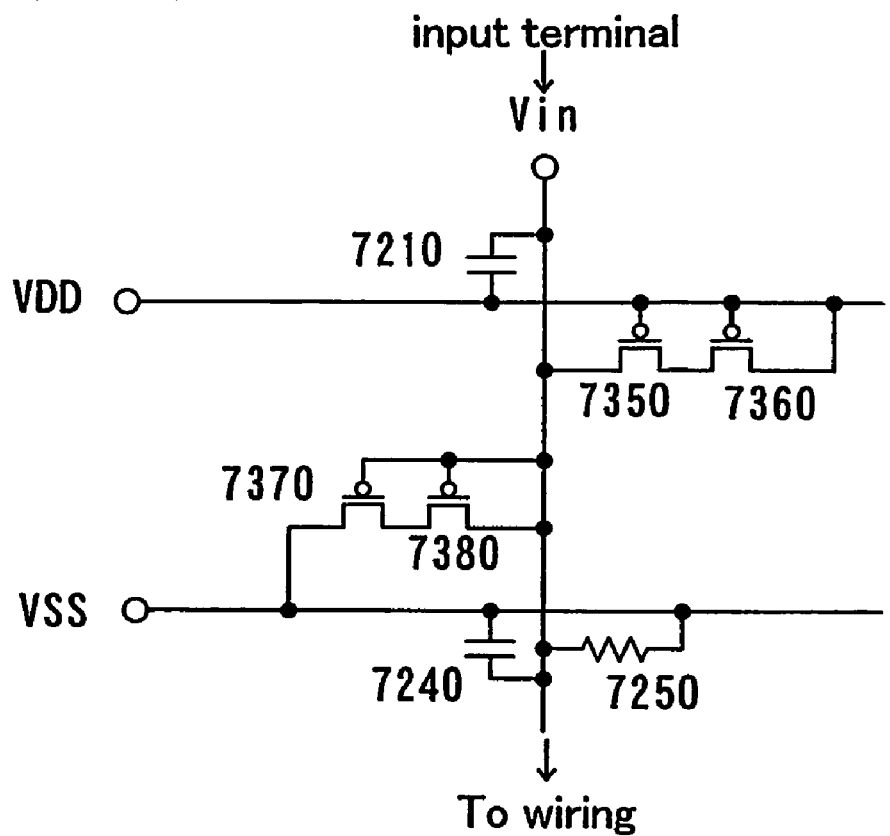
FIGS. 26A to 26C show a protection circuit included in a light emitting display device of the present invention.
Figure 26B:
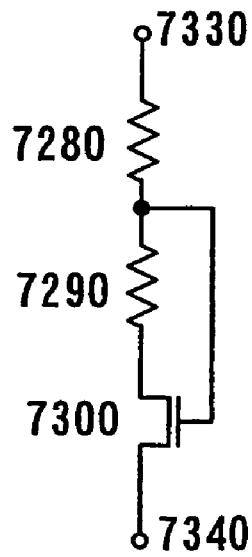
Figure 26C:
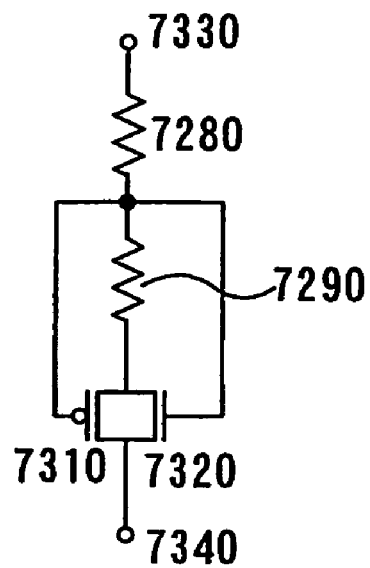

FIG. 25B shows an equivalent circuit diagram of a protection circuit in which the P-type TFTs 7122 and 7123 are replaced by diodes 7126 and 7127 having rectification. FIG. 26A shows an equivalent circuit diagram of a protection circuit in which the P-type TFT 7122 and 7123 are replaced by TFTs 7350, 7360, 7370, and 7380. A protection circuit, shown in FIG. 26B as a protection circuit having a different structure from the above structures, includes resistor elements 7128 and 7129 and a transistor 7130. A protection circuit shown in FIG. 26C includes resistor elements 7280 and 7290, a P-type TFT 7310, and an N-type TFT 7320. In each structure of FIGS. 26B and 26C, a terminal 7330 is connected with a wiring or the like. When the electric potential of the wiring or the like is changed suddenly, the N-type TFT 7300, or the P-type TFT 7310 and the N-type TFT 7320 is/are turned ON, so that electric current is flowed toward a terminal 7340 from the terminal 7330. Accordingly, sudden variation in the electric potential of the wiring or the like connected to the terminal 7330 can be alleviated, and damage or destruction of the element can be prevented. The element constituting the above protection circuit is preferably made of an amorphous semiconductor which is superior in pressure tightness. This embodiment can be freely combined with the above embodiment mode.

Embodiment 5

Figure 21:
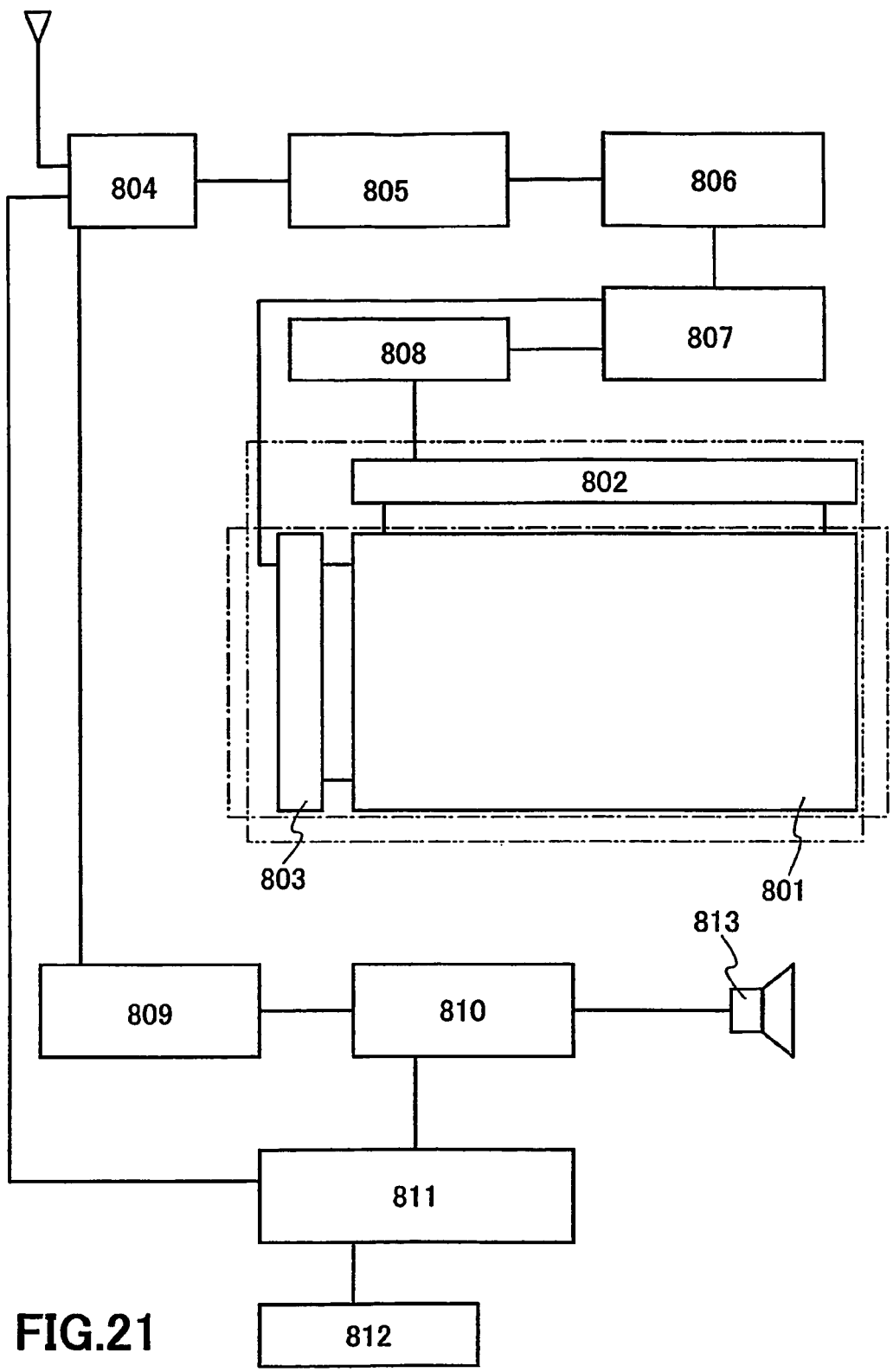
FIG. 21 is a block diagram showing a major structure of an electronic device of the present invention.

An EL TV set can be completed by using a light emitting display device formed according to the present invention. FIG. 21 is a block diagram showing a main structure of the EL TV set. An EL display panel includes, as a structure as shown in FIG. 20, the case that a scanning line side driver circuit and a signal line side driver circuit are mounted on a pixel portion 751 and a periphery thereof by a COG method, that only a pixel portion is formed and a scanning line side driver circuit and a signal line side driver circuit are mounted by a TAB method, and that a TFT is formed using a SAS, a pixel portion and a scanning line side driver circuit are integrally formed over a substrate, and a signal line side driver circuit is separately mounted as a driver IC. Any mode may be employed.

Another external circuit may be composed of a video signal amplifier circuit 805 which amplifies a video signal among signals received by a tuner 804, a video signal processing circuit which converts a signal to be outputted therefrom into a chrominance signal corresponding to each color of red, green, and blue, a control circuit 807 which converts the video signal into an input specification of a driver IC, and the like on an input side of a video signal. The control circuit 807 outputs a signal to both a scanning line side and a signal line side. In the case of digital driving, a signal dividing circuit 808 may be provided on the signal line side, and an input digital signal may be divided into m parts and be supplied.

An audio signal among signals received by the tuner 804 is transmitted to an audio signal amplifier circuit 809 and is supplied to a speaker 813 through an audio signal processing circuit 810 to be outputted. A control circuit 811 receives control information on a receiving station (receive frequency) or volume from an input portion 812 and transmits the signal to the tuner 804 and the audio signal processing circuit 810.

Figure 19:
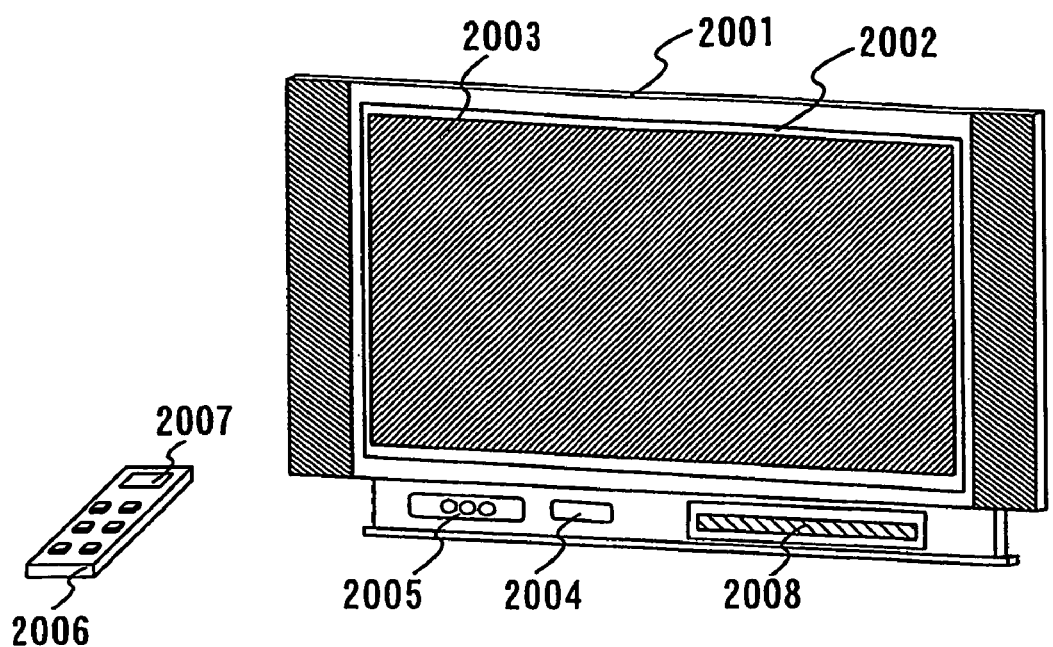
FIG. 19 shows an electronic device to which the present invention is applied.

A TV set can be completed by incorporating an EL module including such external circuits into a chassis 2001 as shown in FIG. 19. A display screen is formed by using an EL display module, and a speaker, an operation switch, and the like may be provided as an attachment. Thus, a TV set can be completed according to the present invention.

In addition, reflected light of light entering from outside may be blocked by using a wave plate and a polarizing plate. A quarter-wave plate\ a half-wave plate are used as the wave plate, and may be designed to be able to control light. A module has a laminated structure of a TFT element substrate\ a light emitting element\ a sealing substrate (sealant)\ a wave plate (a quarter-wave plate\ a half-wave plate)\ a polarizing plate, and light emitted from a light emitting element passes therethrought and is emitted outside on a polarizing plate side. The wave plate and the polarizing plate may be provided on an emitted side of light. In the case of a dual emission light emitting display device which emits light on both sides, the wave plate and the polarizing plate can be provided on both sides. In addition, an anti-reflective film may be provided outside the polarizing plate. This makes it possible to display a high-definition precise image.

A display panel 2002 utilizing an EL element is incorporated in the chassis 2001. Not only can ordinary TV broadcasting be received by a receiver 2005, but also one-way information communication (from a transmitter to a receiver) or two-way information communication (between a transmitter and a receiver or between receivers) can be achieved by connecting to a communication network with or without a wire through a modem 2004. The TV set can be operated by a switch incorporated in the chassis or a separately-provided remote control unit 2006, and a display portion 2007 showing information to be outputted may be included in the remote control unit.

Further, also the TV set may be made to have a structure which displays channels or volume by forming a sub screen 2008 using a second display panel as well as a main screen 2003. The main screen 2003 and the sub screen 2008 may be formed by using an EL display panel. Alternatively, the main screen 2003 may be formed by using an EL display panel having an excellent viewing angle and the sub screen 2008 may be formed by using a liquid crystal display panel capable of displaying at low power consumption in the above structure. Further, in the case of putting priority on the low power consumption, the main screen 2003 may be formed by using a liquid crystal display panel, the sub screen 2008 may be formed by using an EL display panel, and then, the sub screen can be turned on and off. A highly reliable light emitting display device can be formed by applying the present invention even when such a large-sized substrate is used, and thus, a large number of TFT or electronic parts are used.

Of course, the present invention is not limited to a TV set and can be applied to various uses particularly as a large-area display medium such as an information display board in a train station, an airport, or the like, or an advertisement display board in the street as well as a monitor of a personal computer.

Embodiment 6

Various light emitting display devices can be manufactured by applying the present invention. That is to say, the present invention can be applied to various electronic devices in which the light emitting display devices are incorporated in a display portion.

Such electronic devices can be given as follows: a video camera; a digital camera; a projector; a head mounted display (a goggle type display); a car navigation system; a car stereo; a personal computer; a gaming machine; a personal digital assistance (a mobile computer, a cellular phone, an electronic book, or the like); an image reproducing device including a recording medium (specifically, a device capable of processing data in a recording medium such as a Digital Versatile Disc (DVD) and having a display that can display the image of the data); and the like. Examples thereof are shown in FIGS. 18A to 18C and FIGS. 27A to 27B.

Figure 18A:
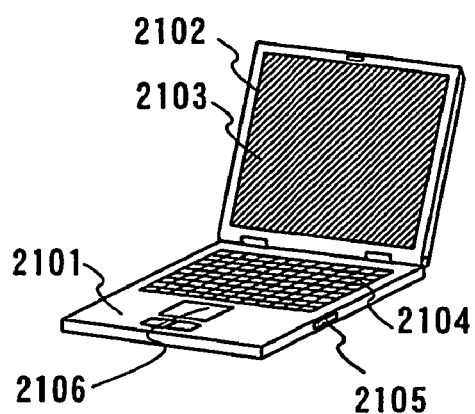
FIGS. 18A to 18C show an electronic device to which the present invention is applied.

FIG. 18A shows a laptop personal computer, which includes a main body 2101, a chassis 2102, a display portion 2103, a keyboard 2104, an external connection port 2105, a pointing mouse 2106, and the like. The present invention is applied to manufacturing of the display portion 2103. When the present invention is applied, a highly reliable high-quality image can be displayed even if the laptop personal computer is miniaturized and a wiring or the like becomes precise.

Figure 18B:
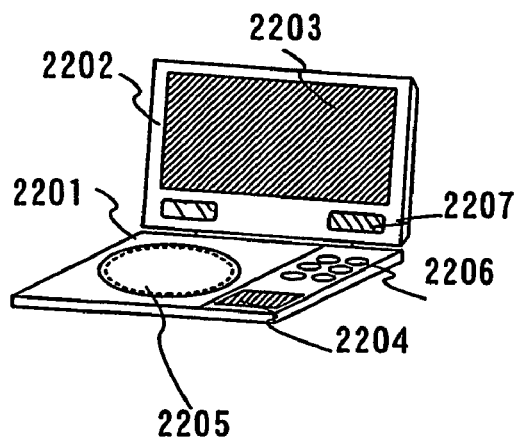

FIG. 18B shows an image reproducing device including a recording medium (specifically, a DVD reproducing device), which includes a main body 2201, a chassis 2202, a display portion A 2203, a display portion B 2204, a recording medium (a DVD or the like) reading portion 2205, an operation key 2206, a speaker portion 2207, and the like. The display portion A 2203 mainly displays image information, and the display portion B 2204 mainly displays character information. The present invention is applied to manufacturing of the display portion A 2203 and the display portion B 2204. When the present invention is applied, a highly reliable high-quality image can be displayed even if the image reproducing device is miniaturized and a wiring or the like becomes precise.

Figure 18C:
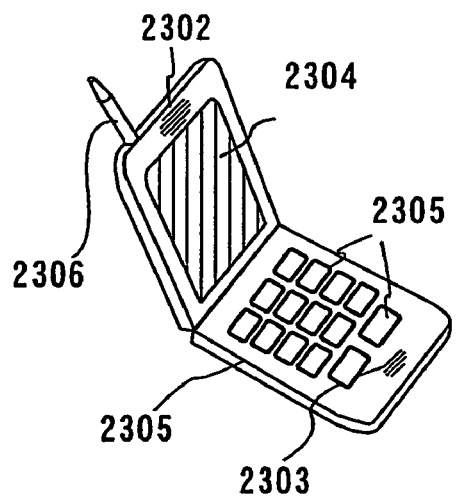

FIG. 18C shows a cellular phone, which includes a main body 2301, an audio output portion 2302, an audio input portion 2303, a display portion 2304, an operation switch 2305, an antenna 2306, and the like. A highly reliable high-quality image can be displayed even in a cellular phone which is miniaturized and in which a wiring or the like becomes precise by applying the light emitting display device manufactured according to the present invention to the display portion 2304.

Figure 27A:
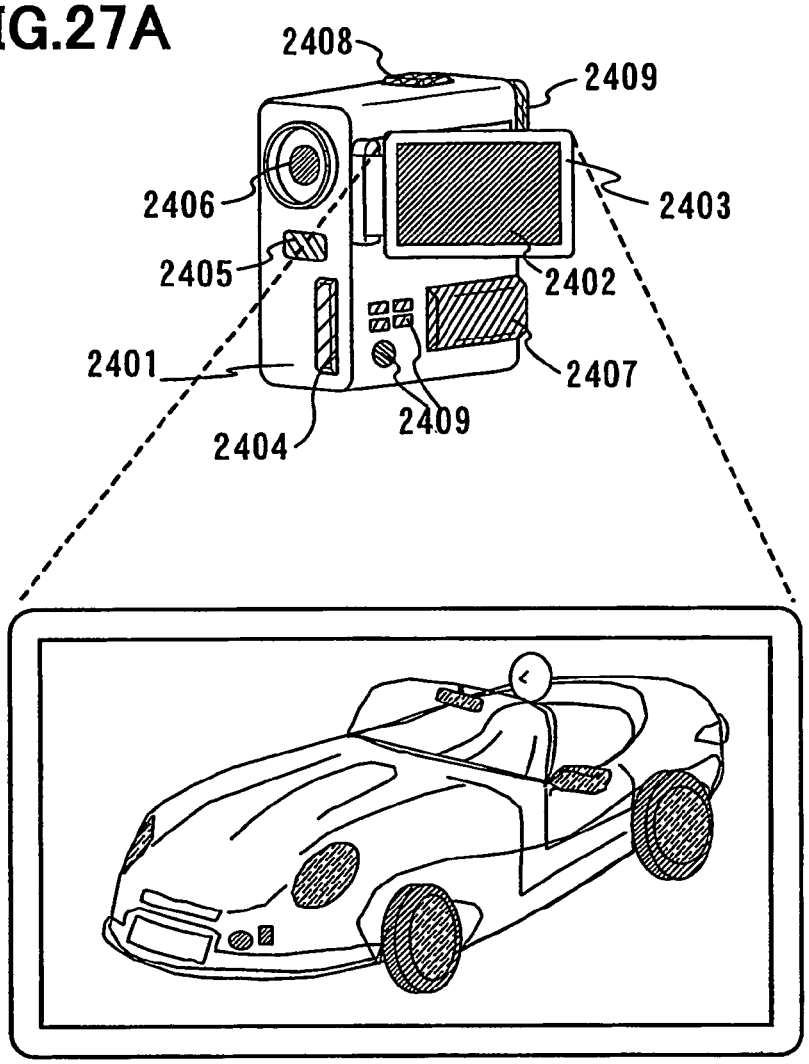
FIGS. 27A and 27B show an electronic device to which the present invention is applied.
Figure 27B:
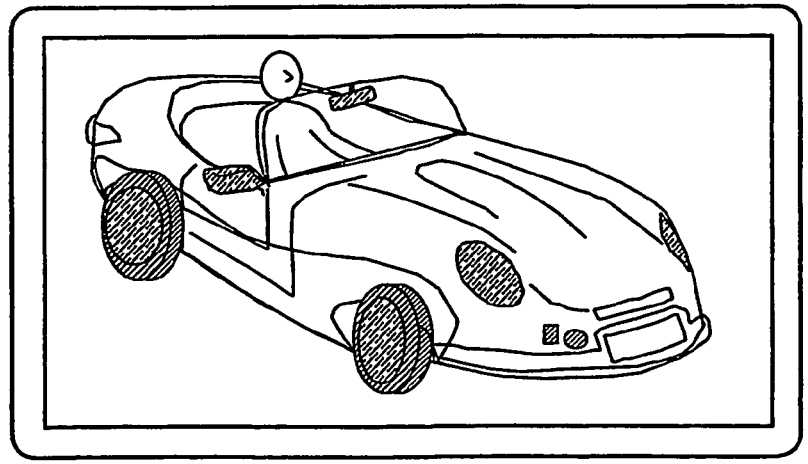

FIG. 27A shows a video camera, which includes a main body 2401, a display portion 2402, a chassis 2403, an external connection port 2404, a remote control receiving portion 2405, an image receiving portion 2406, a battery 2407, an audio input portion 2408, an operation key 2409, and the like. The present invention can be applied to the display portion 2402, which is a dual emission light emitting display device. FIGS. 27A and 27B show an image displayed in the display portion 2402. FIG. 27A shows an image being shot, and FIG. 27B shows an image which can be seen from a vehicle being shot. Since the light emitting display device of the present invention is a transmissive type and an image can be displayed on both sides, the image being shot can be seen from a subject side. Therefore, it is convenient to shoot oneself. In addition, the present invention can be applied to a digital video camera or the like in addition to a video camera, and a similar effect can be obtained. A highly reliable high-quality image can be displayed even in a video camera which is miniaturized and in which a wiring or the like becomes precise by applying the light emitting display device manufactured according to the present invention to the display portion 2402. This embodiment can be freely combined with the above embodiment mode and embodiment.

Embodiment 7

An effect of adhesion improvement by base pretreatment of the present invention was evaluated by experiment.

$TiO_X$ was formed by spraying, and a composition including silver as a conductive material was discharged and was baked at a temperature of 230° C. Sixteen silver wirings were formed to have a length of 1 cm, a width of from 200 µm to 300 µm, and a height of from 4000 Å to 5000 Å. As a result of performing a tensile test using Kapton tape on the formed silver wirings, the silver wirings did not peel. In addition, as a result of soaking in an HF solution of 0.5 wt % for one minute and washing with running water, none of the sixteen silver wirings peeled. Therefore, it was confirmed that adhesion was improved by base pretreatment of forming a $TiO_X$ film having a photocatalytic effect.

A Ti thin film was formed by a sputtering method to be from 10 Å to 50 Å. A composition including silver as a conductive material was similarly discharged onto the $TiO_X$ thin film having been formed by baking at 230° C. and was baked again at 230° C. Accordingly, sixteen silver wirings were formed to have a length of 1 cm, a width of from 200 µm to 300 µm, and a height of from 4000 Å to 5000 Å. It was confirmed that the formed $TiO_X$ thin film had a sheet resistance of $1 \times 10^6$ ($\Omega/cm^2$) or more and was insulative. As a result of performing a tensile test using Kapton tape on the formed silver wirings, the silver wirings did not peel. In addition, as a result of soaking in an HF solution of 0.5 wt % for one minute and washing with running water, none of the sixteen silver wirings peeled. Therefore, it was confirmed that adhesion was improved by base pretreatment of forming the $TiO_X$ film of the present invention.

As a comparative example, the above-described treatment using the HF solution was performed on silver wirings formed in a region where such base pretreatment have not been performed. As a result, the silver wirings peeled and only about several wirings remained.

Therefore, base pretreatment of the present invention can improve adhesion and can provide a highly reliable light emitting display device.

The invention claimed is:

1. A light emitting display device comprising:
a base film including a substance with a photocatalytic function formed on a substrate;
a gate electrode formed over and in direct contact with the base film;
a gate insulating layer formed over the gate electrode;
a semiconductor layer and a first electrode formed over the gate insulating layer;
a wiring layer formed over the semiconductor layer;
a partition wall covering an edge portion of the first electrode and the wiring layer;
an electroluminescent layer over the first electrode; and
a second electrode over the electroluminescent layer,
wherein the wiring layer covers the edge portion of the first electrode.

2. A light emitting display device comprising:
a base film including a substance with a photocatalytic function formed on a substrate;
a wiring layer and a first electrode formed over and in direct contact with the base film;
a semiconductor layer formed over the wiring layer;
a gate insulating layer formed over the semiconductor layer;
a gate electrode formed over the gate insulating layer;
a partition wall covering an edge portion of the first electrode and the wiring layer;
an electroluminescent layer over the first electrode; and
a second electrode over the electroluminescent layer,
wherein the wiring layer covers the edge portion of the first electrode, and
wherein the substance is selected from cadmium selenide (CdSe), potassium tantalite ($KTaO_3$), cadmium sulfide (CdS), zirconium oxide ($ZrO_2$), niobium oxide ($Nb_2O_5$), and tungsten oxide ($WO_3$).

3. A light emitting display device comprising:
a base film including a substance with a photocatalytic function formed on a substrate;
a gate electrode formed over and in direct contact with the base film;
a gate insulating layer formed over the gate electrode, the gate electrode having a convex curved face from an edge to an opposite edge;
a semiconductor layer and a first electrode formed over the gate insulating layer;
a wiring layer formed over the semiconductor layer;
a partition wall covering an edge portion of the first electrode and the wiring layer;
an electroluminescent layer over the first electrode; and
a second electrode over the electroluminescent layer,
wherein the first electrode covers an edge portion of the wiring layer.

4. A light emitting display device comprising:
a base film including a substance with a photocatalytic function formed on a substrate;
a wiring layer and a first electrode formed over and in direct contact with the base film;
a semiconductor layer formed over the wiring layer;
a gate insulating layer formed over the semiconductor layer;
a gate electrode formed over the gate insulating layer;
a partition wall covering an edge portion of the first electrode and the wiring layer;
an electroluminescent layer over the first electrode; and
a second electrode over the electroluminescent layer,
wherein the first electrode covers an edge portion of the wiring layer, and
wherein the substance is selected from cadmium selenide (CdSe), potassium tantalite ($KTaO_3$), cadmium sulfide (CdS), zirconium oxide ($ZrO_2$), niobium oxide ($Nb_2O_5$), and tungsten oxide ($WO_3$).

5. A light emitting display device according to any one of claims 1 to 4, wherein the substance having the photocatalytic function comprises titanium oxide.

6. A light emitting display device comprising:
a conductive layer consisting of a refractory metal over a substrate having an insulating surface;
a gate electrode formed over and in direct contact with the conductive layer;
a gate insulating layer formed over the gate electrode;
a semiconductor layer and a first electrode formed over the gate insulating layer;
a wiring layer formed over the semiconductor layer;
a partition wall covering an edge portion of the first electrode and the wiring layer;
an electroluminescent layer over the first electrode; and
a second electrode over the electroluminescent layer,
wherein the wiring layer covers the edge portion of the first electrode.

7. A light emitting display device comprising:
a conductive layer consisting of a refractory metal over a substrate having an insulating surface;
a wiring layer and a first electrode formed over and in direct contact with the conductive layer;

a semiconductor layer formed over the wiring layer;
a gate insulating layer formed over the semiconductor layer;
a gate electrode formed over the gate insulating layer;
a partition wall covering an edge portion of the first electrode and the wiring layer;
an electroluminescent layer over the first electrode; and
a second electrode over the electroluminescent layer,
wherein the wiring layer covers the edge portion of the first electrode.

8. A light emitting display device comprising:
a conductive layer consisting of a refractory metal over a substrate having an insulating surface;
a gate electrode formed over and in direct contact with the conductive layer, the gate electrode having a convex curved face from an edge to an opposite edge;
a gate insulating layer formed over the gate electrode;
a semiconductor layer and a first electrode formed over the gate insulating layer;
a wiring layer formed over the semiconductor layer;
a partition wall covering an edge portion of the first electrode and the wiring layer;
an electroluminescent layer over the first electrode; and
a second electrode over the electroluminescent layer,
wherein the first electrode covers an edge portion of the wiring layer.

9. A light emitting display device comprising:
a conductive layer consisting of a refractory metal over a substrate having an insulating surface;
a wiring layer and a first electrode formed over and in direct contact with the conductive layer;
a semiconductor layer formed over the wiring layer;
a gate insulating layer formed over the semiconductor layer;
a gate electrode formed over the gate insulating layer;
a partition wall covering an edge portion of the first electrode and the wiring layer;
an electroluminescent layer over the first electrode; and
a second electrode over the electroluminescent layer,
wherein the first electrode covers an edge portion of the wiring layer.

10. A light emitting display device according to any one of claims 1 to 4 and 6 to 9, wherein the gate electrode and the wiring layer are made of a material selected from the group consisting of silver, gold, copper, and indium tin oxide.

11. A light emitting display device according to any one of claims 1 to 4 and 6 to 9, wherein the semiconductor layer is a semi-amorphous semiconductor containing hydrogen and halogen and having a crystal structure.

12. A TV set including a display screen having the light emitting display device according to any one of claims 1 to 4 and 6 to 9.

13. A method for manufacturing a light emitting display device, comprising:
forming a base film including a substance with a photocatalytic function on a substrate;
forming a gate electrode over and in contact with the base film having an insulating surface by a first droplet discharge method;
forming a gate insulating layer over the gate electrode;
forming a semiconductor layer over the gate insulating layer;
forming a first electrode over the gate insulating layer by a second droplet discharge method;
forming a wiring layer over the semiconductor layer by a third droplet discharge method to cover an edge portion of the first electrode;
forming a partition wall to cover the edge portion of the first electrode and the wiring layer;
forming an electroluminescent layer over the first electrode; and
forming a second electrode over the electroluminescent layer by a fourth droplet discharge method.

14. A method for manufacturing a light emitting display device, comprising:
forming a base film including a substance with a photocatalytic function on a substrate;
forming a first electrode over and in direct contact with the base film having an insulating surface by a first droplet discharge method;
forming a wiring layer over and in contact with the base film having the insulating surface by a second droplet discharge method to cover an edge portion of the first electrode;
forming a semiconductor layer over the wiring layer;
forming a gate insulating layer over the semiconductor layer;
forming a gate electrode over the gate insulating layer by a third droplet discharge method;
forming a partition wall to cover the edge portion of the first electrode and the wiring layer;
forming an electroluminescent layer over the first electrode; and
forming a second electrode over the electroluminescent layer by a fourth droplet discharge method,
wherein the substance is selected from cadmium selenide (CdSe), potassium tantalite ($KTaO_3$), cadmium sulfide (CdS), zirconium oxide ($ZrO_2$), niobium oxide ($Nb_2O_5$), and tungsten oxide ($WO_3$).

15. A method for manufacturing a light emitting display device, comprising:
forming a base film including a substance with a photocatalytic function on a substrate;
forming a gate electrode in direct contact with the base film having an insulating surface by a first droplet discharge method;
forming a gate insulating layer over the gate electrode, the gate electrode having a convex curved face from an edge to an opposite edge;
forming a semiconductor layer over the gate insulating layer;
forming a wiring layer over the semiconductor layer by a second droplet discharge method;
forming a first electrode over the gate insulating layer by a third droplet discharge method to cover an edge portion of the wiring layer;
forming a partition wall to cover an edge portion of the first electrode and the wiring layer;
forming an electroluminescent layer over the first electrode; and
forming a second electrode over the electroluminescent layer by a fourth droplet discharge method.

16. A method for manufacturing a light emitting display device, comprising:
forming a base film including a substance with a photocatalytic function on a substrate;
forming a wiring layer over and in direct contact with the base film having an insulating surface by a first droplet discharge method;
forming a first electrode over and in direct contact with the base film having the insulating surface by a second droplet discharge method to cover an edge portion of the wiring layer;
forming a semiconductor layer over the wiring layer;

forming a gate insulating layer over the semiconductor layer;

forming a gate electrode over the gate insulating layer by a third droplet discharge method;

forming a partition wall to cover an edge portion of the first electrode and the wiring layer;

forming an electroluminescent layer over the first electrode; and forming a second electrode over the electroluminescent layer by a fourth droplet discharge method, wherein the substance is selected from cadmium selenide (CdSe), potassium tantalite ($KTaO_3$), cadmium sulfide (CdS), zirconium oxide ($ZrO_2$), niobium oxide ($Nb_2O_5$), and tungsten oxide ($WO_3$).

17. A method for manufacturing a light emitting display device according to any one of claims 13 to 16, wherein titanium oxide is used as the substance having the photocatalytic function.

18. A method for manufacturing a light emitting display device, comprising:
   forming a conductive layer consisting of a refractory metal over a substrate having an insulating surface;
   forming a gate electrode over and in direct contact with the conductive layer by a first droplet discharge method;
   forming a gate insulating layer over the gate electrode;
   forming a semiconductor layer over the gate insulating layer;
   forming a first electrode over the gate insulating layer by a second droplet discharge method;
   forming a wiring layer over the semiconductor layer by a third droplet discharge method to cover an edge portion of the first electrode;
   forming a partition wall to cover the edge portion of the first electrode and the wiring layer;
   forming an electroluminescent layer over the first electrode; and
   forming a second electrode over the electroluminescent layer by a fourth droplet discharge method.

19. A method for manufacturing a light emitting display device, comprising:
   forming a conductive layer consisting of a refractory metal over a substrate having an insulating surface;
   forming a first electrode over and in direct contact with the conductive layer by a first droplet discharge method;
   forming a wiring layer over and in direct contact with the conductive layer by a second droplet discharge method to cover an edge portion of the first electrode;
   forming a semiconductor layer over the wiring layer;
   forming a gate insulating layer over the semiconductor layer;
   forming a gate electrode over the gate insulating layer by a third droplet discharge method;
   forming a partition wall to cover the edge portion of the first electrode and the wiring layer;
   forming an electroluminescent layer over the first electrode; and
   forming a second electrode over the electroluminescent layer by a fourth droplet discharge method.

20. A method for manufacturing a light emitting display device, comprising:
   forming a conductive layer consisting of a refractory metal over a substrate having an insulating surface;
   forming a gate electrode over and in direct contact with the conductive layer by a first droplet discharge method, the gate electrode having a convex curved face from an edge to an opposite edge;
   forming a gate insulating layer over the gate electrode;
   forming a semiconductor layer over the gate insulating layer;
   forming a wiring layer over the semiconductor layer by a second droplet discharge method;
   forming a first electrode over the gate insulating layer by a third droplet discharge method to cover an edge portion of the wiring layer;
   forming a partition wall to cover an edge portion of the first electrode and the wiring layer;
   forming an electroluminescent layer over the first electrode; and
   forming a second electrode over the electroluminescent layer by a fourth droplet discharge method.

21. A method for manufacturing a light emitting display device, comprising:
   forming a conductive layer consisting of a refractory metal over a substrate having an insulating surface;
   forming a wiring layer over and in direct contact with the conductive layer by a first droplet discharge method;
   forming a first electrode over and in direct contact with the conductive layer by a second droplet discharge method to cover an edge portion of the wiring layer;
   forming a semiconductor layer over the wiring layer;
   forming a gate insulating layer over the semiconductor layer;
   forming a gate electrode over the gate insulating layer by a third droplet discharge method;
   forming a partition wall to cover an edge portion of the first electrode and the wiring layer;
   forming an electroluminescent layer over the first electrode; and
   forming a second electrode over the electroluminescent layer by a fourth droplet discharge method.

22. A method for manufacturing a light emitting display device according to any one of claims 13 to 16, 18 to 20, and 21, wherein the gate electrode and the wiring layer comprise a material selected from the group consisting of silver, gold, copper, and indium tin oxide.

23. A method for manufacturing a light emitting display device according to any one of claims 13 to 16, 18 to 20, and 21, wherein the semiconductor layer comprises a semi-amorphous semiconductor containing hydrogen and halogen and having a crystal structure.

24. A light emitting display device according to any one of claims 1 to 4, and 13 to 16, wherein the substance with the photo catalytic function contains an oxygen defect.

25. A light emitting display device according to any one of claims 1, 3, 6, and 8, further comprising an insulating layer covering an edge portion of the semiconductor layer.

26. A method for manufacturing a light emitting display device according to any one of claims 13, 15, 18, and 20, further comprising the step of forming an insulating layer covering an edge portion of the semiconductor layer.

27. A light emitting display device according to any one of claims 6 to 9, wherein the refractory metal is selected from the group consisting of Ti (titanium), W (tungsten), Cr (chromium), Al (aluminum), Ta (tantalum), Ni (nickel), Zr (zirconium), Hf (hafnium), V (vanadium), Ir (iridium), Nb (niobium), Pd (lead), Pt (platinum), Mo (molybdenum), Co (cobalt), and Rh (rhodium).

28. A method for manufacturing a light emitting display device according to any one of claims 18 to 21, wherein the refractory metal is selected from the group consisting of Ti (titanium), W (tungsten), Cr (chromium), Al (aluminum), Ta (tantalum), Ni (nickel), Zr (zirconium), Hf (hafnium), V (vanadium), Ir (iridium), Nb (niobium), Pd (lead), Pt (platinum), Mo (molybdenum), Co (cobalt), and Rh (rhodium).

* * * * *

UNITED STATES PATENT AND TRADEMARK OFFICE
CERTIFICATE OF CORRECTION

| | | |
|---|---|---|
| PATENT NO. | : 8,247,965 B2 | |
| APPLICATION NO. | : 10/576867 | |
| DATED | : August 21, 2012 | |
| INVENTOR(S) | : Shunpei Yamazaki et al. | |

It is certified that error appears in the above-identified patent and that said Letters Patent is hereby corrected as shown below:

In the Specification:

Column 4, line 21, "ban" should read "can"

Column 17, line 40, "13MH" should read "13MHz"

Column 24, line 15, "ISO" should read "ITSO"

Column 29, line 47, "TI (titanium)" should read "Ti (titanium)"

Column 35, line 25, "SO" should read "ITSO"

Column 37, line 64, "245" should read "215"

Column 42, line 67, "1000 min" should read "1000 mm"

Column 43, line 61, "HTL (hole injection layer)" should read "HIL (hole injection layer)"

Column 47, line 41, "Vm" should read "Vin"

Signed and Sealed this
Sixth Day of November, 2012

David J. Kappos
*Director of the United States Patent and Trademark Office*